United States Patent [19]
Kanayama et al.

[11] Patent Number: 5,701,049
[45] Date of Patent: Dec. 23, 1997

[54] PIEZOELECTRIC TRANSFORMER

[75] Inventors: Kouichi Kanayama; Nobuhiro Maruko, both of Sodegaura, Japan

[73] Assignee: Mitsui Petrochemical Industries, Ltd., Tokyo, Japan

[21] Appl. No.: 581,425

[22] Filed: Dec. 29, 1995

[30] Foreign Application Priority Data

| Dec. 30, 1994 | [JP] | Japan | 6-339708 |
| May 18, 1995 | [JP] | Japan | 7-145577 |
| Sep. 5, 1995 | [JP] | Japan | 7-254606 |
| Oct. 11, 1995 | [JP] | Japan | 7-290440 |

[51] Int. Cl.$^6$ ........................ H01L 41/08
[52] U.S. Cl. ............ 310/359; 310/366; 310/351
[58] Field of Search ............ 310/316–319, 310/359, 366

[56] References Cited

U.S. PATENT DOCUMENTS

| 3,562,792 | 2/1971 | Berlincourt et al. | 310/359 |
| 3,660,699 | 5/1972 | Sakurai et al. | 310/359 |
| 3,689,781 | 9/1972 | Kawada | 310/317 |
| 3,736,446 | 5/1973 | Berlincourt et al. | 310/318 |
| 5,365,141 | 11/1994 | Kawai et al. | 310/359 |
| 5,371,430 | 12/1994 | Sato et al. | 310/359 |
| 5,402,031 | 3/1995 | Tagami et al. | 310/359 |
| 5,463,266 | 10/1995 | Fukuoka et al. | 310/359 |
| 5,504,384 | 4/1996 | Lee et al. | 310/359 |

FOREIGN PATENT DOCUMENTS

| 5-021858 | 1/1993 | Japan . |
| 5-110368 | 4/1993 | Japan . |
| 6-224484 | 8/1994 | Japan . |
| 6-252466 | 9/1994 | Japan . |
| 6-318747 | 11/1994 | Japan . |
| 6-334235 | 12/1994 | Japan . |
| 7-074405 | 3/1995 | Japan . |
| 7-079029 | 3/1995 | Japan . |

OTHER PUBLICATIONS

C. A. Rosen, "Ceramic Transformers and Filters", Proceedings 1956 Electronic Components Symposium, pp. 205–211, 1956.

T. R. Shrout et al., "Resonance Behavior of Internally Electroded PZT Devices", Mat. Res. Bull., vol. 15, pp. 551–559, 1980.

P. A. van Berkum et al., "High Voltage Ceramic Transformers", IRE Transaction on Broadcast & Television Receivers, vol. 8, pp. 22–35.

*Primary Examiner*—Mark O. Budd

[57] ABSTRACT

A piezoelectric transformer has a piezoelectric substrate having first and second main faces. The substrate has first and second primary-side regions and a secondary-side region in its longitudinal direction in this order. The first region has a length of a half wavelength of stress distribution at the time of resonance in the longitudinal direction and has either positive or negative stress. The second region has a length of a half wavelength or less of the stress distribution and has either positive or negative stress. First and second electrode are respectively disposed on the first and second main faces in the first primary-side region, and the substrate between the first and second electrodes is polarized in the thicknesswise direction. Third and fourth electrodes are respectively disposed on the first and second main faces in the second primary-side region, and the substrate between the third and fourth electrodes is polarized in the thicknesswise direction. A secondary-side electrode is disposed in the secondary-side region, and the secondary-side region is polarized in the longitudinal direction. Directions of polarization and stress of the first and second regions and the electrical connection among the first to fourth electrode are determined in order for the second region to enhance the resonance of the substrate excited by the first region.

21 Claims, 37 Drawing Sheets

PIEZOELECTRIC TRANSFORMER

BACKGROUND OF THE INVENTION

1. Field of the Invention

The present invention relates to a piezoelectric transformer, and particularly to a piezoelectric transformer which is preferably used, for example, for driving a cold cathode fluorescent lamp (hereinafter referred to as CFL) which is used as a backlight for a liquid crystal display (hereinafter referred to as LCD) panel.

2. Description of the Related Art

Reductions in size and power consumption are required of portable devices equipped with LCD panels such as notebook type personal computers. A CFL which is widely used as a backlight for an LCD panel requires a high voltage of not less than 1 kV to initiate lighting and a high voltage of several hundred volts while it is continuously lit. To supply such high voltages, high voltage step-up wound transformers have been used, but they are reaching their performance limit in terms of efficiency, size and the like.

Recently, a CFL lighting unit using a piezoelectric transformer of smaller size and higher efficiency has been developed for an LCD panel (see Nikkei Electronics, 1994, Nov. 7 (No. 621), pp. 147–157). The piezoelectric transformer used in the unit has a structure called ROSEN type and still has an insufficient voltage step-up ratio, and hence the CFL lighting unit which has been put into practice uses a wound transformer in a stage preceding the piezoelectric transformer.

FIGS. 1A to 1D are diagrams for explaining a conventional ROSEN type piezoelectric transformer element. FIG. 1A is a perspective view, FIG. 1B is a cross-sectional view, FIG. 1C is a graph showing stress distribution, and FIG. 1D is a graph showing amplitude distribution.

A primary-side electrode 22 is disposed on the top face 12 of a rectangular parallelepipedic piezoelectric ceramics substrate 10 to cover the left (primary) half thereof, and also a primary-side electrode 24 is disposed on the bottom face 14 of the piezoelectric ceramics substrate 10 opposite to the primary-side electrode 22. The portion of the piezoelectric ceramics substrate 10 between the primary-side electrode 22 and the primary-side electrode 24 is polarized in the thicknesswise direction between the top face 12 and the bottom face 14. A secondary-side electrode 72 is disposed on a secondary-side end surface 17 perpendicular to both the top face 12 and the bottom face 14, and the portion of the piezoelectric ceramics substrate 10 between the secondary-side electrode 72 and the primary-side electrodes 22 and 24 is longitudinally polarized. One end of a power source 200 is connected to the primary-side electrode 22 via a connecting portion 122, and the other end of the power source 200 is connected to the primary-side electrode 24 via a connecting portion 124. The secondary-side electrode 72 is connected to a CFL 400 used as a load at one end thereof, and the other end of the CFL 400 is connected to the primary-side electrode 24 via a connecting portion 124.

When a voltage from the power source 200 is applied between the primary-side electrodes 22 and 24, an electric field is applied to the left half of the piezoelectric ceramics substrate 10 in the thicknesswise direction thereof. This excites longitudinal vibration of the longitudinal direction due to a piezoelectric transverse effect involving a displacement perpendicular to the direction of polarization, whereby a piezoelectric transformer element 100 vibrates as a whole.

Further, a mechanical distortion occurs within the right half of the piezoelectric ceramics substrate 10 in the longitudinal direction. This causes a voltage having the same frequency as that of the primary voltage applied between the primary-side electrodes 22 and 24 to be output from the secondary-side electrode 72 due to a piezoelectric longitudinal effect involving the generation of a potential difference in the direction of polarization. By applying a driving voltage having the same frequency as the resonant frequency of the piezoelectric transformer element 100 between the primary-side electrodes 22 and 24, a very high voltage step-up ratio can be obtained.

However, in order to use a piezoelectric transformer using lead zirconate-titanate (PZT) ceramics as a step-up transformer for a CFL lighting inverter used in the LCD panel of an A4-sized notebook type personal computer, a considerably high input voltage must be applied. Accordingly, an obtained voltage step-up ratio has still been insufficient.

SUMMARY OF THE INVENTION

It is, therefore, a main object of the present invention to provide a piezoelectric transformer having a high voltage step-up ratio.

According to the present invention, there is provided a first piezoelectric transformer comprising a piezoelectric substrate having a first main face and a second main face opposed to the first main face wherein a direction in which the first main face and the second main face extend is taken as a longitudinal direction of the piezoelectric substrate and wherein the piezoelectric substrate is divided in the longitudinal direction into at least a first region, a second region, and a third region, the first region of the piezoelectric substrate accounting for substantially 1/n (n is an integer equal to or greater than 2) of the length of the piezoelectric substrate in the longitudinal direction, a first primary-side electrode and a second primary-side electrode being disposed on the first and second main faces, respectively, of the first region and opposite to each other, the first region between the first primary-side electrode and the second primary-side electrode being polarized in the thicknesswise direction between the first and second main faces, a secondary-side electrode being disposed on the second region of the piezoelectric substrate which is separated from the first region by a predetermined spacing in the longitudinal direction, the third region being provided between the first and second regions and accounting for 1/n or less of the length of the piezoelectric substrate in the longitudinal direction, a third primary-side electrode and a fourth primary-side electrode being disposed on the first and second main faces, respectively, of the third region and opposite to each other, the third region between the third primary-side electrode and the fourth primary-side electrode being polarized in a predetermined direction along the thicknesswise direction, the third primary-side electrode and the fourth primary-side electrode being electrically connected to the first primary-side electrode and the second primary-side electrode in a predetermined connecting state, and the second region being polarized in the longitudinal direction.

A resonance mode is determined by an input frequency to primary-side electrodes, as well as by the physical properties of the piezoelectric substrate and the length of the substrate in the vibrational direction. Here, the length of 1/n of the piezoelectric substrate in the longitudinal direction is equivalent to a half wavelength of a resonance mode. Thus, for example, when a resonance mode is of 1.5 wavelength, n becomes 3, and when a resonance mode is of one wavelength, n becomes 2. Since the resonance mode of the piezoelectric transformer can take any large wavelength, n can take any integer equal to or greater than 2.

According to the present invention, in the piezoelectric transformer wherein the first primary-side electrode and the second primary-side electrode are disposed opposite to each other on the first and second main faces, respectively, of the first region accounting for substantially 1/n (n is an integer equal to or greater than 2) of the length of the piezoelectric substrate in the longitudinal direction, the first region between the first primary-side electrode and the second primary-side electrode being polarized in the thicknesswise direction between the first and second main faces, and wherein the secondary-side electrode is disposed on the second region of the piezoelectric substrate which is separated from the first region by a predetermined spacing in the longitudinal direction, the third region is provided between the first and second regions, the third primary-side electrode and the fourth primary-side electrode are disposed on the first and second main faces, respectively, of the third region and opposite to each other. Consequently, a larger area of primary-side electrodes is obtained, whereby the input impedance of the piezoelectric transformer becomes smaller. As a result, electrical energy from a power source is more readily fed to the piezoelectric transformer.

Further, in the present invention, since the first region accounts for substantially 1/n (n is an integer equal to or greater than 2) of the length of the piezoelectric substrate in the longitudinal direction, the first region has a length of a half wavelength associated with a stress distribution at the time of resonance in the longitudinal direction of the piezoelectric substrate, and in the first region, a positive or negative stress in the longitudinal direction occurs at the time of resonance. Also, since the third region accounts for 1/n or less of the length of the piezoelectric substrate in the longitudinal direction, the third region has a length of equal to or less than a half wavelength associated with a stress distribution at the time of resonance in the longitudinal direction of the piezoelectric substrate, and in the third region, a positive or negative stress occurs in the longitudinal direction at the time of resonance. Further, since the third primary-side electrode and the fourth primary-side electrode are disposed on the first and second main faces, respectively, of the third region and opposite to each other and since the third region between the third primary-side electrode and the fourth primary-side electrode is polarized in a predetermined direction along the thicknesswise direction, and further since the third primary-side electrode and the fourth primary-side electrode are electrically connected to the first primary-side electrode and the second primary-side electrode in a predetermined connecting state, the third region can be adapted to vibrate so as to further enhance resonance which is excited by the primary-side electrodes of the first region and by the first region, in accordance with the direction of stress which occurs in the third region at the time of resonance. Consequently, resonance is further enhanced by the third region, whereby input electrical energy can be more efficiently converted to mechanical elastic energy at the primary side.

Furthermore, as a result of the third region being provided, the portion of the piezoelectric ceramics substrate between the secondary-side electrode and the near edges of the third and fourth primary-side electrodes disposed on the third region can be polarized in the longitudinal direction. Accordingly, the secondary side becomes shorter in the longitudinal direction compared to the case where the third region is not provided, and the portion of the piezoelectric ceramics substrate between the secondary-side electrode and the near edges of the first and second primary-side electrodes disposed on the first region is polarized in the longitudinal direction. As the distance between the primary-side electrodes and the secondary-side electrode becomes shorter, the output impedance of the piezoelectric transformer becomes smaller. As the output impedance of the piezoelectric transformer can be decreased, a larger voltage can be applied to a load which is connected to the piezoelectric transformer at the secondary side thereof.

Thus, as a result of the third region being provided as in the present invention, the input impedance of the piezoelectric transformer becomes smaller with a resultant improved feed of electrical energy from the power source to the piezoelectric transformer, input electrical energy is more efficiently converted to mechanical elastic energy at the primary side, and the output impedance becomes smaller with a resultant increase in the voltage applied to the load which is connected to the piezoelectric transformer at the secondary side. Thus, the effective voltage step-up ratio of the piezoelectric transformer can be increased.

Further, as a result of the third region being provided between the first region and the second region, the distance between the primary-side electrodes and the secondary-side electrode becomes shorter, and consequently when the portion of the piezoelectric ceramics substrate between the secondary-side electrode and the near edges of the third and fourth primary-side electrodes disposed at the third region is longitudinally polarized, an absolute voltage applied for the polarization becomes smaller as compared to that of a piezoelectric transformer not provided with the third region. As a result, a countermeasure to high voltages is easy to implement, and a power source outputting a lower voltage can be employed for polarization.

The present invention is more effective when the load connected to the piezoelectric transformer at the secondary side is a CFL. The CFL requires a high voltage of not less than 1 kV to initiate its discharge. On the other hand, the voltage step-up ratio of the piezoelectric transformer is proportional to a quality coefficient Qm of a resonator. Since the impedance of the CFL is near infinite before discharge is initiated, the voltage step-up ratio is proportional to Qm of the piezoelectric transformer itself, and hence a large voltage step-up ratio is available. Accordingly, even though a voltage step-up ratio determined by the shape of the secondary side becomes smaller due to the shortened distance between the primary-side and secondary-side electrodes caused by the third region being provided as in the present embodiment, a discharge voltage can be readily built up because Qm of the resonator itself makes a significant contribution to the voltage step-up ratio at the time of initiating discharge. Once discharge is initiated, the impedance of the CFL drops. However, since the output impedance of the piezoelectric transformer becomes smaller as a result of the third region being provided as in the present embodiment, the voltage applied to the CFL can be increased accordingly.

Also, when the third region is provided between the first region at the primary side and the secondary-side electrode as in the present embodiment, by adjusting the size or the like of the third and fourth primary-side electrodes disposed on the third region, not only the voltage step-up ratio of the piezoelectric transformer but also the output impedance can be adjusted, thereby improving degrees of freedom in design.

In order that the third region be adapted to further enhance resonance which is excited by the first region and its first and second primary-side electrodes, the following configuration is preferably employed when the direction of stress which occurs in the third region at the time of resonance is opposite to that of stress which occurs in the first region at the time of resonance. That is, the third region between the third primary-side electrode and the fourth primary-side electrode is polarized in the same direction as in the first region between the first primary-side electrode and the second primary-side electrode, the third primary-side electrode and the second primary-side electrode are electrically connected, and the fourth primary-side electrode and the first primary-side electrode are electrically connected.

Also, in order that the third region be adapted to further enhance resonance which is excited by the first region and its first and second primary-side electrodes, the following configuration is preferably employed when the direction of stress which occurs in the third region at the time of resonance is opposite to that of stress which occurs in the first region at the time of resonance. That is, the third region between the third primary-side electrode and the fourth primary-side electrode is polarized opposite in direction to the first region between the first primary-side electrode and the second primary-side electrode, the third primary-side electrode and the first primary-side electrode are electrically connected, and the fourth primary-side electrode and the second primary-side electrode are electrically connected.

And further, in order that the third region be adapted to further enhance resonance which is excited by the first region and its first and second primary-side electrodes, the following configuration is preferably employed when the distance between the third region and the first region accounts for 1/n or more of the length in the longitudinal direction and the direction of stress which occurs in the third region at the time of resonance is the same as that of stress which occurs in the first region at the time of resonance. That is, the third region between the third primary-side electrode and the fourth primary-side electrode is polarized in the same direction as in the first region between the first primary-side electrode and the second primary-side electrode, the third primary-side electrode and the first primary-side electrode are electrically connected, and the fourth primary-side electrode and the second primary-side electrode are electrically connected.

Further, the piezoelectric substrate is preferably provided with a fourth region between the first region at the primary side and the second region at the secondary side, the fourth region accounting for 1/n or less of the length of the piezoelectric substrate in the longitudinal direction thereby to have a length of equal to or less than a half wavelength associated with a stress distribution at the time of resonance in the longitudinal direction, direction of the stress of the fourth region being the same as that of the stress generated in the first region at the time of resonance, a fifth primary-side electrode and a sixth primary-side electrode being disposed on the first and second main surfaces, respectively, of the fourth region and opposite to each other, the fourth region between the fifth primary-side electrode and the sixth primary-side electrode being polarized in the same direction as in the first region between the first primary-side electrode and the second primary-side electrode, the fifth primary-side electrode and the first primary-side electrode being electrically connected, the sixth primary-side electrode and the second primary-side electrode being electrically connected. With this structure, the resonance excited by the first and second primary-side electrodes in the first region can be further enhanced. Preferably, the portion of the piezoelectric ceramics substrate between the secondary-side electrode and the secondary-side electrode side edges of the third and fourth primary-side electrodes or the secondary-side electrode side edges of the fifth and sixth primary-side electrodes whichever are closer to the secondary-side electrode being polarized in the longitudinal direction.

Further, the piezoelectric substrate is preferably provided with a fifth region and a sixth region arranged in the longitudinal direction, the fifth region being provided opposite to the first region with respect to the second region, the length of the fifth region being substantially 1/n of the length of the piezoelectric substrate in the longitudinal direction, a seventh primary-side electrode and an eighth primary-side electrode being disposed on the first and second main faces, respectively, of the fifth region and opposite to each other, the fifth region between the seventh primary-side electrode and the eighth primary-side electrode being polarized in a predetermined direction along the thicknesswise direction, the seventh primary-side electrode and the eighth primary-side electrode being electrically connected to the first primary-side electrode and the second primary-side electrode in a predetermined connecting state, the sixth region being provided between the fifth region and the second region, the length of the sixth region being 1/n or less of the length of the piezoelectric substrate in the longitudinal direction, a ninth primary-side electrode and a tenth primary-side electrode being disposed on the first and second main faces, respectively, of the sixth region and opposite to each other, the sixth region between the ninth primary-side electrode and the tenth primary-side electrode being polarized in a predetermined direction along the thicknesswise direction, the ninth primary-side electrode and the tenth primary-side electrode being electrically connected to the first primary-side electrode and the second primary-side electrode in a predetermined connecting state, a secondary-side electrode being disposed on at least either the first or second main face, and portions of the second region on both sides of the secondary-side electrode being polarized in the longitudinal direction. Consequently, the fifth region has a length of a half wavelength associated with a stress distribution at the time of resonance in the longitudinal direction of the piezoelectric substrate, and in the fifth region, a positive or negative stress occurs in the longitudinal direction at the time of resonance, whereby the fifth region can be adapted to vibrate so as to further enhance resonance which is excited by the first and second primary-side electrodes and by the first region, in accordance with the direction of stress which occurs in the fifth region at the time of resonance; and the sixth region has a length of a half wavelength or less associated with a stress distribution at the time of resonance in the longitudinal direction of the piezoelectric substrate, and in the sixth region, a positive or negative stress occurs in the longitudinal direction at the time of resonance, whereby the sixth region can be adapted to vibrate so as to further enhance resonance which is excited by the first and second primary-side electrodes and by the first region, in accordance with the direction of stress which occurs in the sixth region at the time of resonance. As a result, energy can be fed to the piezoelectric transformer from both sides of the secondary-side electrode, whereby a higher voltage step-up ratio of the piezoelectric transformer can be obtained.

The piezoelectric transformer is suitably applicable to the case where a resonance mode is associated with a stress distribution of at least 1.5 wavelength or more (preferably, 1.5 wavelength or more and an integer multiple of half wavelength) in the longitudinal direction.

The second, third and sixth regions may coexist in the same half wavelength region of a stress distribution at the time of resonance where only a compressive or tensile stress directed to the first or second main face occurs. To attain this, the length in the longitudinal direction of a region including the second, third and sixth regions may be set to 1/n or less of the length of the piezoelectric substrate in the longitudinal direction.

Also, by symmetrically disposing the first region and the fifth region with respect to the second region and by symmetrically disposing the third region and the sixth region with respect to the second region, twice as much energy can be fed to the piezoelectric transformer as compared to the case where the first region and the third region are disposed only at one side of the second region.

In the above-mentioned first piezoelectric transformer, a transformer wherein the piezoelectric substrate has a first end surface and a second end surface which intersect perpendicularly to the longitudinal direction, the first and second primary-side electrodes being disposed extending in the longitudinal direction from the first end surface to a position located approximately half the distance between the first end surface and the second end surface as measured from the first end surface, the third and fourth primary-side electrodes being disposed in separation from the first and second primary-side electrodes and the secondary-side electrode, the third region being polarized in the same thicknesswise direction as in the first region, the fourth primary-side electrode and the first primary-side electrode being electrically connected, and the third primary-side electrode and the second primary-side electrode being electrically connected, is suitably applicable as a piezoelectric transformer wherein one wavelength of stress distribution exists between the first end surface and the second end surface in the longitudinal direction, and thus allows a larger voltage step-up ratio.

In the above-mentioned first piezoelectric transformer, a transformer wherein the piezoelectric substrate has a first end surface and a second end surface which intersect perpendicularly to the longitudinal direction, the first and second primary-side electrodes being disposed extending in the longitudinal direction from the first end surface to a position located approximately ⅓ of the distance between the first end surface and the second end surface as measured from the first end surface, the third and fourth primary-side electrodes being disposed in separation from the first and second primary-side electrodes and the secondary-side electrode extending in the longitudinal direction from a position located approximately ⅓ of the distance between the first end surface and the second end surface as measured from the first end surface to a position located approximately ⅔ or less of the distance between the first end surface and the second end surface as measured from the first end surface, the third region being polarized in the same thicknesswise direction as in the first region, the fourth primary-side electrode and the first primary-side electrode being electrically connected, and the third primary-side electrode and the second primary-side electrode being electrically connected, is suitably applicable as a piezoelectric transformer wherein 1.5 wavelength of stress distribution exists between the first end surface and the second end surface in the longitudinal direction, and thus allows a larger voltage step-up ratio.

In this case, a piezoelectric transformer having a much higher voltage step-up ratio can be obtained by further disposing a fifth and sixth primary-side electrodes on the first and second main faces of a predetermined region of the piezoelectric substrate between the third and fourth primary-side electrodes and the secondary-side electrode in separation from the third and fourth primary-side electrodes and the secondary-side electrode, by polarizing the portion of the piezoelectric substrate between the fifth primary-side electrode and the sixth primary-side electrode in the same thicknesswise direction as in that portion between the first primary-side electrode and the second primary-side electrode, by electrically connecting the fifth primary-side electrode and the first primary-side electrode, and by electrically connecting the sixth primary-side electrode and the second primary-side electrode. Preferably, the portion of the piezoelectric ceramics substrate between the secondary-side electrode and the near edges of the fifth and sixth primary-side electrodes is polarized in the longitudinal direction.

In the above-mentioned first piezoelectric transformer, a transformer wherein the piezoelectric substrate has a first end surface and a second end surface which intersect perpendicularly to the longitudinal direction, the first and second primary-side electrodes being disposed extending in the longitudinal direction from the first end surface to a position located approximately half the distance between the first end surface and the second end surface as measured from the first end surface, the third and fourth primary-side electrodes being disposed in separation from the secondary-side electrode, the third region being polarized in the opposite thicknesswise direction to the first region, the third primary-side electrode and the first primary-side electrode being electrically connected, and the fourth primary-side electrode and the second primary-side electrode being electrically connected, is suitably applicable as a piezoelectric transformer wherein one wavelength of stress distribution exists between the first end surface and the second end surface in the longitudinal direction, and thus allows a larger voltage step-up ratio.

In the above-mentioned first piezoelectric transformer, a transformer wherein the piezoelectric substrate has a first end surface and a second end surface which intersect perpendicularly to the longitudinal direction, the first and second primary-side electrodes being disposed extending in the longitudinal direction from the first end surface to a position located approximately ⅓ of the distance between the first end surface and the second end surface as measured from the first end surface, the third and fourth primary-side electrodes being disposed in separation from the first and second primary-side electrodes and the secondary-side electrode extending in the longitudinal direction from a position located approximately ⅓ of the distance between the first end surface and the second end surface as measured from the first end surface to a position located approximately ⅔ or less of the distance between the first end surface and the second end surface as measured from the first end surface, the third region being polarized in the opposite thicknesswise direction to the first region, the third primary-side electrode and the first primary-side electrode being electrically connected, and the fourth primary-side electrode and the second primary-side electrode being electrically connected, is suitably applicable as a piezoelectric transformer wherein 1.5 wavelength of stress distribution exists between the first end surface and the second end surface in the longitudinal direction, and thus allows a larger voltage step-up ratio.

In this case, a piezoelectric transformer having a much higher voltage step-up ratio can be obtained by further disposing a fifth and sixth primary-side electrodes on the first and second main faces of a predetermined region of the piezoelectric substrate between the third and fourth primary-side electrodes and the secondary-side electrode in separation from the third and fourth primary-side electrodes and the secondary-side electrode, by polarizing the portion of the piezoelectric substrate between the fifth primary-side electrode and the sixth primary-side electrode in the same thicknesswise direction as in that portion between the first primary-side electrode and the second primary-side electrode, by electrically connecting the fifth primary-side electrode and the first primary-side electrode, and by electrically connecting the sixth primary-side electrode and the second primary-side electrode. Preferably, the portion of the piezoelectric ceramics substrate between the secondary-side electrode and the near edges of the fifth and sixth primary-side electrodes is polarized in the longitudinal direction.

The secondary-side electrode is preferably formed on an end surface which extends in a direction perpendicularly intersecting with the longitudinal direction of the piezoelectric substrate. This is because an ideal vibration mode is easy to implement.

The secondary-side electrode may be disposed on at least either the first or second main face of the piezoelectric substrate. By doing so, the primary-side and secondary-side electrodes can be formed together in one film forming process. Also, by adjusting the area of the secondary-side electrode, the distance between the secondary-side electrode and the primary-side electrodes can be adjusted. Consequently, the output impedance of the piezoelectric transformer can be adjusted. On the other hand, the resonant frequency of the piezoelectric transformer is determined by the length of the piezoelectric substrate in the longitudinal direction. Accordingly, by disposing the secondary-side electrode on at least either the first or second main face as described above, the resonant frequency and the output impedance can be controlled independently of each other. The forming of secondary-side electrodes on both the first and second main faces of the piezoelectric ceramics substrate allows easier polarization in the longitudinal direction.

It is also preferable that a plurality of piezoelectric transformers described above be integrally layered in the thicknesswise direction in such a manner that the primary-side region of a piezoelectric transformer is layered on that of another piezoelectric transformer and that the secondary-side region of a piezoelectric transformer is layered on that of another piezoelectric transformer, whereby the primary-side regions of a plurality of the piezoelectric transformers are polarized and the primary-side electrodes are connected in such a manner that a plurality of the piezoelectric transformers mutually enhance their vibration further. In this case, preferably, piezoelectric transformers to be layered have the same structure, and corresponding electrodes are electrically connected in parallel.

By doing so, an input current flows as many times as the number of layers, so that when an input current is fixed, an input voltage can be reduced by a factor of the number of layers. Also, since an input current can flow as many times as the number of layers, an input power can be increased accordingly, thereby implementing high-power drive. On the other hand, when a single-layer piezoelectric transformer is used, an increase in power causes energy density to exceed a threshold determined by material with a resultant increase in loss, causing deterioration in efficiency. By employing the above-mentioned laminated structure to avoid the problem, energy density within piezoelectric substrate can be reduced, thereby increasing a total input power level. By uniting a plurality of the piezoelectric transformers as described above, a vibration mode can be unified for a plurality of the piezoelectric transformers.

By supporting the piezoelectric transformers described above at positions corresponding to vibrational nodes in their resonance mode, deterioration in efficiency of conversion can be prevented without hindering their vibration.

Also, by electrically isolating part of a primary-side electrode from the primary-side electrode to provide a feedback electrode, e very small signal can be taken out from the feed back electrode to monitor the vibrating state of the piezoelectric transformer, and the signal can be used for making a feedback to the piezoelectric transformer, whereby the piezoelectric transformer can be vibrated by self-excitation.

The self-excited vibration can be preferably activated by connecting a phase-shifting circuit and an amplifier circuit to the feedback electrode and applying an output from the amplifier circuit to the primary-side electrodes.

According to the present invention, in the aforesaid first piezoelectric transformer, there is provided a second piezoelectric transformer wherein the piezoelectric substrate has a first end surface and a second end surface which intersect perpendicularly to the longitudinal direction, the first and second primary-side electrodes being disposed extending in the longitudinal direction from the first end surface to a position located approximately ⅓ of the length of the piezoelectric substrate in the longitudinal direction as measured from the first end surface, the third and fourth primary-side electrodes being disposed on the third region extending in the longitudinal direction from a position located approximately ⅓ of the length of the piezoelectric substrate in the longitudinal direction as measured from the first end surface to a position located approximately ⅔ of the length of the piezoelectric substrate in the longitudinal direction as measured from the first end surface, a secondary-side region is provided between the third region and the second end surface, the third region being polarized in the opposite thicknesswise direction to the first region, the first primary-side electrode and the third primary-side electrode being electrically connected, the second primary-side electrode and the fourth primary-side electrode being electrically connected, the secondary-side region comprising a seventh region adjacent to the second end surface, and the second region, the secondary-side electrode being disposed on at least either of the first and second main faces at a position located approximately ⅙ of the length of the piezoelectric substrate in the longitudinal direction as measured from the second end surface, a second secondary-side electrode being disposed on at least either of the first and second main faces in proximity to the second end surface or on the second end surface of the piezoelectric substrate, the seventh region being located between the second end surface and a position located approximately ⅙ of the length of the piezoelectric substrate in the longitudinal direction as measured from the second end surface and being polarized in the longitudinal direction, and the second region being located between a position located approximately ⅙ of the length of the piezoelectric substrate in the longitudinal direction as measured from the second end surface and a position located approximately ⅓ of the length of the piezoelectric substrate in the longitudinal direction as measured from the second end surface and being polarized in the opposite longitudinal direction to the seventh region.

In this case, the third primary-side electrode or the fourth primary-side electrode whichever is a grounding-side electrode, and the second secondary-side electrode are connected.

Preferably, the second primary-side electrode and the fourth primary-side electrode are electrodes on the grounding side, the secondary-side electrode is disposed only on the first main face, and the second secondary-side electrode is disposed only on the second main face of the piezoelectric substrate.

Further, according to the present invention, in the aforesaid first piezoelectric transformer, there is provided a third piezoelectric transformer wherein the piezoelectric substrate has a first end surface and a second end surface which intersect perpendicularly to the longitudinal direction, the first and second primary-side electrodes being disposed extending in the longitudinal direction from the first end surface to a position located approximately ⅓ of the length of the piezoelectric substrate in the longitudinal direction as measured from the first end surface, the third and fourth primary-side electrodes being disposed on the third region extending in the longitudinal direction from a position located approximately ⅓ of the length of the piezoelectric substrate in the longitudinal direction as measured from the first end surface to a position located approximately ⅔ of the length of the piezoelectric substrate in the longitudinal direction as measured from the first end surface, a secondary-side region being provided between the third region and the second end surface, the third region being polarized in the same thicknesswise direction as in the first region, the first primary-side electrode and the fourth primary-side electrode being electrically connected, the second primary-side electrode and the third primary-side electrode being electrically connected, the secondary-side region comprising a seventh region adjacent to the second end surface, and the second region, the secondary-side electrode being disposed on at least either of the first and second main faces at a position located approximately ⅙ of the length of the piezoelectric substrate in the longitudinal direction as measured from the second end surface, a second secondary-side electrode being disposed on at least either of the first and second main faces to be in proximity to the second end surface or on the second end surface of the piezoelectric substrate, the seventh region being located between the second end surface and a position located approximately ⅙ of the length of the piezoelectric substrate in the longitudinal direction as measured from the second end surface and being polarized in the longitudinal direction, and the second region being located between a position located approximately ⅙ of the length of the piezoelectric substrate in the longitudinal direction as measured from the second end surface and a position located approximately ⅓ of the length of the piezoelectric substrate in the longitudinal direction as measured from the second end surface and being polarized in the opposite longitudinal direction to the seventh region.

Also, in this case, the third primary-side electrode or the fourth primary-side electrode whichever is a grounding-side electrode, and the second secondary-side electrode are connected.

In the second and third piezoelectric transformers described above, stress is zero at both ends of the secondary-side region, half wavelength of stress distribution exists in the secondary-side region, and stress is directed in the same direction within the secondary-side region. The secondary-side electrode for outputting a high voltage is disposed on the main face of the piezoelectric substrate in the central portion of the secondary-side region, and the portions of the secondary-side region located at both sides of the secondary-side electrode for outputting a high voltage are polarized in opposite longitudinal directions. The second secondary-side electrode for grounding disposed at the end surface of the secondary-side region, i.e. at the end surface of the piezoelectric substrate, is electrically connected to the primary-side electrode for grounding.

In the present invention, since the second secondary-side electrode for grounding is disposed on the secondary-side end portion of the piezoelectric substrate and is connected to the primary-side grounding electrode and since the secondary-side electrode is also disposed on the secondary-side region at the central portion thereof to be used as an electrode for outputting a high voltage, the distance between the secondary-side electrodes is halved, and the area of electrodes is doubled as compared with a case where a secondary-side electrode for outputting a high voltage is merely disposed on the secondary-side end portion and where the entire secondary-side region is polarized in either longitudinal direction. Consequently, the capacitance of the secondary side is quadrupled, and the output impedance is reduced to ¼. Thus, as the output impedance of the piezoelectric transformer reduces, voltage applied to a load connected to the secondary-side electrode of the piezoelectric transformer increases accordingly.

Stress is zero at both ends of the secondary-side region; half wavelength of stress distribution exists in the secondary-side region; stress is directed in the same direction within the secondary-side region; the primary-side electrode for grounding and the second secondary-side electrode are disposed at both ends of the secondary-side region, respectively; the secondary-side electrode for outputting a high voltage is disposed on the secondary-side region at the center thereof where a peak of the stress distribution exists; and the portions of the secondary-side region on both sides of the secondary-side electrode for outputting a high voltage are polarized in opposite directions. As a result, all of the charges generated within the secondary-side region can be taken out effectively.

Further, as a result of disposing the secondary-side electrode on the secondary-side region at the central portion thereof in the longitudinal direction, when the secondary-side region is polarized, the distance between the secondary-side electrodes is halved and an absolute voltage to be applied for the polarization becomes smaller as compared to a case where a secondary-side electrode for outputting a high voltage is merely disposed on the secondary-side end portion and where the entire secondary-side region is polarized in either longitudinal direction. As a result, a countermeasure to high voltages is easy to implement, and a power source outputting a lower voltage can be employed for polarization.

And further, preferably, the primary-side electrode for grounding and the second secondary-side electrode for grounding are disposed only on the same main face of the piezoelectric substrate, and the secondary-side electrode for outputting a high voltage is disposed only on the other main face of the piezoelectric substrate, whereby the secondary-side electrode for outputting a high voltage is less likely to short-circuit to the second secondary-side and primary-side electrodes.

In the piezoelectric transformers described above, at least a third secondary-side electrode may be disposed on the second region such that it is opposite to the secondary-side electrode in the longitudinal direction of the piezoelectric substrate, thereby making it possible to obtain an output between the secondary-side electrode and the third secondary-side electrode.

Since electrical power can be output by the secondary-side electrode and the third secondary-side electrode, it is not necessary for the secondary side to share a ground potential with the primary side. As a result, a circuit on the primary side and a circuit on the secondary side can be separated in terms of direct current; hence, a grounding electrode can be formed on the secondary side independently of that on the primary side thereby to insulate grounding on the primary side from grounding on the secondary side, and also the secondary side can be left floating without being grounded, thereby improving noise resistance.

Thus, in the piezoelectric transformer wherein at least a third secondary-side electrode is disposed on the secondary-side region opposite to the secondary-side electrode in the longitudinal direction of the piezoelectric substrate, by disposing the secondary-side electrode at a position corresponding to a vibrational node in the longitudinal direction in a resonance mode of the piezoelectric transformer, an electrical connection and mechanical support on the secondary side can be facilitated without hindering vibration of the piezoelectric transformer in the longitudinal direction.

When the secondary-side region between the secondary-side electrode and the third secondary-side electrode is a region of the piezoelectric substrate which has a length of a half wavelength or less associated with a stress distribution at the time of resonance in the longitudinal direction and wherein a positive or negative stress occurs in the longitudinal direction at the time of resonance, by further disposing a fourth secondary-side electrode between the secondary-side electrode and the third secondary-side electrode such that the fourth secondary-side electrode is opposite to the secondary-side electrode and the third secondary-side electrode in the longitudinal direction, polarizing the portion of the piezoelectric substrate between the secondary-side electrode and the fourth secondary-side electrode in the longitudinal direction, polarizing the portion of the piezoelectric substrate between the third secondary-side electrode and the fourth secondary-side electrode in the opposite longitudinal direction to that portion between the secondary-side electrode and the fourth secondary-side electrode, and rendering an output power available from between the secondary-side electrode and the third secondary-side electrode, and the fourth secondary-side electrode, the distance between the secondary-side electrodes becomes shorter, and the area of electrodes is doubled as compared to a case where the secondary-side electrode and the third secondary-side electrode are merely disposed on the secondary-side region and where the portion of the piezoelectric substrate between the secondary-side electrode and the third secondary-side electrode is polarized in either longitudinal direction. Consequently, the capacitance of the secondary side is doubled or more, and the output impedance decreases to half or less. Thus, as the output impedance of the piezoelectric transformer reduces, voltage applied to a load connected to the secondary-side electrode of the piezoelectric transformer increases accordingly.

Further, as a result of disposing the fourth secondary-side electrode between the secondary-side electrode and the third secondary-side electrode for the case where the portion of the piezoelectric substrate between the secondary-side electrode and the third secondary-side electrode is polarized, the distance between the secondary-side electrodes becomes shorter and an absolute voltage to be applied for the polarization becomes smaller as compared to a case where the secondary-side electrode and the third secondary-side electrode are disposed on the secondary-side region and where the portion of the piezoelectric substrate between the secondary-side electrode and the third secondary-side electrode is polarized in either longitudinal direction. As a result, a countermeasure to high voltages is easy to implement, and a power source outputting a lower voltage can be employed for polarization.

Also, the secondary-side region in which the secondary-side electrode and the third secondary-side electrode are provided to be opposite to each other in the longitudinal direction may be formed to be a secondary-side region in which a plurality of secondary-side electrodes are disposed such that they are opposite to each other in the longitudinal direction, and the portion of the piezoelectric substrate between at least a plurality of secondary-side electrodes may be polarized in the longitudinal direction. With this structure, electrical power can be output by predetermined two or more secondary-side electrodes opposed to each other in the longitudinal direction.

Also, first electrical power can be output between first predetermined two or more secondary-side electrodes of a plurality of the secondary-side electrodes opposed to each other in the longitudinal direction of the piezoelectric substrate, and also second output power can be output between second predetermined two or more secondary-side electrodes which are different from the first predetermined two or more secondary-side electrodes of the plurality of the secondary-side electrodes and which are opposed to each other in the longitudinal direction.

A plurality of secondary-side electrodes which are opposed to each other in the longitudinal direction can also be disposed on both of the first and second main faces of the piezoelectric substrate.

A plurality of secondary-side electrodes which are opposed to each other in the longitudinal direction can also be disposed in a plurality of columns in the direction of width of the piezoelectric substrate perpendicular to the longitudinal direction.

Also, in the piezoelectric transformers described above, an output can be obtained from between the secondary-side electrode and the third or fourth primary-side electrode whichever is an electrode for grounding.

According to the present invention, there is provided a fourth piezoelectric transformer comprising a substantially rectangular parallelepipedic piezoelectric substrate which has a first main face, a second main face opposed to the first main face, and a first end surface and a second end surface both of which intersect perpendicularly to a first direction in which one side of the first main face extends, a first primary-side electrode and a second primary-side electrode being disposed on the first and second main faces of the piezoelectric substrate extending in the first direction from the first end surface to a position located approximately ⅓ of the distance between the first end surface and the second end surface as measured from the first end surface, a third primary-side electrode and a fourth primary-side electrode being disposed on the first and second main faces of the piezoelectric substrate extending in the first direction from a position located approximately ⅓ of the distance between the first end surface and the second end surface as measured from the first end surface to a position located approximately ⅔ of the distance between the first end surface and the second end surface as measured from the first end surface, the piezoelectric substrate between the first primary-side electrode and the second primary-side electrode being polarized in the thicknesswise direction between the first main face and the second main face, the piezoelectric substrate between the third primary-side electrode and the fourth primary-side electrode being polarized in the thicknesswise direction, the third primary-side electrode and the fourth primary-side electrode being electrically connected to the first primary-side electrode and the second primary-side electrode in a predetermined connecting state, a predetermined region of the piezoelectric substrate extending in the first direction from the second end surface to a position located approximately ⅓ of the distance between the first end surface and the second end surface as measured from the second end surface, being a secondary-side region, a secondary-side electrode being disposed at least on the second end surface of the secondary-side region or on the first main face in proximity to the second end surface, and at least the portion of the secondary-side region between the secondary-side electrode and the third primary-side electrode being polarized in the first direction.

This fourth piezoelectric transformer is suitably applicable as a piezoelectric transformer wherein 1.5 wavelength of stress distribution exists between the first end surface and the second end surface in the first direction, and thus allows a larger voltage step-up ratio.

Here, the piezoelectric substrate between the third primary-side electrode and the fourth primary-side electrode may be polarized in the same thicknesswise direction as in that between the first primary-side electrode and the second primary-side electrode with the fourth primary-side electrode and the first primary-side electrode being electrically connected and with the third primary-side electrode and the second primary-side electrode being electrically connected, or the piezoelectric substrate between the third primary-side electrode and the fourth primary-side electrode may be polarized in the opposite thicknesswise direction to that between the first primary-side electrode and the second primary-side electrode with the third primary-side electrode and the first primary-side electrode being electrically connected and with the fourth primary-side electrode and the second primary-side electrode being electrically connected.

The present invention also provides a fifth piezoelectric transformer comprising substantially rectangular parallelepipedic piezoelectric substrate having a first main face and a second main face opposed to the first main face, the piezoelectric substrate having a first primary-side region, a second primary-side region, and a secondary-side region in a first direction in which a first side of the first main face extends, the first primary-side region, the second primary-side region and the secondary-side region being different from each other, the first region of the piezoelectric substrate accounting for substantially 1/n (n is an integer equal to or greater than 2) of the length of the piezoelectric substrate in the first direction, a first primary-side electrode and a second primary-side electrode being disposed on the first and second main faces, respectively, of the first region and opposite to each other, the region between the first primary-side electrode and the second primary-side electrode being polarized in the thicknesswise direction of the piezoelectric substrate, the second primary-side region having a length equal to or less than the 1/n of the length of the piezoelectric substrate in the first direction, a third primary-side electrode and a fourth primary-side electrode being disposed on the first and second main faces, respectively, of the second primary-side region and opposite to each other, the second primary-side region between the third primary-side electrode and the fourth primary-side electrode being polarized in a predetermined direction along the thicknesswise direction, the third primary-side electrode and the fourth primary-side electrode being electrically connected to the first primary-side electrode and the second primary-side electrode in a predetermined connecting state, a first secondary-side electrode and a second secondary-side electrode being provided in the secondary-side region such that the first and second secondary-side electrodes being opposite to each other in a second direction in which a second side of the first main face extends, the second side being perpendicular to the first side, and at least the portion in the secondary-side region between the first secondary-side electrode and the second secondary-side electrode being polarized in the second direction.

In the fifth piezoelectric transformer of the present invention, the first primary-side electrode and the second primary-side electrode are disposed opposite to each other on the first and second main faces, respectively, of the first primary-side region accounting for substantially 1/n (n is an integer equal to or greater than 2) of the length of the piezoelectric substrate in the first direction, and the third primary-side electrode and the fourth primary-side electrode are also provided opposite to each other on the first and second main faces of the second primary-side region of the piezoelectric substrate. Accordingly, the areas of the primary-side electrodes are increased and the input impedance of the piezoelectric transformer can be decreased. As a result, electrical energy from a power source is more readily fed to the piezoelectric transformer.

Since the first primary-side region has a length substantially corresponding to 1/n of the length of the piezoelectric substrate, the first primary-side region has a length of a half wavelength associated with a stress distribution at the time of resonance in the first direction of the piezoelectric substrate, and in the first primary-side region, a positive or negative stress in the first direction occurs at the time of resonance. Also, since the second primary-side region has 1/n or less of the length of the piezoelectric substrate in the first direction, the second primary-side region has a length of equal to or less than a half wavelength associated with a stress distribution at the time of resonance in the first direction of the piezoelectric substrate, and in the second primary-side region, a positive or negative stress occurs in the first direction at the time of resonance. Further, since the third primary-side electrode and the fourth primary-side electrode are disposed on the first and second main faces, respectively, of the second primary-side region and opposite to each other and since the second primary-side region between the third primary-side electrode and the fourth primary-side electrode is polarized in a predetermined direction along the thicknesswise direction of the piezoelectric substrate, and further since the third primary-side electrode and the fourth primary-side electrode are electrically connected to the first primary-side electrode and the second primary-side electrode in a predetermined connecting state, the second primary-side region can be adapted to vibrate so as to further enhance resonance which is excited by the first and second primary-side electrodes of the first primary-side region and by the first primary-side region, in accordance with the direction of stress which occurs in the second primary-side region at the time of resonance. Consequently, resonance is further enhanced by the second primary-side region, whereby input electrical energy can be more efficiently converted to mechanical elastic energy at the primary side.

Thus, as a result of the second primary-side region being provided, the input impedance of the piezoelectric transformer becomes smaller with a resultant improved feed of electrical energy from the power source to the piezoelectric transformer, input electrical energy is more efficiently converted to mechanical elastic energy at the primary side. Thus, the effective voltage step-up ratio of the piezoelectric transformer can be increased.

The fifth piezoelectric transformer according to the present invention further comprises, in the first direction of the piezoelectric substrate, a secondary-side region which is a different region form the first primary-side region and the second primary side region, and the first secondary-side electrode and the second secondary-side electrode are provided in the secondary-side region such that the first and second secondary-side electrodes are opposite to each other in the second direction in which the second side of the first main face extends, the second side being perpendicular to the first side, and at least the region in the secondary-side region between the first secondary-side electrode and the second secondary-side electrode being polarized in the second direction. Therefore, the piezoelectric substrate of the secondary-side region is coupled by a Poisson's ratio to the resonance in the first direction which is excited by the first and second primary-side regions. As a result, the secondary-side region vibrates in the second direction, and mechanical strain develops in the second direction, so that a potential difference is produced in the direction of polarization in the second direction. This potential difference can be taken out by the first and second secondary-side electrodes.

Furthermore, since the first and second secondary-side electrodes are provided such that they are opposite to each other in the second direction, the first and second secondary-side electrodes exist over a predetermined length in the first direction, and they can be extended so as to include a node of vibration in the first direction. Accordingly, leads or lead frames can be connected to the secondary-side electrodes at the node of vibration in the first direction. As a result, electrical connection and mechanical support of the secondary-side can be easily performed without obstructing vibration in the first direction. This stabilizes the output of the piezoelectric transformer and makes it easier to encase the piezoelectric transformer.

Moreover, since the first and second secondary-side electrodes in the secondary-side region do not share a ground potential with the primary side electrodes. As a result, a circuit on the primary side and a circuit on the secondary side can be separated in terms of direct current. Therefore, a grounding electrode can be formed on the secondary side independently of that on the primary side, thereby to insulate the grounding circuit on the primary side from the grounding circuit on the secondary side, and also the secondary side can be left floating without being grounded, thereby improving noise resistance.

Preferably, the first secondary-side electrode is provided at or in the vicinity of one end of the piezoelectric substrate in the second direction, and the second secondary-side electrode is provided at or in the vicinity of the other end of the piezoelectric substrate in the second direction. With this structure, almost all of the charges generated in the secondary-side region can be taken out efficiently.

The first secondary-side electrode may be provided on one of third and forth end surfaces of the piezoelectric substrate perpendicular to the second direction, and the second secondary-side electrode may be provided on the other of the third and forth end surfaces.

Preferably, both the first and second secondary-side electrodes are provided on one of the first and second main faces of the piezoelectric substrate. With this structure, the primary-side electrodes and the secondary-side electrodes can be formed simultaneously in a single film forming stage. Further, since connection with leads or lead frames are required only on the first and second main faces, the shape of the leads or lead frames can be simplified.

Also, the first secondary-side electrode may be provided on one of the first and second main faces of the piezoelectric substrate, and the second secondary-side electrode may be provided on the other of the first and second main faces. Even in such a case, the first secondary-side electrode and the primary-side electrodes to be formed on the same main face as this first secondary-side electrode can be formed simultaneously in the same film forming step, and the second secondary-side electrode and the primary-side electrodes to be formed on the same main face as this second secondary-side electrode can also be formed simultaneously in the same film forming step. Further, since connection with leads or lead frames are required only on the first and second main faces, the shape of the leads or lead frames can be simplified.

When leads or lead frames, especially lead frames are connected to the piezoelectric transformer at nodes, both electrical connection and mechanical support can be performed simultaneously at positions corresponding to the nodes. In the present invention, since the first and second secondary-side electrodes are provided such that they are opposite to each other in the second direction, the first and second secondary-side electrodes can extend over a predetermined length in the first direction, and they can be extended so as to include a node of vibration in the first direction. Accordingly, leads or lead frames can be connected to the secondary-side electrodes at the node of vibration in the first direction. As a result, electrical connection and mechanical support of the secondary-side can be easily performed without obstructing vibration in the first direction. This stabilizes the output of the piezoelectric transformer and makes it easier to encase the piezoelectric transformer.

In order that the second primary-side region be adapted to further enhance resonance which is excited by the first and second primary-side electrodes of the first primary-side region, the following configuration is preferably employed when the direction of stress which occurs in the second primary-side region at the time of resonance is opposite to that of stress which occurs in the first primary-side region at the time of resonance. That is, the second primary-side region between the third primary-side electrode and the fourth primary-side electrode is polarized opposite in direction to the first primary-side region between the first primary-side electrode and the second primary-side electrode, and the third primary-side electrode and the first primary-side electrode are electrically connected, and the fourth primary-side electrode and the second primary-side electrode are electrically connected.

Also, in order that the second primary-side region be adapted to further enhance resonance which is excited by the first and second primary-side electrodes of the first primary-side region, the following configuration is preferably employed when the direction of stress which occurs in the second primary-side region at the time of resonance is the opposite to that of stress which occurs in the first primary-side region at the time of resonance. That is, the second primary-side region between the third primary-side electrode and the fourth primary-side electrode is polarized in the same direction as in the first primary-side region between the first primary-side electrode and the second primary-side electrode, and the third primary-side electrode and the second primary-side electrode are electrically connected, and the fourth primary-side electrode and the first primary-side electrode are electrically connected.

And further, in order that the second primary-side region be adapted to further enhance resonance which is excited by the first and second primary-side electrodes of the first primary-side region, the following configuration is preferably employed when the distance between the second primary-side region and the first primary-side region accounts for 1/n or more of the length in the longitudinal direction and when the direction of stress which occurs in the second primary-side region at the time of resonance is the same as that of stress which occurs in the first primary-side region at the time of resonance. That is, the second primary-side region between the third primary-side electrode and the fourth primary-side electrode is polarized in the same direction as in the first primary-side region between the first primary-side electrode and the second primary-side electrode, and the third primary-side electrode and the first primary-side electrode are electrically connected, and the fourth primary-side electrode and the second primary-side electrode are electrically connected.

The piezoelectric transformer may be modified such that a third secondary-side electrode is provided between the first and second secondary-side electrodes in the secondary-side region so that the third secondary-side electrode is opposite to the first and second secondary-side electrodes in the second direction, and a portion of the secondary-side region between the first secondary-side electrode and the third secondary-side electrode is polarized in the second direction and a portion of the secondary-side region between the second secondary-side electrode and the third secondary-side electrode is polarized in the second direction and in a direction opposite to the direction of polarization at the portion between the first secondary-side electrode and the third secondary-side electrode, and secondary-side electrical power is obtained between the first and second secondary-side electrodes and the third secondary-side electrode.

Even when the above-described structure is employed, the piezoelectric substrate of the secondary-side region is coupled by a Poisson's ratio to the resonance in the first direction which is excited by the first and second primary-side regions. As a result, the secondary-side region vibrates in the second direction, and mechanical strain develops in the second direction, so that a potential difference is produced in the direction of polarization in the second direction. This potential difference can be taken out between the first and second secondary-side electrodes and the third secondary-side electrode.

Further, the first and second secondary-side electrodes, which are opposite to each other in the second direction, are provided in the secondary-side region of the piezoelectric substrate, and the third secondary-side electrode is provided between the first and second secondary-side electrodes in the secondary-side region so that the third secondary-side electrode is opposite to the first and second secondary-side electrodes in the second direction, thereby making it possible to take out a secondary-side electrical power from between the first and second secondary-side electrodes and the third secondary-side electrode. Accordingly, when compared to a piezoelectric transformer in which first and second secondary-side electrodes are provided such that they are opposite to each other in the second direction and the region between the first and second secondary-side electrodes is polarized in one direction along the second direction, the distance between the secondary-side electrodes decreases, and the areas of the electrodes increase so that the output impedance decreases. When the output impedance of the piezoelectric transformer is decreased in the above-described manner, the voltage applied to a load which is connected to the secondary-side electrodes of the piezoelectric transformer increases accordingly, so that a load having a low impedance can be driven.

When the third secondary-side electrode is disposed between the first secondary-side electrode and the second secondary-side electrode and the areas of the secondary-side region are polarized, the distance between the secondary-side electrodes decreases and an absolute voltage applied to the secondary-side electrodes for polarization decreases, compared to a piezoelectric transformer in which only the first and second secondary-side electrodes are provided in the secondary-side region and the region between the first and second secondary-side electrodes is polarized in one direction along the second direction. As a result, a countermeasure to high voltages is easy to implement, and a power source outputting a lower voltage can be employed for polarization.

In the present invention, since the first, second and third secondary-side electrodes are provided such that they are opposite to each other in the second direction, the first, second and third secondary-side electrodes can extend over a predetermined length in the first direction, and they can be extended so as to include a node of vibration in the first direction. Accordingly, leads or lead frames can be connected to the secondary-side electrodes at the node of vibration of the first, second and third secondary-side electrodes in the first direction. As a result, electrical connection and mechanical support at the secondary-side can be easily performed without obstructing vibration in the first direction. This stabilizes the output of the piezoelectric transformer and makes it easier to encase the piezoelectric transformer.

When the third secondary-side electrode is provided as described above, it is preferred that the third secondary-side electrode be disposed at the central portion of the piezoelectric substrate in the second direction, and that the first and second secondary-side electrodes be symmetrically disposed with respect to the third secondary-side electrode in the second direction.

When the above-described structure is employed, the node of vibration of the piezoelectric substrate in the second direction is located at the central portion of the piezoelectric substrate in the second direction. Since the third secondary-side electrode is provided at the central portion of the piezoelectric substrate in the second direction, vibration of the piezoelectric transformer in the second direction is not hindered even when a supporting member for the secondary-side region is connected to the third secondary-side electrode. As result, electrical connection and mechanical support at the secondary-side can be easily performed without obstructing vibration in the second direction. This stabilizes the output of the piezoelectric transformer and makes it easier to encase the piezoelectric transformer.

Also, the first through third secondary-side electrodes can be disposed such that they are separated from the primary-side electrodes.

With this structure, a circuit on the primary side and a circuit on the secondary side can be separated in terms of direct current. Therefore, a grounding electrode can be formed on the secondary side independently of that on the primary side thereby to insulate the grounding circuit on the primary side from the grounding circuit on the secondary side, and also the secondary side can be left floating without being grounded, thereby improving noise resistance.

A secondary-side electrode among the first through third secondary-side electrodes to be grounded can be connected to one of the primary-side electrodes to be grounded so as to allow direct current to flow therebetween.

When the above-mentioned structure is employed, a common electrical connection is used to ground an electrode on the secondary side and to ground an electrode on the primary side. This eliminates the necessity of connecting a lead frame or lead wire to ground the electrode on the secondary side. As a result, vibration of the piezoelectric transformer is not hindered by the electrical connection for grounding the electrode on the secondary side.

The piezoelectric transformer may be modified such that the third secondary-side electrode is provided at the central portion of the piezoelectric substrate in the second direction such that it extends in the first direction so as to include a node of vibration in the first direction, the first and second secondary-side electrodes are symmetrically disposed with respect to the third secondary-side electrode in the second direction, the first and second secondary-side electrodes are used for grounding, and the first and second secondary-side electrodes are connected to a primary-side electrode to be grounded so as to allow direct current to flow therebetween.

By disposing the third secondary-side electrode such that it extends in the first direction and includes a node of vibration in the first direction, a lead or lead frame can be connected to the piezoelectric transformer at the node of vibration of the piezoelectric transformer in the first direction. Therefore, electrical connection to the third secondary-side electrode and mechanical support can be easily performed without obstructing vibration of the piezoelectric substrate in the first direction. This stabilizes the output of the piezoelectric transformer and makes it easier to encase the piezoelectric transformer.

Moreover, since the third secondary-side electrode is provided at the central portion of the piezoelectric substrate in the second direction such that it is located at the central portion of the piezoelectric substrate in the second direction, and the first and second secondary-side electrodes are symmetrically disposed with respect to the third secondary-side electrode in the second direction, a lead or lead frame can be connected to the piezoelectric transformer at the node of vibration of the piezoelectric transformer in the second direction. Therefore, electrical connection to the third secondary-side electrode and mechanical support can be easily performed without obstructing vibration of the piezoelectric substrate in the second direction. This stabilizes the output of the piezoelectric transformer and makes it easier to encase the piezoelectric transformer.

When the first and second secondary-side electrodes are used as ground electrodes, and these first and second secondary-side electrodes are connected with a primary-side electrode used as a ground terminal so as to allow direct current to flow therebetween, a common electrical connection can be used to ground the electrodes on the secondary side and to ground the electrode on the primary side. This eliminates the necessity of connecting a lead frame or lead wire to ground the electrodes on the secondary side. As a result, vibration of the piezoelectric transformer is not hindered by the electrical connection for grounding the electrodes on the secondary side.

In this case, it is preferred that the first and second secondary-side electrodes and a primary-side electrode used as a ground electrode be continuously formed on the first or second main face.

With this structure, the first and second secondary-side electrodes, the primary-side electrode used as a ground, and a connecting portion connecting the first and second secondary-side electrodes with the primary-side electrode for allowing a direct current to flow therebetween, can be simultaneously formed in a single film forming stage.

Preferably, each of the above-described piezoelectric transformers in which the secondary side region is polarized in the longitudinal direction is provided with a lead terminal which is electrically and mechanically connected to the secondary-side electrode, one of the secondary-side electrode and the second secondary-side electrode, or one of the secondary-side electrode and the third secondary-side electrode to support the piezoelectric substrate, wherein the lead terminal is provided with the resilient structure portion which bends to vibrate in the longitudinal direction or the first direction in accordance with vibration of the piezoelectric substrate in the longitudinal direction or the first direction.

The piezoelectric substrate is electrically connected to an external circuit via the lead terminal and is mechanically supported by the lead terminal. Also, the hindrance of vibration of the piezoelectric substrate in the longitudinal direction or the first direction is prevented by the resilient structure portion.

Preferably, each of the above-described piezoelectric transformers in which the secondary side region is polarized in the second direction is provided with a lead terminal which is electrically and mechanically connected to the secondary-side electrode or one of first through third secondary-side electrodes, wherein the lead terminal is provided with a resilient structure portion which bends to vibrate in the second direction in accordance with vibration of the piezoelectric substrate in the second direction.

The piezoelectric substrate is electrically connected to an external circuit via the lead terminal and is mechanically supported by the lead terminal. Also, the hindrance of vibration of the piezoelectric substrate in the second direction is prevented by the resilient structure portion.

Preferably, the resilient structure portion is formed by curving the lead terminal at its intermediate portion.

Preferably, the resilient structure portion is formed by bending the lead terminal at its intermediate portion.

Preferably, the resilient structure portion is formed by forming an intermediate portion of the lead terminal into a ring-like shape.

The piezoelectric transformers of the present invention are preferably used for lighting a cold cathode fluorescent lamp.

The piezoelectric transformers of the present invention are preferably built into inverters.

The piezoelectric transformers of the present invention are preferably built into liquid crystal displays.

Moreover, the piezoelectric transformers of the present invention may be used in high voltage deflecting circuits for Braun tubes, and high voltage generating circuits for copying machines, facsimile machines, etc.

In the present invention, PZT type piezoelectric ceramics or $PbTiO_3$ type piezoelectric ceramics such as $PbTiO_3$ are used as a piezoelectric material used for manufacturing a piezoelectric substrate. Examples of PZT type piezoelectric ceramics include PZT ceramics, and $Pb(Ni_{1/3}Nb_{2/3})O_3$—$Pb(Zn_{1/3}Nb_{2/3})O_3$—$PbTiO_3$—$PbZrO_3$ type ceramics.

Examples of materials suitable for electrodes includes Ag and Ag—Pd.

BRIEF DESCRIPTION OF THE DRAWINGS

The above and further objects, features and advantages of the present invention will become more apparent from the following detailed description taken in conjunction with the accompanying drawings, wherein:

FIGS. 1A to 1D are diagrams for explaining a conventional piezoelectric transformer element, wherein FIG. 1A is a perspective view, FIG. 1B is a cross-sectional view, FIG. 1C is a graph showing stress distribution, and FIG. 1D is a graph showing amplitude distribution;

FIGS. 2A to 2D are diagrams for explaining a piezoelectric transformer element according to a first embodiment of the present invention, wherein FIG. 2A is a perspective view, FIG. 2B is a cross-sectional view, FIG. 2C is a graph showing stress distribution, and FIG. 2D is a graph showing amplitude distribution;

FIGS. 4A to 4E are diagrams for explaining piezoelectric transformer elements according to a second embodiment through a fourth embodiment of the present invention, wherein FIG. 4A is a cross-sectional view showing a piezoelectric transformer element according to the second embodiment, FIG. 4B is a cross-sectional view showing a piezoelectric transformer element according to the third embodiment, FIG. 4C is a cross-sectional view showing a piezoelectric transformer element according to the fourth embodiment, FIG. 4D is a graph showing stress distribution of the piezoelectric transformer elements of FIGS. 4A to 4C, and FIG. 4E is a graph showing amplitude distribution of the piezoelectric transformer elements of FIGS. 4A to 4C;

FIGS. 5A to 5C are diagrams for explaining a piezoelectric transformer element according to a fifth embodiment of the present invention, wherein FIG. 5A is a cross-sectional view, FIG. 5B is a graph showing stress distribution, and FIG. 5C is a graph showing amplitude distribution;

FIGS. 6A to 6D are diagrams for explaining a piezoelectric transformer element according to a sixth embodiment of the present invention, wherein FIG. 6A is a perspective view, FIG. 6B is a cross-sectional view, FIG. 6C is a graph showing stress distribution, and FIG. 6D is a graph showing amplitude distribution;

FIGS. 7A to 7D are diagrams for explaining piezoelectric transformer elements according to a seventh embodiment and an eighth embodiment of the present invention, wherein FIG. 7A is a cross-sectional view showing a piezoelectric transformer element according to the seventh embodiment, FIG. 7B is a cross-sectional view showing a piezoelectric transformer element according to the eighth embodiment, FIG. 7C is a graph showing stress distribution of the piezoelectric transformer elements of FIGS. 7A and 7B, and FIG. 7D is a graph showing amplitude distribution of the piezoelectric transformer elements of FIGS. 7A and 7B;

FIGS. 10A to 10C are diagrams for explaining a piezoelectric transformer element according to an eleventh embodiment of the present invention and a driving method therefor, wherein FIG. 10A is a perspective view, FIG. 10B is a graph showing stress distribution, and FIG. 10C is a graph showing amplitude distribution;

FIGS. 11A to 11D are diagrams for explaining a piezoelectric transformer element according to a twelfth embodiment of the present invention, wherein FIG. 11A is a perspective view, FIG. 11B is a cross-sectional view, FIG. 11C is a graph showing stress distribution, and FIG. 11D is a graph showing amplitude distribution;

FIGS. 12A to 12D are diagrams for explaining a piezoelectric transformer element according to a thirteenth embodiment of the present invention, wherein FIG. 12A is a perspective view, FIG. 12B is a cross-sectional view, FIG. 12C is a graph showing stress distribution, and FIG. 12D is a graph showing amplitude distribution;

FIGS. 15A to 15D are diagrams for explaining a piezoelectric transformer element according to a fourteenth embodiment of the present invention, wherein FIG. 15A is a perspective view, FIG. 15B is a cross-sectional view, FIG. 15C is a graph showing stress distribution, and FIG. 15D is a graph showing amplitude distribution;

FIGS. 16A to 16D are diagrams for explaining piezoelectric transformer elements according to a fifteenth embodiment and a sixteenth embodiment of the present invention, wherein FIG. 16A is a cross-sectional view showing a piezoelectric transformer element according to the fifteenth embodiment, FIG. 16B is a cross-sectional view showing a piezoelectric transformer element according to the sixteenth embodiment, FIG. 16C is a graph showing stress distribution of the piezoelectric transformer elements of FIGS. 16A and 16B, and FIG. 16D is a graph showing amplitude distribution of the piezoelectric transformer elements of FIGS. 16A and 16B;

FIGS. 17A to 17D are diagrams for explaining a piezoelectric transformer element according to a seventeenth embodiment of the present invention, wherein FIG. 17A is a perspective view, FIG. 17B is a cross-sectional view, FIG. 17C is a graph showing stress distribution, and FIG. 17D is a graph showing amplitude distribution;

FIGS. 18A to 18C are diagrams for explaining a piezoelectric transformer element according to an eighteenth embodiment of the present invention, wherein FIG. 18A is a cross-sectional view, FIG. 18B is a graph showing stress distribution, and FIG. 18C is a graph showing amplitude distribution;

FIGS. 19A to 19E are diagrams for explaining a piezoelectric transformer element according to a nineteenth embodiment of the present invention, wherein FIG. 19A is a perspective top view, FIG. 19B is a perspective bottom view, FIG. 19C is a cross-sectional view, FIG. 19D is a graph showing stress distribution, and FIG. 19E is a graph showing amplitude distribution;

FIGS. 21A to 21E are diagrams for explaining a piezoelectric transformer element according to a twentieth embodiment of the present invention, wherein FIG. 21A is a perspective top view, FIG. 21B is a perspective bottom view, FIG. 21C is a cross-sectional view, FIG. 21D is a graph showing stress distribution, and FIG. 21E is a graph showing amplitude distribution;

FIGS. 23A to 23D are diagrams for explaining a piezoelectric transformer element according to a twenty-second embodiment of the present invention, wherein FIG. 23A is a perspective view, FIG. 23B is a cross-sectional view, FIG. 23C is a graph showing stress distribution, and FIG. 23D is a graph showing amplitude distribution;

FIGS. 27A to 27D are diagrams for explaining a piezoelectric transformer element according to a twenty-sixth embodiment of the present invention, wherein FIG. 27A is a perspective view, FIG. 27B is a cross-sectional view, FIG. 27C is a graph showing stress distribution, and FIG. 27D is a graph showing amplitude distribution;

FIGS. 39A to 39B are diagrams for explaining a piezoelectric transformer element according to a thirty-fourth embodiment of the present invention, wherein FIG. 39A is a perspective view and FIG. 39B is a cross-sectional view;

FIGS. 40A to 40D are diagrams for explaining a piezoelectric transformer element according to a thirty-fifth embodiment of the present invention, wherein FIG. 40A is a perspective view, FIG. 40B is a cross-sectional view, FIG. 40C is a graph showing stress distribution, and FIG. 40D is a graph showing amplitude distribution;

FIGS. 41A to 41C are diagrams for explaining a piezoelectric transformer according to a thirty-sixth embodiment of the present invention, wherein FIG. 41A is a perspective view, FIG. 41B is a graph showing stress distribution, and FIG. 41C is a graph showing amplitude distribution;

FIGS. 43A to 43E are diagrams for explaining a piezoelectric transformer element according to a thirty-seventh embodiment of the present invention, wherein FIG. 43A is a top view, FIG. 43B is a bottom view, FIG. 43C is a cross-sectional view along the line Z—Z of FIG. 43C, FIG. 43D is a graph showing stress distribution, and FIG. 43E is a graph showing amplitude distribution.

DESCRIPTION OF THE PREFERRED EMBODIMENTS

Figure 1A:
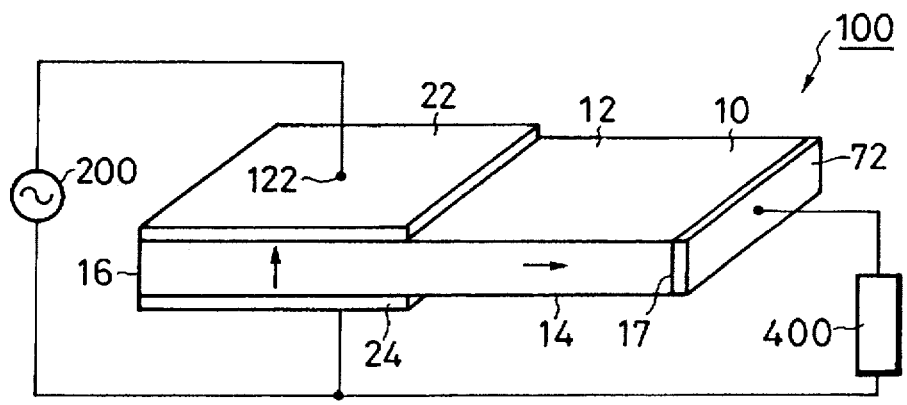
Figure 1B:
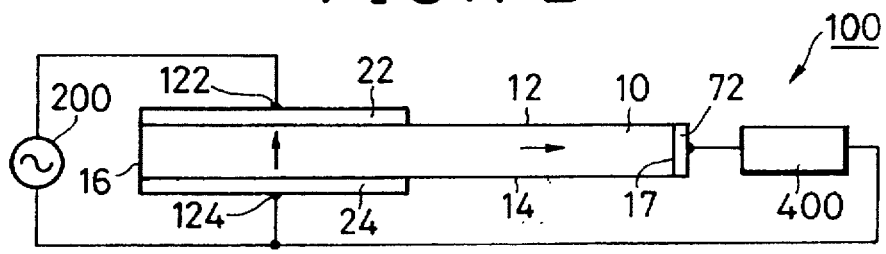
Figure 1C:
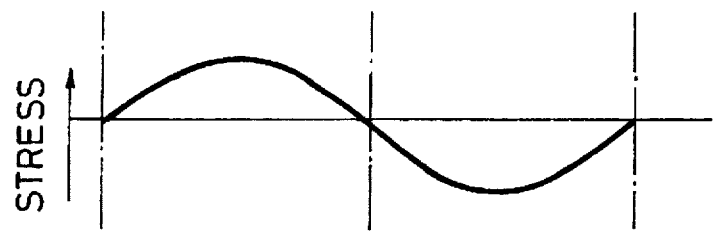
Figure 1D:
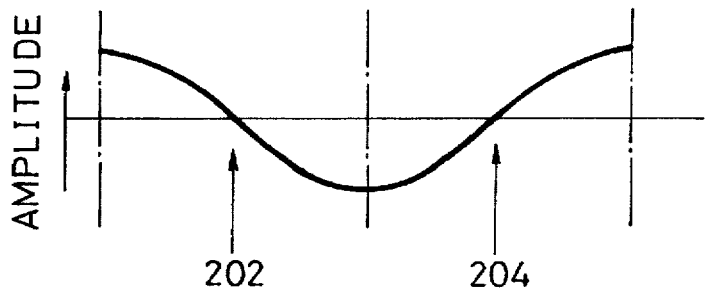
Figure 2A:
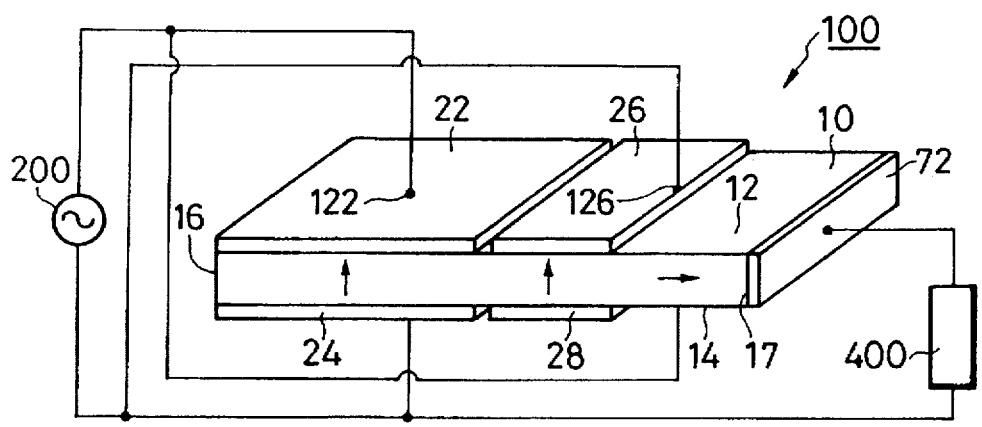
Figure 2B:
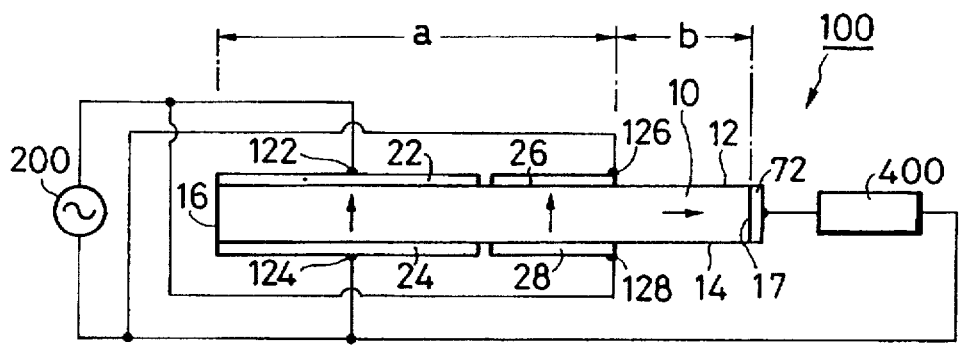

First embodiment:

As shown in FIGS. 2A and 2B, a primary-side electrode 22 is disposed on the top face 12 of a rectangular parallelepipedic piezoelectric ceramics substrate 10 to cover the left (primary) half thereof, and also a primary-side electrode 24 is disposed on the bottom face 14 of the piezoelectric ceramics substrate 10 opposite to the primary-side electrode 22, and the portion of the piezoelectric ceramics substrate 10 between the primary-side electrode 22 and the primary-side electrode 24 is polarized in the thicknesswise direction between the top face 12 and the bottom face 14.

A primary-side electrode 26 is disposed on the top face 12 of the piezoelectric ceramics substrate 10 such that the primary-side electrode 26 extends in the longitudinal direction of the piezoelectric ceramics substrate 10 from a position located half the length of the piezoelectric ceramics substrate 10 as measured from a primary-side end surface 16 to a position located ¾ of the length of the piezoelectric ceramics substrate 10 as measured from the primary-side end surface 16, and also a primary-side electrode 28 is disposed on the bottom face 14 of the piezoelectric ceramics substrate 10 opposite to the primary-side electrode 26. The primary-side electrode 26 is disposed in separation from the primary-side electrode 22, and the primary-side electrode 28 is disposed in separation from the primary-side electrode 24. The portion of the piezoelectric ceramics substrate 10 between the primary-side electrode 26 and the primary-side electrode 28 is polarized in the thicknesswise direction between the top face 12 and the bottom face 14. The portion of the piezoelectric ceramics substrate 10 between the primary-side electrode 22 and the primary-side electrode 24 is polarized in the same direction as in the portion between the primary-side electrode 26 and the primary-side electrode 28.

A secondary-side electrode 72 is disposed on a secondary-side end surface 17 perpendicular to both the top face 12 and the bottom face 14, and the portion of the piezoelectric ceramics substrate 10 between the secondary-side electrode 72 and the near edges of the primary-side electrodes 26 and 28 is longitudinally polarized.

One end of a power source 200 is connected to the primary-side electrode 22 via a connecting portion 122, and to the primary-side electrode 28 via a connecting portion 128. The other end of the power source 200 is connected to the primary-side electrode 24 via a connecting portion 124, and to the primary-side electrode 26 via a connecting portion 126. The secondary-side electrode 72 is connected to a load 400 at one end thereof, and the other end of the load 400 is connected to the other end of the power source 200.

Figure 2C:
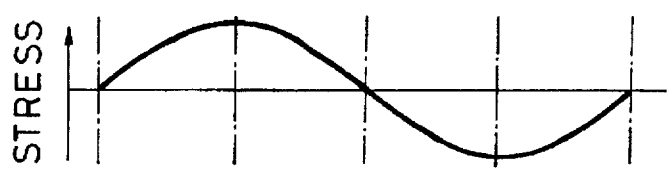
Figure 2D:
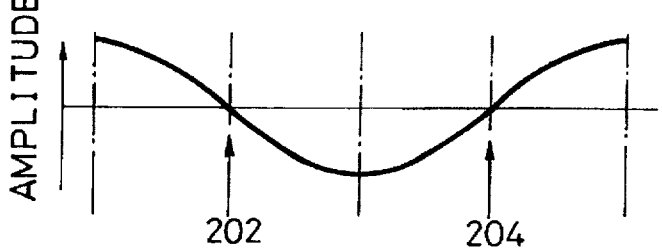

When a voltage from the power source 200 is applied between the primary-side electrode 22 and the primary-side electrode 24, an electric field is applied to the left half of the piezoelectric ceramics substrate 10 in the thicknesswise direction thereof, which excites longitudinal vibration in the longitudinal direction due to a piezoelectric transverse effect involving a displacement perpendicular to the direction of polarization, whereby a piezoelectric transformer element 100 vibrates as a whole. The piezoelectric transformer element according to the present embodiment can be driven in such a resonance mode that one wavelength of stress distribution exists between the primary-side end surface 16 and the secondary-side end surface 17. A voltage having a frequency equal to a resonant frequency of the one wavelength type resonance mode is applied from the power source 200. In the present embodiment, support points are located a quarter wavelength to the right of the primary-side end surface 16 and a quarter wavelength to the left of the secondary-side end surface 17. Since the primary-side and secondary-side end surfaces 16 and 17 of the piezoelectric ceramics substrate 10 are open, at both longitudinal ends of the piezoelectric ceramics substrate 10, stress is zero and amplitude is maximized. Also, since the piezoelectric ceramics substrate 10 is resonated in the one wavelength mode in the present embodiment, stress and amplitude distributions are as shown in FIGS. 2C and 2D, respectively.

In the present embodiment, the primary-side electrodes 26 and 28 are provided in addition to the primary-side electrodes 22 and 24. Thus, the area of electrodes at primary side "a" becomes greater than that of a conventional piezoelectric transformer element of FIG. 1, and the input impedance of the piezoelectric transformer element 100 becomes smaller accordingly. As a result, electrical energy from the power source 200 is more readily fed to the piezoelectric transformer element 100.

Also, stress within that region provided with the primary-side electrodes 22 and 24 is directed to the top face 12 of the piezoelectric ceramics substrate 10, while stress within that region provided with the primary-side electrodes 26 and 28 is directed to the bottom face 14 of the piezoelectric ceramics substrate 10, i.e. oppositely to the stress within that region provided with the primary-side electrodes 22 and 24. The portion of the piezoelectric ceramics substrate 10 between the primary-side electrode 26 and the primary-side electrode 28 is polarized in the same direction as in the portion between the primary-side electrode 22 and the primary-side electrode 24, but an electric field is applied oppositely. Accordingly, when a voltage from the power source 200 is applied between the primary-side electrode 26 and the primary-side electrode 28, the portion of the piezoelectric ceramics substrate 10 between the primary-side electrode 26 and the primary-side electrode 28 vibrates so as to enhance resonance which is excited by applying a voltage from the power source 200 between the primary-side electrode 22 and the primary-side electrode 24. As a result, electrical energy fed from the power source 200 can be more efficiently converted to mechanical elastic energy at the primary side "a".

Furthermore, as a result of disposing the primary-side electrodes 26 and 28, a region of secondary side "b" is shortened in the longitudinal direction, and consequently the output impedance becomes smaller. As the output impedance of the piezoelectric transformer element 100 becomes smaller, voltage to be applied to the load 400 connected to the secondary-side electrode 72 of the piezoelectric transformer element 100 becomes greater accordingly.

As has been describe above, the primary-side electrodes 26 and 28 are disposed in the region where stress is directed oppositely to that in the region provided with the primary-side electrodes 22 and 24, the portion of the piezoelectric ceramics substrate 10 between the primary-side electrode 26 and the primary-side electrode 28 is polarized in the same direction as in the portion between the primary-side electrode 22 and the primary-side electrode 24, and an electric field is oppositely applied. As a result, the input impedance of the piezoelectric transformer element 100 becomes smaller with a resultant improved feed of electrical energy from the power source 200 to the piezoelectric transformer element 100, input electrical energy is more efficiently converted to mechanical elastic energy at the primary side "a", and the output impedance becomes smaller with a resultant increase in voltage to be applied to the load 400 which is connected to the piezoelectric transformer element 100 at the secondary side "b". Thus, the effective voltage step-up ratio of the piezoelectric transformer element 100 can be increased.

Further, as a result of disposing the primary-side electrodes 26 and 28 as in the present embodiment, the distance between primary-side and secondary-side electrodes becomes shorter, and consequently when the portion of the piezoelectric ceramics substrate 10 between the secondary-side electrode 72 and the near edges of the primary-side electrodes 26 and 28 is longitudinally polarized, an absolute voltage applied for the polarization becomes smaller as compared to that of the conventional piezoelectric transformer element of FIG. 1 which is not provided with the primary-side electrodes 26 and 28. As a result, a countermeasure to high voltages is easy to implement, and a power source outputting a lower voltage can be employed for polarization.

The present invention is also effective, when the load 400 connected to the piezoelectric transformer element 100 at the secondary side "b" is a CFL. A CFL 400 requires a high voltage of not less than 1 kV to initiate its discharge. On the other hand, the voltage step-up ratio of the piezoelectric transformer element 100 is proportional to a quality coefficient Qm of a resonator. Since the impedance of the CFL 400 is near infinite before discharge is initiated, the voltage step-up ratio is proportional to Qm of the piezoelectric transformer element 100 itself, and hence a large voltage step-up ratio is available. Accordingly, even though a voltage step-up ratio dependent on the shape of the secondary region becomes smaller due to the shortened distance between the primary-side and secondary-side electrodes caused by disposing the primary-side electrodes 26 and 28 as in the present embodiment, a discharge voltage can be readily built up because Qm of the resonator itself makes a significant contribution to the voltage step-up ratio at the time of initiating discharge. Once discharge is initiated, the impedance of the CFL 400 drops; however, since the output impedance of the piezoelectric transformer element 100 becomes smaller as a result of disposing the primary-side electrodes 26 and 28 as in the present embodiment, the voltage applied to the CFL 400 can be increased accordingly.

Also, as a result of disposing the primary-side electrodes 26 and 28 as in the present invention, by adjusting the size or the like of the primary-side electrodes 26 and 28 disposed as in the present embodiment, not only the voltage step-up ratio of the piezoelectric transformer element 100 but also the output impedance can be adjusted, thereby improving degrees of freedom in design.

In the present embodiment, support points are located at vibrational nodes 202, 204 of the piezoelectric transformer element 100, thereby minimizing hindrance to vibration of the piezoelectric transformer element 100 which occurs by the support of the piezoelectric transformer element 100. Further, in the present embodiment, the connecting portions 122 and 124 to the primary-side electrodes 22 and 24, respectively, and electrode terminals provided at the connecting portions 122 and 124 are located at the vibrational node 202, and the connecting portions 126 and 128 to the primary-side electrodes 26 and 28, respectively, and electrode terminals provided at the connecting portions 126 and 128 are located at the vibrational node 204, thereby preventing the electric connecting portions from hindering vibration.

In the present embodiment, piezoelectric ceramics of $Pb(Ni_{1/3}Nb_{2/3})O_3$—$Pb(Zn_{1/3}Nb_{2/3})O_3$—$PbTiO_3$—$PbZrO_3$ fabricated by firing was cut into a rectangular parallelepiped measuring 20 mm in length×5 mm in width×1 mm in thickness to make the piezoelectric ceramics substrate 10. Next, silver was applied on to the top face 12 and the bottom face 14 of the piezoelectric ceramics substrate 10 by screen printing, and onto the secondary-side end surface 17 by brushing. Then, the thus prepared piezoelectric ceramics substrate 10 was baked at 600° C. in the air to form the primary-side electrodes 22 and 26 on the top face 12 thereof, the primary-side electrodes 24 and 28 on the bottom face 14 thereof, and the secondary-side electrode 72 on the secondary-side end surface 17 thereof.

Subsequently, a voltage of 2 kV DC was applied at 100° C. between the primary-side electrode 22 and the primary-side electrode 24 and also between the primary-side electrode 26 and the primary-side electrode 28 to polarize the portion of the piezoelectric ceramics substrate 10 between the primary-side electrode 22 and the primary-side electrode 24 in the thicknesswise direction and to polarize the portion of the piezoelectric ceramics substrate 10 between the primary-side electrode 26 and the primary-side electrode 28 in the thicknesswise direction. Then, the primary-side electrode 26 and the primary-side electrode 28 were connected to the positive terminal of a high-voltage DC power source, the secondary-side electrode 72 was connected to the negative terminal of the high-voltage DC power source, and a voltage of 10 kV was then applied at 100° C. to longitudinally polarize the portion of the piezoelectric ceramics substrate 10 between the secondary-side electrode 72 and the near edges of the primary-side electrodes 26 and 28.

Then, one end of the power source 200 was connected to the primary-side electrode 22 via the connecting portion 122 and to the primary-side electrode 28 via the connecting portion 128, and the other end of the power source 200 was connected to the primary-side electrode 24 via the connecting portion 124 and to the primary-side electrode 26 via the connecting portion 126. The secondary-side electrode 72 was connected to one end of the CFL 400, and the other end the CFL 400 was connected to the other end of the power source 200. The CFL 400 used was a CFL measuring 225 mm in length×2.6 mm in diameter for use with an A4-sized notebook type personal computer.

Figure 3:
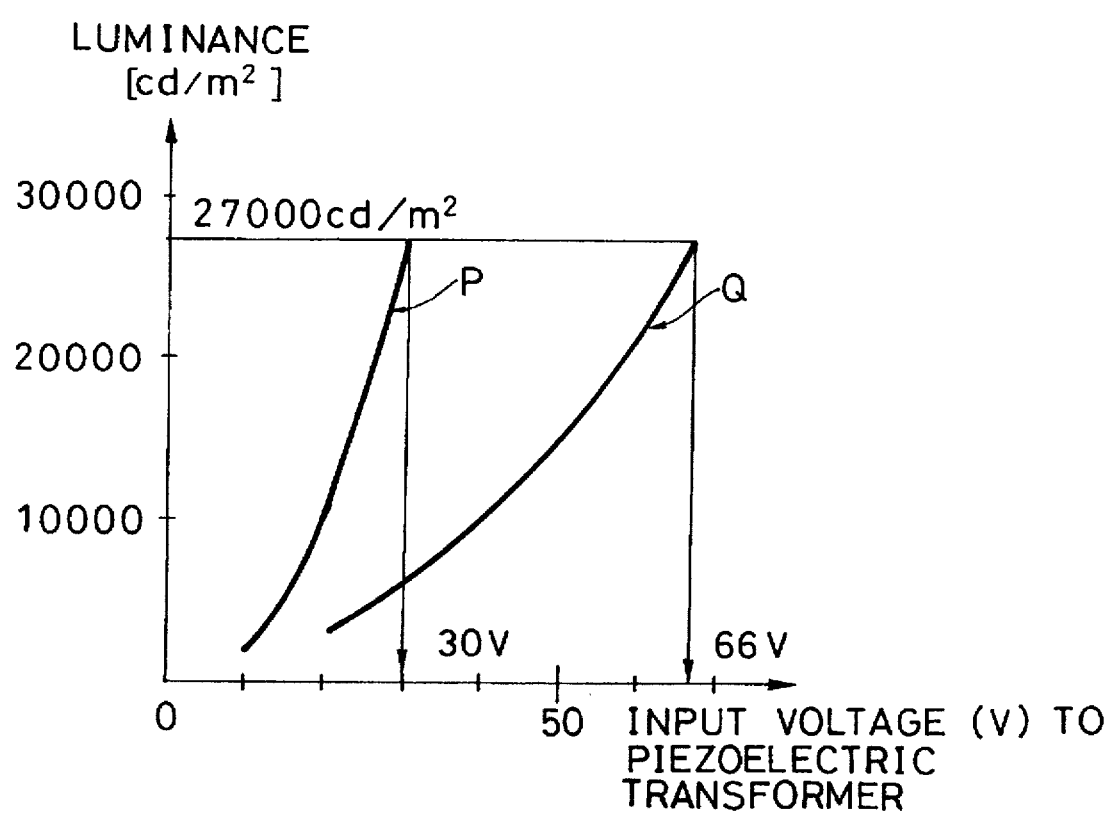
FIG. 3 is a graph showing the relationship between an input voltage supplied to the piezoelectric transformer element according to the first embodiment and the brightness of a cold cathode fluorescent lamp.

With the piezoelectric transformer element 100 being supported at the vibrational nodes 202 and 204, a voltage having a frequency of 160 kHz was applied from the power source 200 to the piezoelectric transformer element 100 to measure the relationship between the input voltage to the piezoelectric transformer element 100 and the luminance of the CFL 400. These measurements are shown in FIG. 3 (curve P). In FIG. 3, for comparison, measurements are also shown for the piezoelectric transformer element 100 of FIG. 2 which is not provided with the primary-side electrodes 26 and 28 and in which the portion of the piezoelectric ceramics substrate 10 between the secondary-side electrode 72 and the primary-side electrodes 22 and 24 is longitudinally polarized (curve Q). The piezoelectric transformer not provided with the primary-side electrodes 26 and 28 required an input voltage of 66 $V_{rms}$ to obtain a luminance of 27,000 $cd/m^2$ in the CFL 400, while the present embodiment required an input voltage of 30 $V_{rms}$ to obtain the same luminance.

Lighting of the CFL 400 was able to be initiated at an input voltage of approximately 15 $V_{rms}$.

Figure 4A:
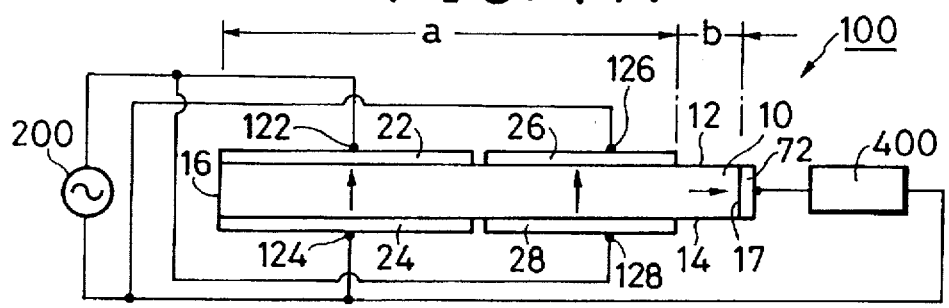

Second to fifth embodiments:

As shown in FIG. 4A, a second embodiment is different from the first embodiment in that the primary-side electrodes 26 and 28 are lengthened to bring ends thereof on the side of the secondary-side electrode 72 closer to the secondary-side electrode 72 than in the first embodiment, but other features and the manufacturing method are the same.

Figure 4B:
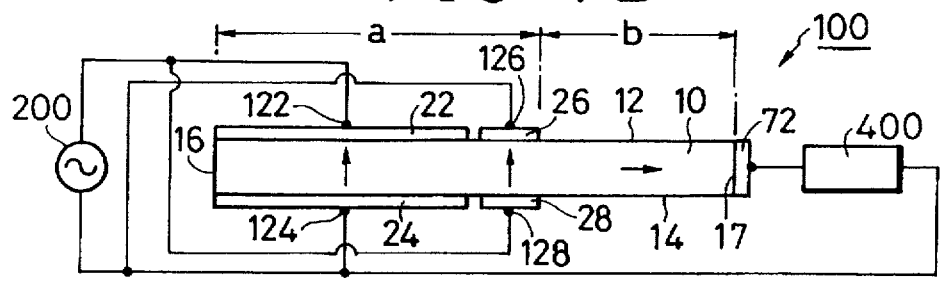

As shown in FIG. 4B, a third embodiment is different from the first embodiment in that the primary-side electrodes 26 and 28 are shortened to keep ends thereof on the side of the secondary-side electrode 72 further away from the secondary-side electrode 72 than in the first embodiment, but other features and the manufacturing method are the same.

Figure 4C:
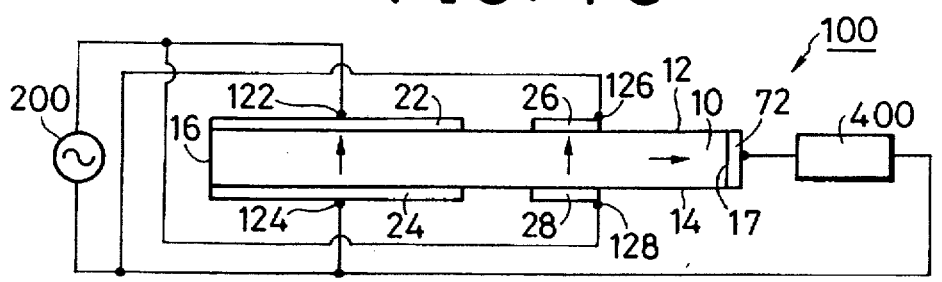
Figure 4D:
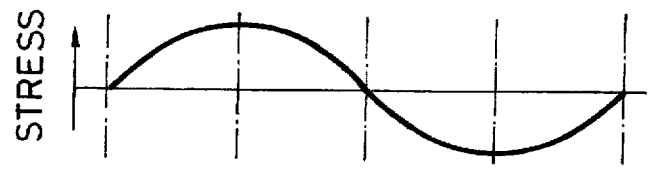
Figure 4E:
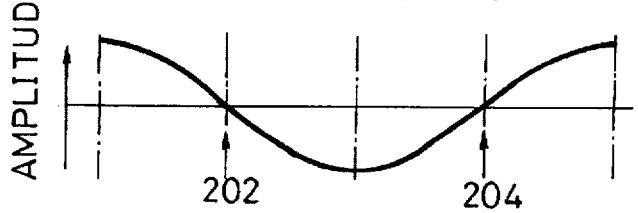

As shown in FIG. 4C, a fourth embodiment is different from the first embodiment in that the primary-side electrodes 26 and 28 are shortened to keep ends thereof on the side of the primary-side electrode 16 further away from primary-side electrodes 22 and 24, respectively, than in the first embodiment, while the distance between the ends of the primary-side electrodes 26 and 28 on the side of the secondary-side electrode 72 and the secondary-side electrode 72 is identical to that of the first embodiment. Other features and the manufacturing method are the same.

Figure 5A:
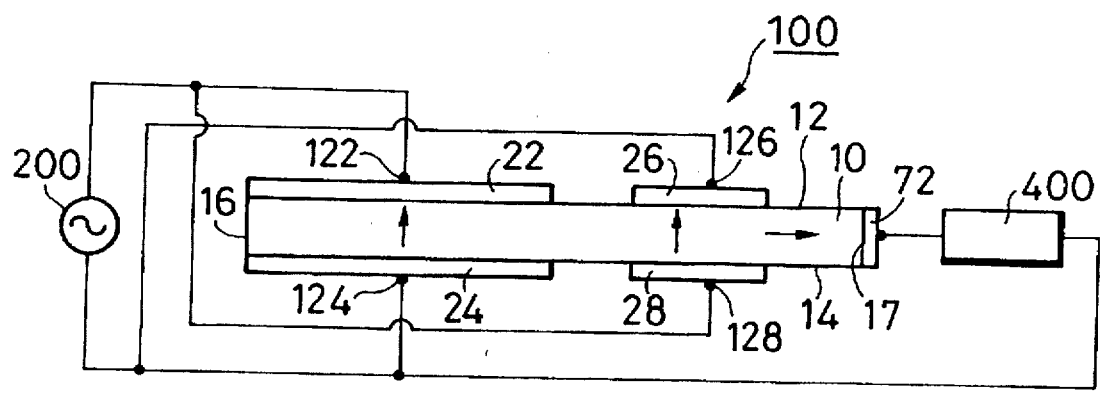
Figure 5B:
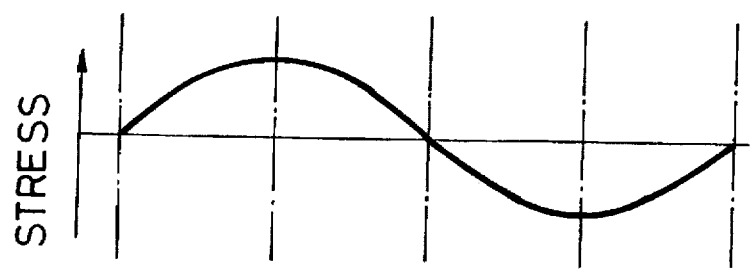
Figure 5C:
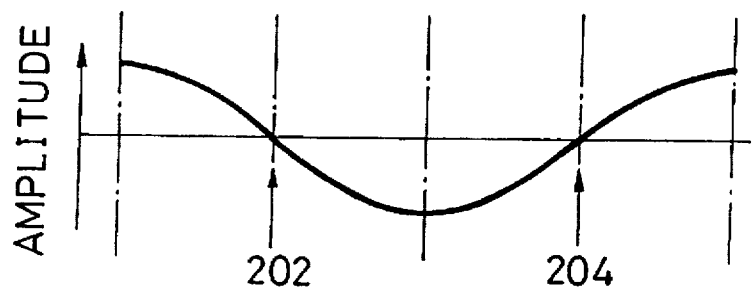

As shown in FIGS. 5A to 5C, a fifth embodiment is different from the fourth embodiment in that the primary-side electrodes 26 and 28 are lengthened by a predetermined length to bring ends thereof on the side of the secondary-side electrode 72 closer to the secondary-side electrode 72 than in the fourth embodiment, but other features and the manufacturing method are the same. According to the fifth embodiment, the positions and sizes of the primary-side electrodes 26 and 28 are determined to facilitate adjusting the input and output impedances, providing support points for the piezoelectric ceramics substrate 10, and leading out lead wires.

Also, in the second to fifth embodiments, the primary-side electrodes 26 and 28 are disposed in a region where stress is directed oppositely to that in a region provided with the primary-side electrodes 22 and 24, the portion of the piezoelectric ceramics substrate 10 between the primary-side electrode 26 and the primary-side electrode 28 is polarized in the same direction as in the portion between the primary-side electrode 22 and the primary-side electrode 24, and an electric field is oppositely applied. As a result the input impedance of the piezoelectric transformer element 100 becomes smaller with a resultant improved feed of electrical energy from the power source 200 to the piezoelectric transformer element 100, input electrical energy is more efficiently converted to mechanical elastic energy at primary side "a", and the output impedance becomes smaller with a resultant increase in voltage to be applied to a load 400 which is connected to the piezoelectric transformer element 100 at secondary side "b". Thus, the effective voltage step-up ratio of the piezoelectric transformer element 100 can be increased.

In the second embodiment, since the primary-side electrodes 26 and 28 are lengthened, the area of electrodes at the primary side "a" becomes greater than that of the piezoelectric transformer element 100 according to the first embodiment, and the input impedance of the piezoelectric transformer element 100 becomes smaller accordingly. Also, electrical energy fed from the power source 200 can be more efficiently converted to mechanical elastic energy at the primary side "a" than in the first embodiment. Further, since the ends of the primary-side electrodes 26 and 28 on the side of the secondary-side electrode 72 are brought closer to the secondary-side electrode 72 than in the first embodiment, a region of the secondary side "b" is longitudinally shortened; consequently, the output impedance becomes much smaller. As a result, a larger voltage can be applied to the load 400 which is connected to the piezoelectric transformer element 100 at the secondary side "b", whereby the effective voltage step-up ratio of the piezoelectric transformer element 100 can be increased.

In the third embodiment, since the ends of the primary-side electrodes 26 and 28 on the side of the secondary-side electrode 72 are kept further away from the secondary-side electrode 72 than in the first embodiment, a larger voltage can be built up on the secondary side, whereby the voltage step-up ratio of the piezoelectric transformer element 100 can be further increased.

Figure 6A:
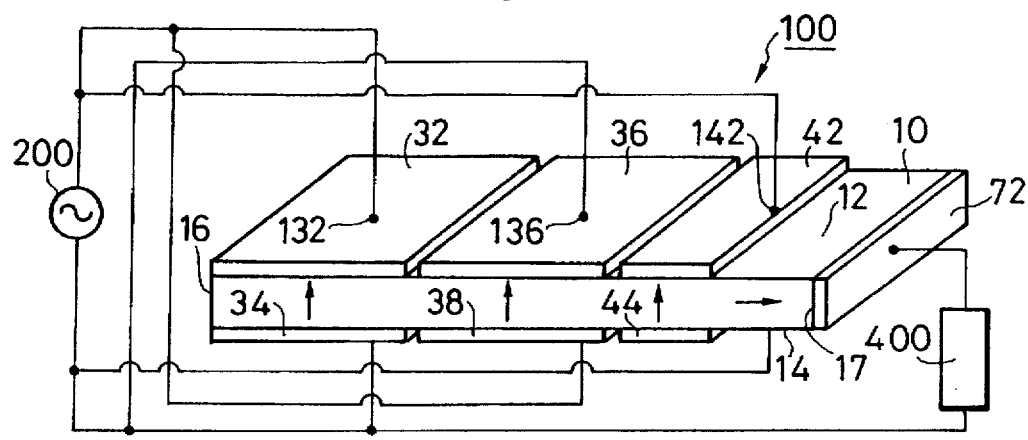
Figure 6B:
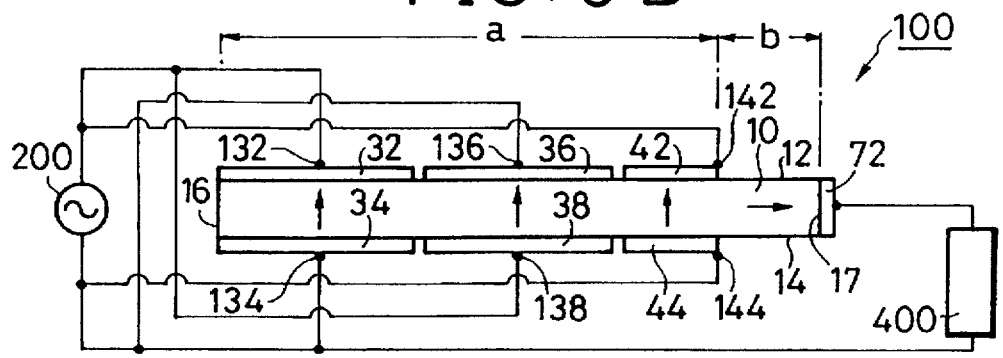

Sixth embodiment:

As shown in FIGS. 6A and 6B, a primary-side electrode 32 is disposed on the top face 12 of a rectangular parallelepipedic piezoelectric ceramics substrate 10 to cover a left ⅓ region, a primary-side electrode 34 is disposed on the bottom face 14 of the piezoelectric ceramics substrate 10 opposite to the primary-side electrode 32, and the portion of the piezoelectric ceramics substrate 10 between the primary-side electrode 32 and the primary-side electrode 34 is polarized in the thicknesswise direction between the top face 12 and the bottom face 14.

Further, a primary-side electrode 36 is disposed on the top face 12 of the piezoelectric ceramics substrate 10 such that the primary-side electrode 36 extends in the longitudinal direction of the piezoelectric ceramics substrate 10 from a position located ⅓ of the length of the piezoelectric ceramics substrate 10 as measured from a primary-side end surface 16 to a position located ⅔ of the length of the piezoelectric ceramics substrate 10 as measured from the primary-side end surface 16, and also a primary-side electrode 38 is disposed on the bottom face 14 of the piezoelectric ceramics substrate 10 opposite to the primary-side electrode 36. The primary-side electrode 36 is disposed in separation from the primary-side electrode 32, and the primary-side electrode 38 is disposed in separation from the primary-side electrode 34. The portion of the piezoelectric ceramics substrate 10 between the primary-side electrode 36 and the primary-side electrode 38 is polarized in the thicknesswise direction between the top face 12 and the bottom face 14.

And further, a primary-side electrode 42 is disposed on the top face 12 of the piezoelectric ceramics substrate 10 such that the primary-side electrode 42 extends in the longitudinal direction of the piezoelectric ceramics substrate 10 from a position located ⅔ of the length of the piezoelectric ceramics substrate 10 as measured from the primary-side end surface 16 to a position located ⅚ of the length of the piezoelectric ceramics substrate 10 as measured from the primary-side end surface 16, and also a primary-side electrode 42 is disposed on the bottom face 14 of the piezoelectric ceramics substrate 10 opposite to the primary-side electrode 42. The primary-side electrode 42 is disposed in separation from the primary-side electrode 36, and the primary-side electrode 44 is disposed in separation from the primary-side electrode 38. The portion of the piezoelectric ceramics substrate 10 between the primary-side electrode 42 and the primary-side electrode 44 is polarized in the thicknesswise direction. The portion of the piezoelectric ceramics substrate 10 between the primary-side electrode 32 and the primary-side electrode 34, the portion of the piezoelectric ceramics substrate 10 between the primary-side electrode 36 and the primary-side electrode 38, and the portion of the piezoelectric ceramics substrate 10 between the primary-side electrode 42 and the primary-side electrode 44 are polarized in the same direction.

A secondary-side electrode 72 is disposed on the secondary-side end surface 17 perpendicular to both the top face 12 and the bottom face 14, and the portion of the piezoelectric ceramics substrate 10 between the secondary-side electrode 72 and the primary-side electrodes 42 and 44 is longitudinally polarized.

One end of a power source 200 is connected to the primary-side electrode 32 via a connecting portion 132, to the primary-side electrode 38 via a connecting portion 138, and to the primary-side electrode 42 via a connecting portion 142. The other end of the power source 200 is connected to the primary-side electrode 34 via a connecting portion 134, to the primary-side electrode 36 via a connecting portion 136, and to the primary-side electrode 44 via a connecting portion 144. The secondary-side electrode 72 is connected to a load 400 at one end thereof, and the other end of the load 400 is connected to the other end of the power source 200.

Figure 6C:
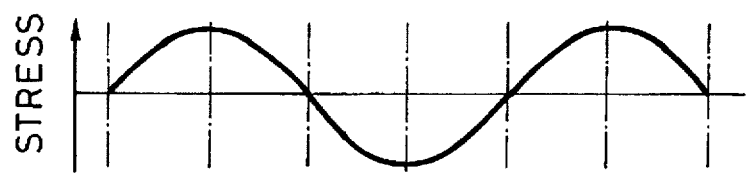
Figure 6D:
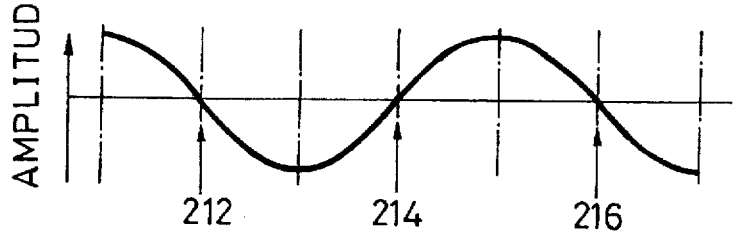

When a voltage from the power source 200 is applied between the primary-side electrode 32 and the primary-side electrode 34, an electric field is applied to the left ⅓ region of the piezoelectric ceramics substrate 10 in the thicknesswise direction thereof, which excites longitudinal vibration in the longitudinal direction due to a piezoelectric transverse effect involving a displacement perpendicular to the direction of polarization, whereby a piezoelectric transformer element 100 vibrates as a whole. A piezoelectric transformer according to the present embodiment can be driven in such a resonance mode that 1.5 wavelength of stress distribution exists between the primary-side end surface 16 and the secondary-side end surface 17. A voltage having a frequency equal to a resonant frequency of the 1.5 wavelength type resonance mode is applied from the power source 200. In the present embodiment, a support point is located a quarter wavelength to the right of the primary-side end surface 16, three-thirds wavelength to the right of the primary-side end surface 16, and a quarter wavelength to the left of the secondary-side end surface 17. Since the primary-side and secondary-side end surfaces 16 and 17 of the piezoelectric ceramics substrate 10 are open, at both longitudinal ends of the piezoelectric ceramics substrate 10, stress is zero and amplitude is maximized. Also, since the piezoelectric ceramics substrate 10 is resonated in the 1.5 wavelength mode in the present embodiment, stress and amplitude distributions are as shown in FIGS. 6C and 6D, respectively.

In the present embodiment, the area of electrodes at primary side a becomes greater, and the input impedance of the piezoelectric transformer element 100 becomes smaller accordingly. As a result, electrical energy from the power source 200 is more readily fed to the piezoelectric transformer element 100.

Also, stress within that region provided with the primary-side electrodes 32 and 34 is directed to the top face 12 of the piezoelectric ceramics substrate 10, while stress within that region provided with the primary-side electrodes 36 and 38 is directed to the bottom face 14 of the piezoelectric ceramics substrate 10, i.e. oppositely to the stress within that region provided with the primary-side electrodes 32 and 34. The portion of the piezoelectric ceramics substrate 10 between the primary-side electrode 36 and the primary-side electrode 38 is polarized in the same direction as in that portion between the primary-side electrode 32 and the primary-side electrode 34, but an electric field is applied oppositely. Accordingly, when a voltage from the power source 200 is applied between the primary-side electrode 36 and the primary-side electrode 38, the portion of the piezoelectric ceramics substrate 10 between the primary-side electrode 36 and the primary-side electrode 38 vibrates so as to enhance resonance which is excited by applying a voltage from the power source 200 between the primary-side electrodes 32 and 34.

Likewise, the primary-side electrodes 42 and 44 also contribute to further enhancement of resonance. As a result, electrical energy fed from the power source 200 can be more efficiently converted to mechanical elastic energy at the primary side "a".

Furthermore, as a result of disposing the primary-side electrodes 42 and 44, a region of secondary side "b" is shortened in the longitudinal direction, and consequently the output impedance becomes smaller. As the output impedance of the piezoelectric transformer element 100 becomes smaller, voltage to be applied to the load 400 connected to the secondary-side electrode 72 of the piezoelectric transformer element 100 becomes greater accordingly.

Further, as a result of disposing the primary-side electrodes 42 and 44 as in the present embodiment, the distance between primary-side and secondary-side electrodes becomes shorter, and consequently when the portion of the piezoelectric ceramics substrate 10 between the secondary-side electrode 72 and the primary-side electrodes 42 and 44 is longitudinally polarized, an absolute voltage applied for the polarization becomes smaller as compared to that case not provided with the primary-side electrodes 42 and 44. As a result, a countermeasure to high voltages is easy to implement, and a power source outputting a lower voltage can be employed for polarization.

In the present embodiment, support points are located at vibrational nodes 212, 214 and 216 of the piezoelectric transformer element 100, thereby minimizing hindrance to vibration of the piezoelectric transformer element 100 which occurs by the support of the piezoelectric transformer element 100. Further, in the present embodiment, the connecting portions 132 and 134 to the primary-side electrodes 32 and 34, and electrode terminals provided at the connecting portions 132 and 134 are located at the vibrational node 212, the connecting portions 136 and 138 of the primary-side electrodes 36 and 38, and electrode terminals provided at the connecting portions 136 and 138 are located at the vibrational node 214, and the connecting portions 142 and 144 to the primary-side electrodes 42 and 44, and electrode terminals provided at the connecting portions 142 and 144 are located at the vibrational node 216, thereby preventing the electric connecting portions from hindering vibration.

The manufacturing method for the piezoelectric transformer element 100 according to the present embodiment is the same as that for the first embodiment.

Figure 7A:
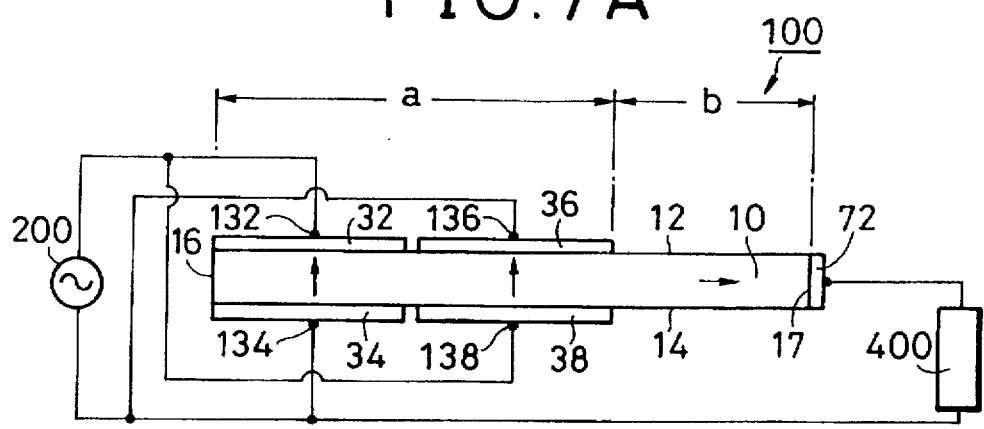

Seventh and eighth embodiments:

As shown in FIG. 7A, a seventh embodiment is different from the sixth embodiment in that the primary-side electrodes 42 and 44 of the sixth embodiment are not disposed to polarize the portion of a piezoelectric ceramics substrate 10 between a secondary-side electrode 72 and the near edges of primary-side electrodes 36 and 38 and in a longitudinal direction, i.e. in the extending direction of a top face 12 and a bottom face 14, but other features and the manufacturing method are the same.

Figure 7B:
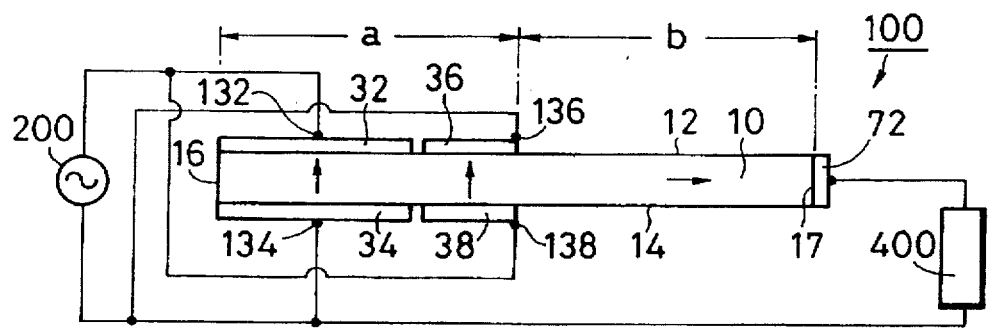
Figure 7C:
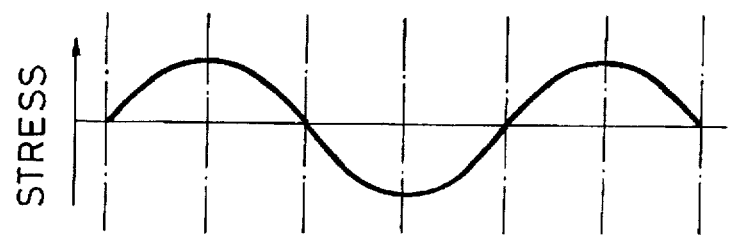
Figure 7D:
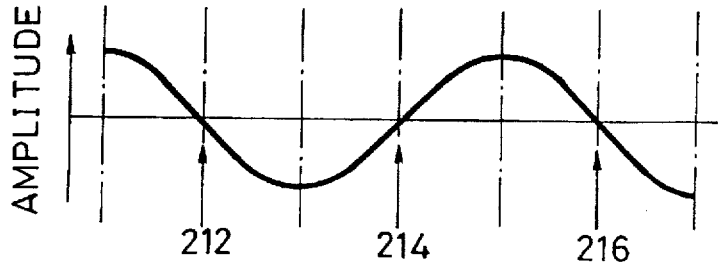

As shown in FIG. 7B, an eighth embodiment is different from the seventh embodiment in that the primary-side electrodes 36 and 38 are shortened to keep ends thereof on the side of the secondary-side electrode 72 further away from the secondary-side electrode 72, but other features and the manufacturing method are the same.

Figure 8:
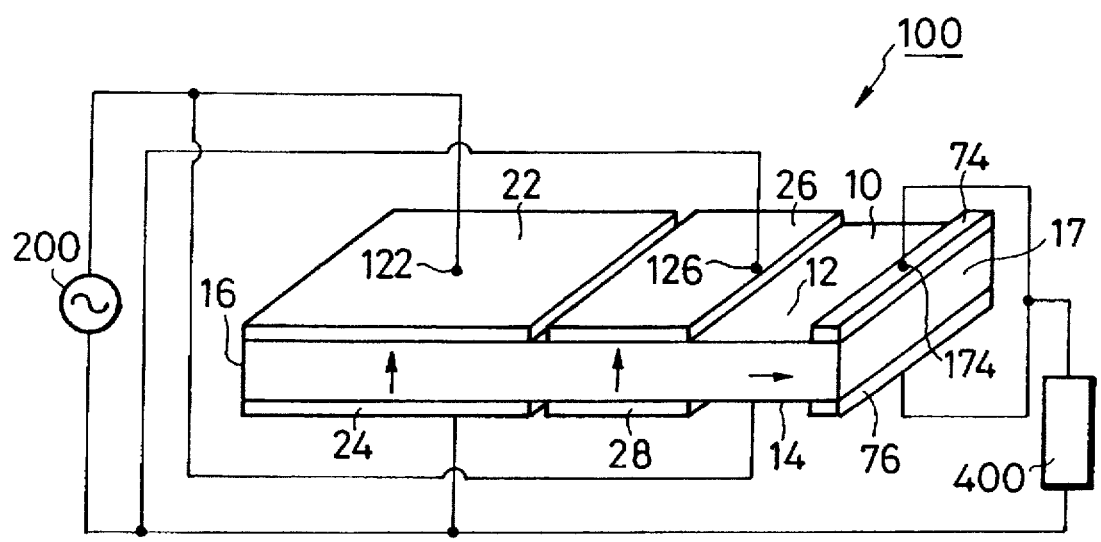
FIG. 8 is a perspective view showing a piezoelectric transformer element according to a ninth embodiment of the present invention.

Ninth and tenth embodiments:

FIG. 8 is a perspective view showing a piezoelectric transformer according to a ninth embodiment. The ninth embodiment is different from the first embodiment in which the secondary-side electrode 72 is disposed on the secondary-side end surface 17 of the piezoelectric ceramics substrate 10, in that a secondary-side electrode 74 is disposed on a top face 12 of a piezoelectric ceramics substrate 10, a secondary-side electrode 76 is disposed on a bottom face 41 of the piezoelectric ceramics substrate 10, and the secondary-side electrodes 74 and 76 are electrically connected to each other and are connected to one end of a load 400, but other features and the manufacturing method are the same.

Figure 9:
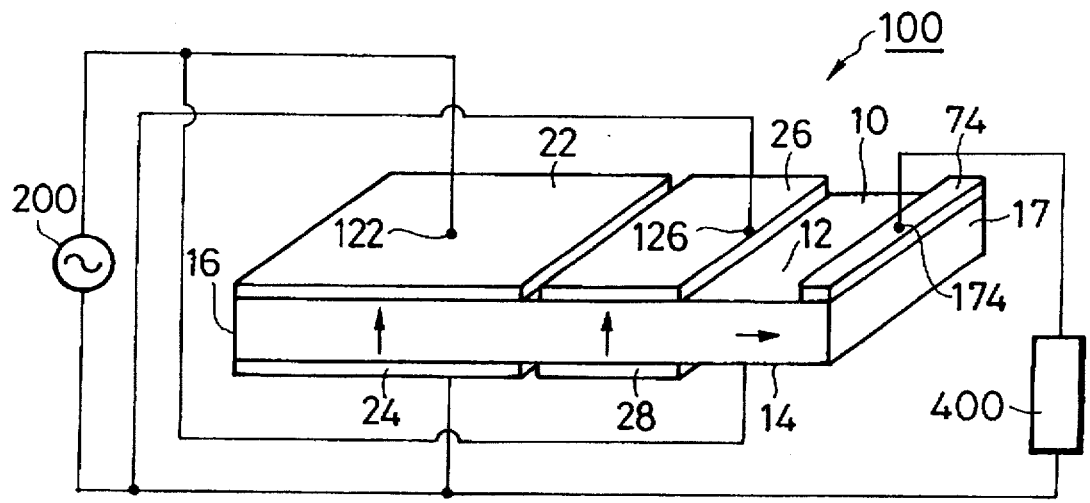
FIG. 9 is a perspective view showing a piezoelectric transformer element according to a tenth embodiment of the present invention.

FIG. 9 is a perspective view showing a piezoelectric transformer according to a tenth embodiment. The tenth embodiment is different from the first embodiment in which the secondary-side electrode 72 is disposed on the secondary-side end surface 17 of the piezoelectric ceramics substrate 10, in that a secondary-side electrode 74 is disposed on the top face 12 of a piezoelectric ceramics substrate 10 and connected to one end of a load 400, but other features and the manufacturing method are the same.

As a result of disposing the secondary-side electrode 74 on the top face 12 of the piezoelectric ceramics substrate 10, the primary-side electrodes 22 and 26 and the secondary-side electrode 74 can be formed in the same process, and as a result of disposing the secondary-side electrode 76 on the bottom face 14 of the piezoelectric ceramics substrate 10, the primary-side electrodes 24 and 28 and the secondary-side electrode 76 can be formed in the same process, whereby there is no need for preparing separate processes for the secondary-side electrodes 74 and 76.

Also, by adjusting the area of the secondary-side electrodes 74 and 76, the distance to the primary-side electrodes 26 and 28 can be adjusted; consequently, the output impedance of the piezoelectric transformer element 100 can be adjusted. On the other hand, the resonant frequency of the piezoelectric transformer element 100 is determined by the length of the piezoelectric ceramics substrate 10 in the longitudinal direction. Accordingly, by disposing the secondary-side electrodes 74 and 76 on at least either of the top 12 and the bottom face 14 as described above, the resonant frequency and the output impedance can be controlled independently of each other. The forming of the secondary-side electrodes 74 and 76 on both the top face 12 and the bottom face 14, respectively, of the piezoelectric ceramics substrate 10 as in the ninth embodiment allows easier polarization in the longitudinal direction.

Figure 10A:
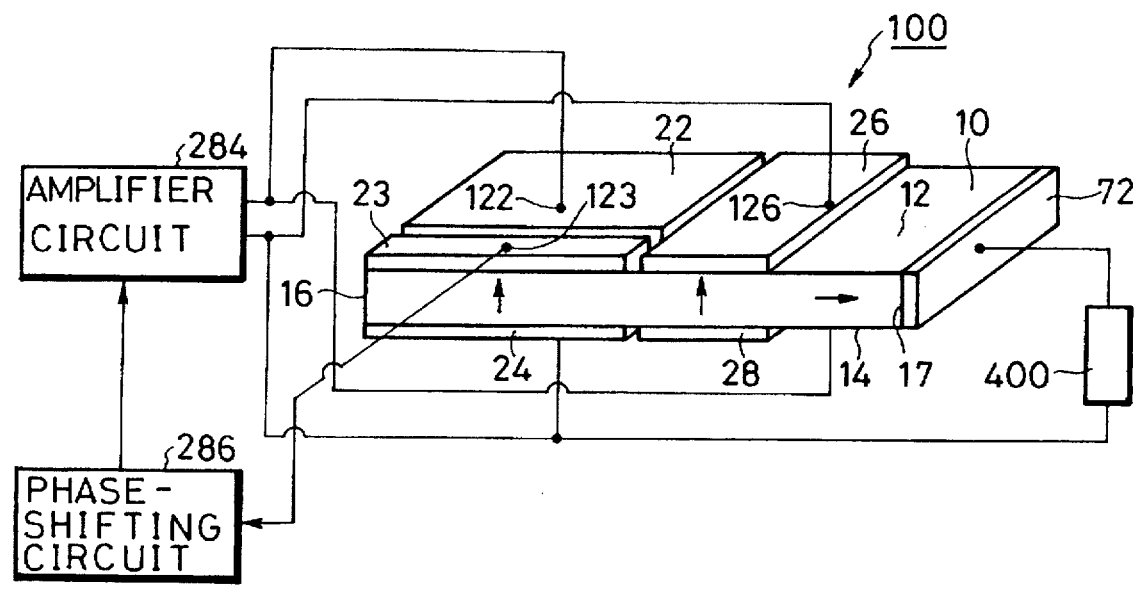
Figure 10B:
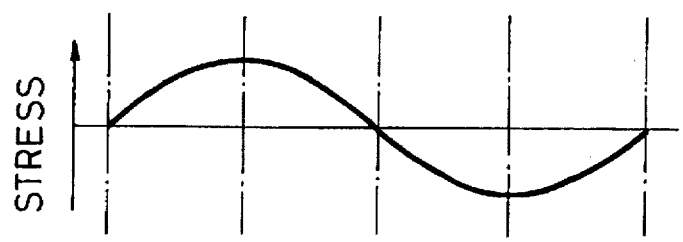
Figure 10C:
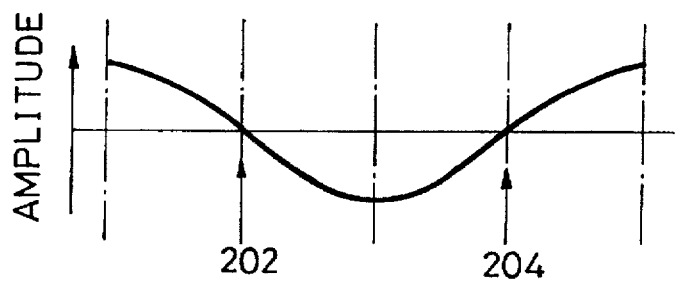

Eleventh embodiment:

As shown in FIGS. 10A to 10C, an eleventh embodiment is different from the first embodiment in that in a piezoelectric transformer element 100, part of a primary-side electrode 22 is electrically insulated from the primary-side electrode 22 to make a feedback electrode 23, but other features and the manufacturing method are the same.

As a result of electrically isolating part of the primary-side electrode 22 from the primary-side electrode 22 to make the feedback electrode 23, a fine signal can be taken out from the feed back electrode 23 to monitor the vibrating state of the piezoelectric transformer element 100, and the signal can be used for making a feedback to the piezoelectric transformer element 100, whereby the piezoelectric transformer element 100 can be vibrated by self-excitation.

The self-excited vibration can be preferably activated by connecting a phase-shifting circuit 286 and an amplifier circuit 284 to the feedback electrode 23 and applying an output from the amplifier circuit 284 to the primary-side electrodes 22 and 24. The phase-shifting circuit 286 is preferably a reactance circuit or the like.

Figure 11A:
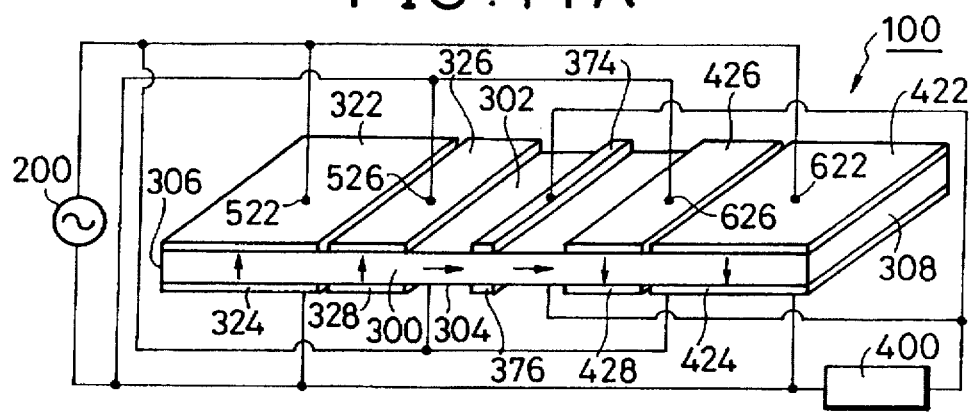
Figure 11B:
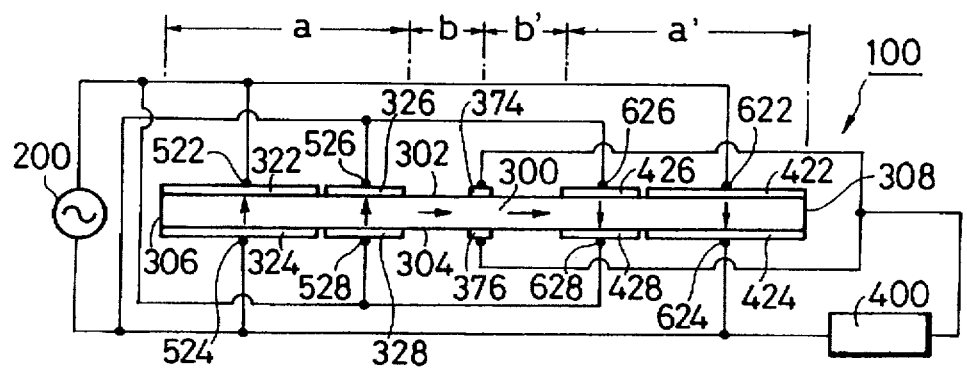

Twelfth embodiment:

As shown in FIGS. 11A and 11B, a primary-side electrode 322 is disposed on the top face 302 of a rectangular parallelepipedic piezoelectric ceramics substrate 300 to cover a left ¼ region, a primary-side electrode 324 is disposed on the bottom face 304 of the piezoelectric ceramics substrate 300 opposite to the primary-side electrode 322, and the portion of the piezoelectric ceramics substrate 300 between the primary-side electrode 322 and the primary-side electrode 324 is polarized in the thicknesswise direction between the top face 302 and the bottom face 304.

In addition, a primary-side electrode 326 is disposed on the top face 302 of the piezoelectric ceramics substrate 300 such that the primary-side electrode 326 extends in the longitudinal direction of the piezoelectric ceramics substrate 300 from a position located ¼ of the length of the piezoelectric ceramics substrate 300 as measured from a primary-side end surface 306 to a position located ⅜ of the length of the piezoelectric substrate 300 as measured from the primary-side end surface 306, and also a primary-side electrode 328 is disposed on the bottom face 304 of the piezoelectric ceramics substrate 300 opposite to the primary-side electrode 326. The primary-side electrode 326 is disposed in separation from the primary-side electrode 322, and the primary-side electrode 328 is disposed in separation from the primary-side electrode 324. The portion of the piezoelectric ceramics substrate 300 between the primary-side electrode 326 and the primary-side electrode 328 is polarized in the thicknesswise direction between the top face 302 and the bottom face 304.

A primary-side electrode 422 is disposed on the top face 302 of the piezoelectric ceramics substrate 300 to cover a right ¼ region, a primary-side electrode 424 is disposed on the bottom face 304 of the piezoelectric ceramics substrate 300 opposite to the primary-side electrode 422, and the portion of the piezoelectric ceramics substrate 300 between the primary-side electrode 422 and the primary-side electrode 424 is polarized in the thicknesswise direction between the top face 302 and the bottom face 304.

In addition, a primary-side electrode 426 is disposed on the top face 302 of the piezoelectric ceramics substrate 300 such that the primary-side electrode 300 extends in the longitudinal direction of the piezoelectric ceramics substrate 300 from a position located ¼ of the length of the piezoelectric ceramics substrate 300 as measured from a primary-side end surface 308 to a position located ⅜ of the length of the piezoelectric substrate 300 as measured from the primary-side end surface 308, and also a primary-side electrode 428 is disposed on the bottom face 304 of the piezoelectric ceramics substrate 300 opposite to the primary-side electrode 426. The primary-side electrode 426 is disposed in separation from the primary-side electrode 422, and the primary-side electrode 428 is disposed in separation from the primary-side electrode 424. The portion of the piezoelectric ceramics substrate 300 between the primary-side electrode 426 and the primary-side electrode 428 is polarized in the thicknesswise direction between the top face 302 and the bottom face 304.

The portion of the piezoelectric ceramics substrate 300 between the primary-side electrode 322 and the primary-side electrode 324 is polarized in the same direction as in the portion between the primary-side electrode 326 and the primary-side electrode 328, and the portion of the piezoelectric ceramics substrate 300 between the primary-side electrode 422 and the primary-side electrode 424 is polarized in the same direction as in the portion between the primary-side electrode 426 and the primary-side electrode 428; however, the portion of the piezoelectric ceramics substrate 300 between the primary-side electrode 322 and the primary-side electrode 324 is polarized in the opposite direction to the portion between the primary-side electrode 422 and the primary-side electrode 424, and the portion of the piezoelectric ceramics substrate 300 between the primary-side electrode 326 and the primary-side electrode 328 is polarized in the opposite direction to the portion between the primary-side electrode 426 and the primary-side electrode 428.

Further, a secondary-side electrode 374 is disposed on the top face 302 of the piezoelectric ceramics substrate 300 at the central portion of the piezoelectric ceramics substrate 300 in the longitudinal direction thereof, and a secondary-side electrode 376 is disposed on the bottom face 304 of the piezoelectric ceramics substrate 300 opposite to the secondary-side electrode 374. The portion of the piezoelectric ceramics substrate 300 between the primary-side electrodes 326 and 328 and the secondary-side electrodes 374 and 376 is polarized in the longitudinal direction, i.e. in the extending direction of the top face 302 and the bottom face 304. The portion of the piezoelectric ceramics substrate 300 between the primary-side electrodes 426 and 428 and the secondary-side electrodes 374 and 376 is polarized in the longitudinal direction, i.e. in the extending direction of the top face 302 and the bottom face 304. The portion of the piezoelectric ceramics substrate 300 between the primary-side electrodes 326 and 328 and the secondary-side electrodes 374 and 376 is polarized in the same direction as in the portion between the primary-side electrodes 426 and 428 and the secondary-side electrodes 374 and 376.

One end of a power source 200 is connected to the primary-side electrode 322 via a connecting portion 522, to the primary-side electrode 328 via a connecting portion 528, to the primary-side electrode 428 via a connecting portion 628, and to the primary-side electrode 422 via a connecting portion 622. The other end of the power source 200 is connected to the primary-side electrode 324 via a connecting portion 524, to the primary-side electrode 326 via a connecting portion 526, to the primary-side electrode 426 via a connecting portion 626, and to the primary-side electrode 424 via a connecting portion 624.

Figure 11C:
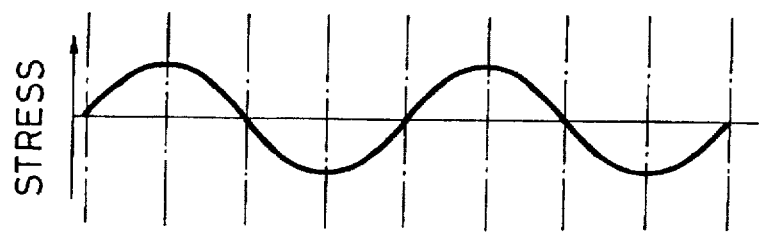
Figure 11D:
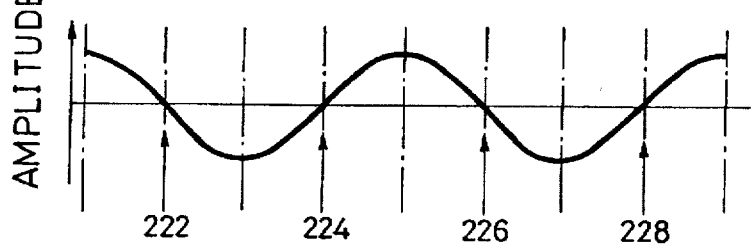

The secondary-side electrode 374 and the secondary-side electrode 376 are electrically connected, and connected to one end of a load 400. The other end of the load 400 is connected to the other end of the power source 200. The piezoelectric transformer element according to the present embodiment can be driven in two wavelengths as shown in FIGS. 11C and 11D.

In the present embodiment, the piezoelectric ceramics substrate 300 measuring 40 mm in length in the longitudinal direction×5 mm in width×1 mm in thickness was used. A piezoelectric transformer element 100 according to the present embodiment is shaped such that the piezoelectric transformer elements according to the first embodiment are symmetrically provided on both sides of the secondary-side electrodes 374 and 376, whereby the piezoelectric transformer element 100 can be fed with twice as much energy as the piezoelectric transformer element according to the first embodiment. Thus, the effect of further reducing an input voltage is produced. In the present embodiment, the secondary-side electrode 374 is disposed on the top face 302 of the piezoelectric ceramics substrate 300 at the central portion, and the secondary-side electrode 376 is disposed on the bottom surface 304 of the piezoelectric ceramics substrate 300 at the central portion opposite to the secondary-side electrode 374, while in the first embodiment, the secondary-side electrode 72 is disposed on the secondary-side end surface 17.

In the present embodiment, support points are located at vibrational nodes 222, 224, 226, and 228 of the piezoelectric transformer element 100, thereby minimizing hindrance to vibration of the piezoelectric transformer element 100 which occurs by the support of the piezoelectric transformer element 100.

The manufacturing method for the piezoelectric transformer element 100 according to the present embodiment is the same as for the first embodiment.

In the present embodiment, the direction of polarization may be inverted with the portions of the piezoelectric ceramics substrate 300 between the primary-side electrodes 326 and 328 and between the primary-side electrodes 426 and 428 to electrically connect all the primary-side electrodes on the same main face.

Figure 12A:
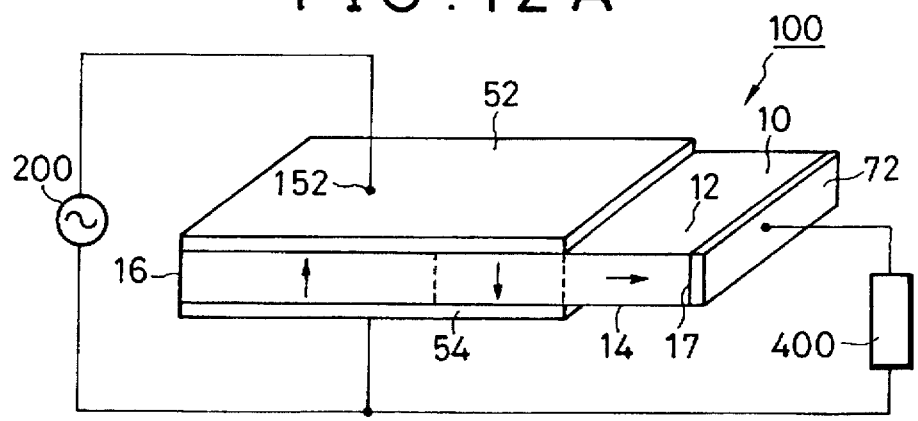
Figure 12B:
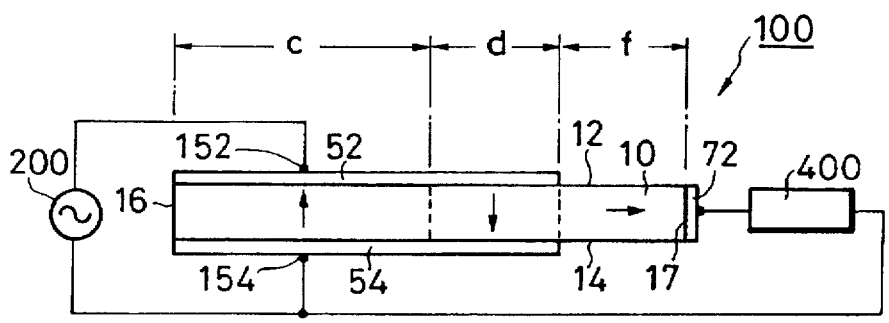

Thirteenth embodiment:

A piezoelectric transformer element 100 shown in FIGS. 12A and 12B is the same as the piezoelectric transformer according to the first embodiment except that the portion of the primary-side region exceeding a left half wavelength is polarized in the direction opposite to the direction of polarization in the left half wavelength region. As shown in FIGS. 12A and 12B, electrodes on the top face 12 can be formed into a single electrode 52 and electrodes on the bottom face 14 can be formed into a single electrode 54, after the polarization.

Figure 12C:
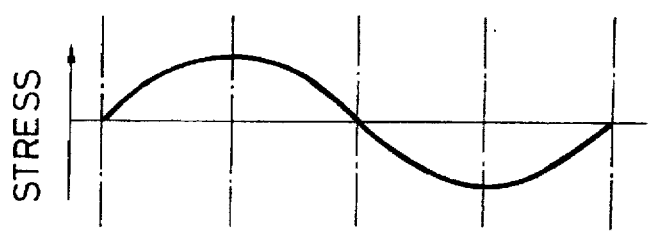
Figure 12D:
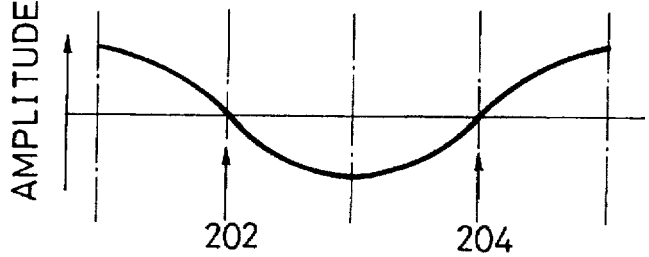

In the present embodiment, the piezoelectric transformer element 100 can be driven in the one wavelength mode as shown in FIGS. 12C and 12D.

The primary-side electrodes 52 and 54 are extended in the longitudinal direction to a position located ¾ of the length of a piezoelectric ceramics substrate 10 as measured from a primary-side end surface 16. Accordingly, the area of the electrode at primary side (c+d) becomes greater than that of a conventional piezoelectric transformer of FIG. 1, and the input impedance of the piezoelectric transformer element 100 becomes smaller accordingly. As a result, electrical energy from the power source 200 is more readily fed to the piezoelectric transformer element 100.

Also, stress in the region "c" acts toward the upper face 12 of the piezoelectric ceramics 10, while stress in the region "d" acts toward the lower face of the piezoelectric ceramics 10, i.e., acts in the direction opposite to the direction of the stress in the region "c". Although the direction of polarization in the region "c" is opposite to the direction of polarization in the region "d", the direction of application of electrical field is the same in both the regions. Accordingly, when a voltage from the power source 200 is applied between the primary-side electrodes 52 and 54, the portion of the piezoelectric ceramics substrate 10 in the region "d" vibrates so as to enhance resonance which is excited by applying a voltage from the power source 200 to the region "c". As a result, electrical energy fed from the power source 200 a can be more efficiently converted to mechanical elastic energy on the primary side (c+d).

Furthermore, as a result of disposing region "d", secondary-side region "f" is shortened in the longitudinal direction, and consequently the output impedance becomes smaller. As the output impedance of the piezoelectric transformer element 100 becomes smaller, voltage to be applied to a CFL 400 connected to the secondary-side electrode 72 of the piezoelectric transformer element 100 becomes greater accordingly.

Figure 13:
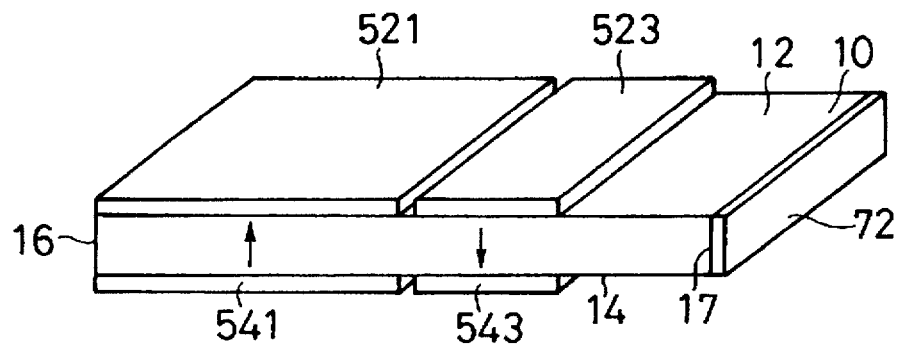
FIG. 13 is a perspective view for explaining a manufacturing method for the piezoelectric transformer element according to the thirteenth embodiment.

A piezoelectric ceramics substrate having the same size as that in the first embodiment was prepared in the same method as in the first embodiment. As shown in FIG. 13, polarizing electrodes 521 and 523 were formed on the top face 12 of the piezoelectric ceramics substrate 10, polarizing electrodes 541 and 543 were formed on a bottom face 14, and the secondary-side electrode 72 was formed on a secondary-side end surface 17.

Subsequently, the polarizing electrodes 541 and 523 were connected to the positive terminal of a polarizing power source, the polarizing electrodes 521 and 543 were connected to the negative terminal of the polarizing power source, and a voltage of 2 kV was applied to the piezoelectric ceramics substrate 10 in silicone oil having a temperature of 100° C. to polarize the region "c" and the region "d" in the thicknesswise direction thereof. Then, the polarizing electrode 521 and the polarizing electrode 523 were connected using a conductor to make the primary-side electrode 52, and the polarizing electrode 541 and the polarizing electrode 543 were connected using a conductor to make the primary-side electrode 54. Then, the primary-side electrode 52 and the primary-side electrode 54 were connected to the positive terminal of the polarizing power source, the secondary-side electrode 72 were connected to the negative terminal of the polarizing power source, and a voltage of 10 kV was applied to the piezoelectric ceramics substrate 10 in silicone oil having a temperature of 100° C. to polarize the region "f" in the longitudinal direction thereof.

One end of the power source 200 was connected to the primary-side electrode 52 via the connecting portion 152, and the other end of the power source 200 was connected to the primary-side electrode 54 via the connecting portion 154. The secondary-side electrode 72 was connected to one end of a CFL used as a load 400, and the other end the CFL 400 was connected to the other end of the power source 200. The CFL 400 used was a CFL measuring 225 mm in length×2.6 mm in diameter for use with an A4-sized notebook type personal computer.

Figure 14:
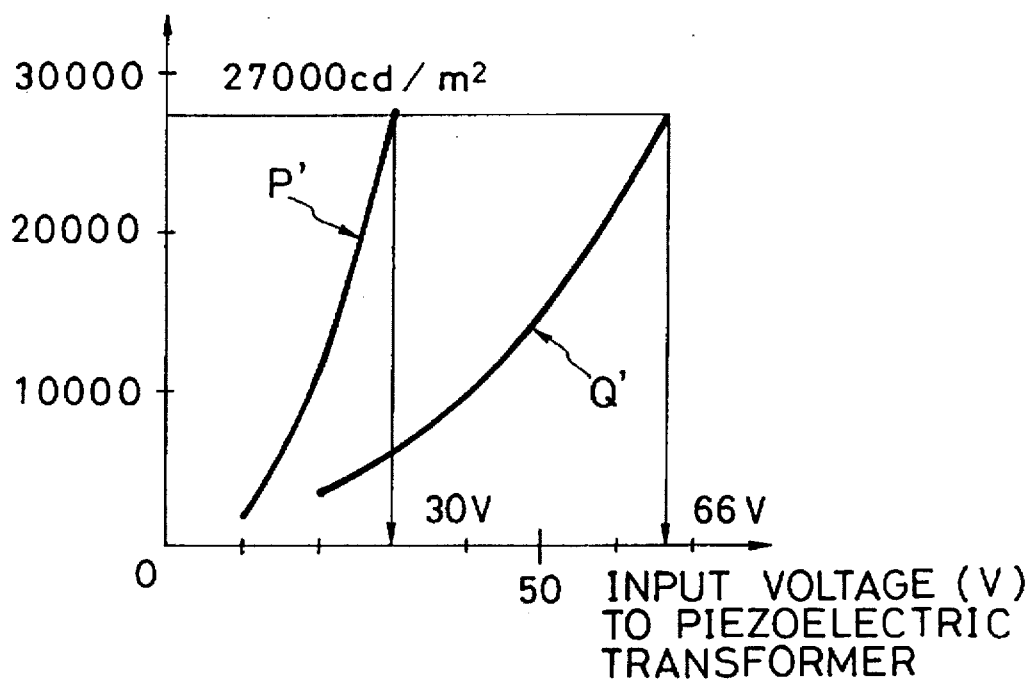
FIG. 14 is a graph showing the relationship between an input voltage supplied to the piezoelectric transformer element according to the thirteenth embodiment and luminance of a cold cathode fluorescent lamp.
Figure 15A:
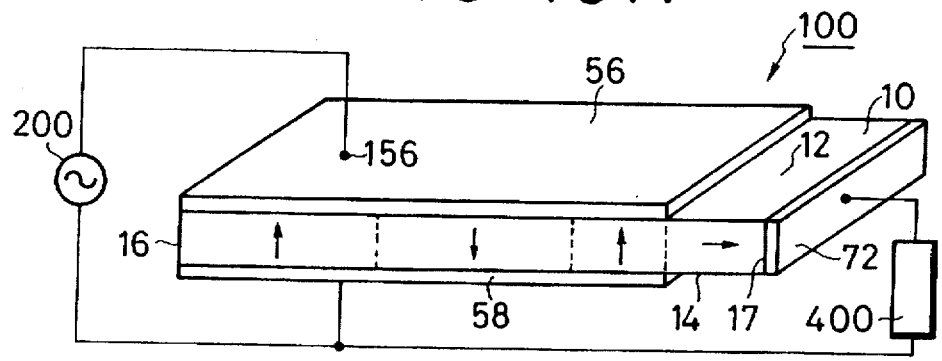
Figure 15B:
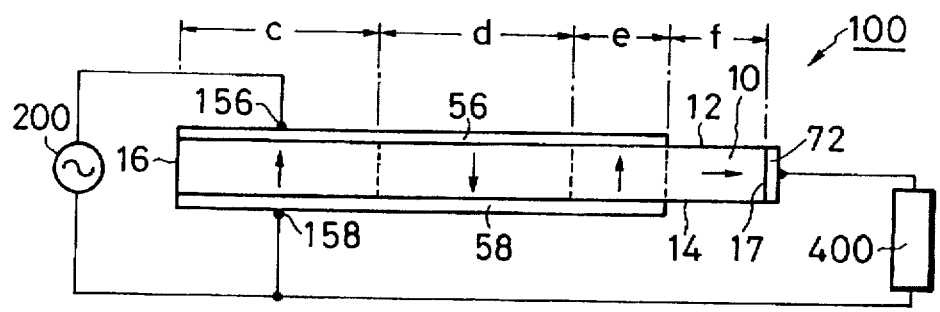
Figure 15C:
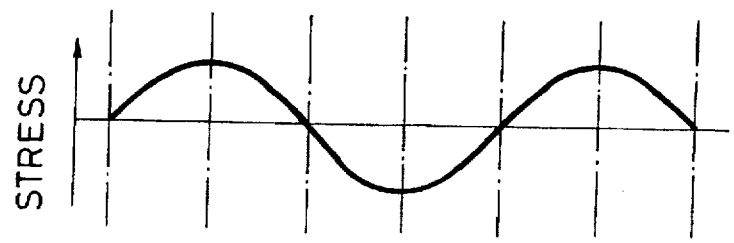
Figure 15D:
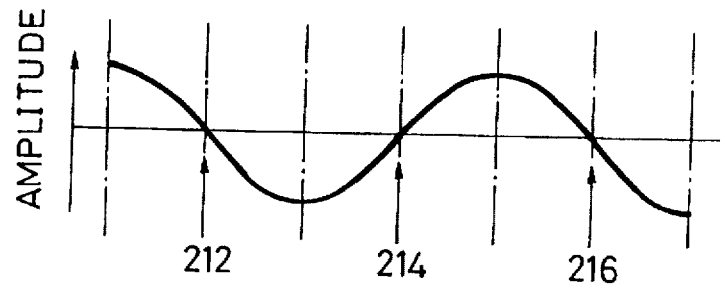

With the piezoelectric transformer element 100 being supported at vibrational nodes 202 and 204, a voltage having a frequency of 160 kHz was applied from the power source 200 to the piezoelectric transformer element 100 to measure the relationship between the input voltage to the piezoelectric transformer element 100 and the luminance of the CFL. These measurements are shown in FIG. 14 (curve P'). In FIG. 14, for comparison, measurements are also shown for the piezoelectric transformer element 100 of FIG. 2 which is not provided with the primary-side electrodes 26 and 28 and in which the portion of the piezoelectric ceramics substrate 10 between the secondary-side electrode 72 and the primary-side electrodes 22 and 24 is longitudinally polarized (curve Q'). A piezoelectric transformer element 100 which corresponds to the piezoelectric transformer element 100 shown in FIG. 2 but which is not provided with the primary-side electrodes 26 and 28 required an input voltage of 66 $V_{rms}$ to obtain a luminance of 27,000 cd/m² in the CFL 400, while the present embodiment required an input voltage of 30 $V_{rms}$ to obtain the same luminance.

Lighting of the CFL 400 was able to be initiated at an input voltage of approximately 15 $V_{rms}$.

In the present embodiment, the region "d" shown in FIG. 12B may be longer or shorter than a quarter wavelength according to applications of the piezoelectric transformer.

When the region "d" is longer than a quarter wavelength, ends of the primary-side electrodes 52 and 54 on the side of the secondary-side electrode 72 become closer to the secondary-side electrode 72 than in the present embodiment, the region of the secondary side "f" is longitudinally shortened; consequently, the output impedance becomes much smaller. As a result, a larger voltage can be applied to the CFL 400 which is connected to the piezoelectric transformer element 100 at the secondary side "f", whereby the effective voltage step-up ratio of the piezoelectric transformer element 100 can be increased.

When the region "d" is shorter than a quarter wavelength, ends of the primary-side electrodes 52 and 54 on the side of the secondary-side electrode 72 become more distant from the secondary-side electrode 72 than in the present embodiment; consequently, a larger voltage can be built up on the secondary side, whereby the voltage step-up ratio of the piezoelectric transformer element 100 can be further increased.

Fourteenth embodiment:

FIGS. 15A–15D show a fourteenth embodiment. A piezoelectric transformer element according to the fourteenth embodiment is similar to the sixth embodiment, but every two neighboring regions of the three regions on the primary side are polarized in opposite directions. This piezoelectric transformer element 100 can be driven in the 1.5 wavelength mode as in the sixth embodiment. The present embodiment provides all effects provided in the sixth embodiment. Further, since the primary-side electrodes can be externally connected using a pair of wires, a connection can be established only at a node.

The manufacturing method for the piezoelectric transformer element 100 according to the present invention is the same as that for the thirteenth embodiment.

Figure 16A:
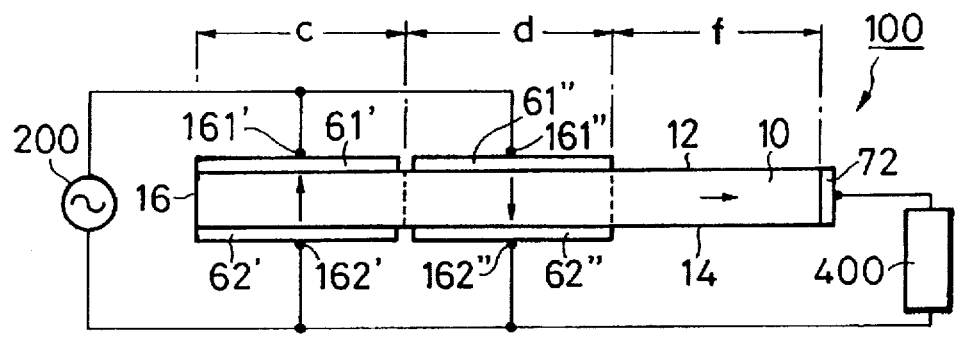

Fifteenth and sixteenth embodiments:

As shown in FIG. 16A, a fifteenth embodiment is different from the fourteenth embodiment in that the region "e" is not provided, but other features and the manufacturing method are the same.

Figure 16B:
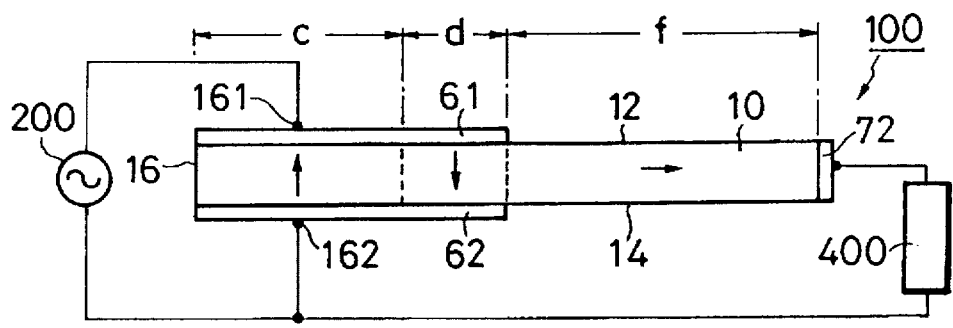
Figure 16C:
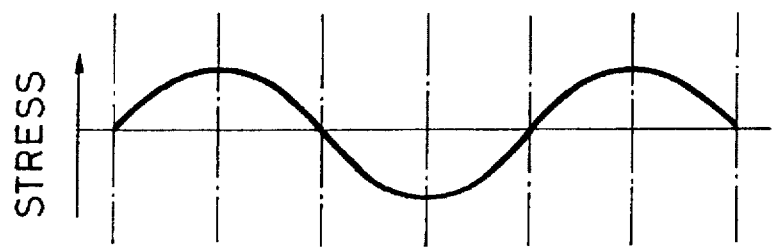
Figure 16D:
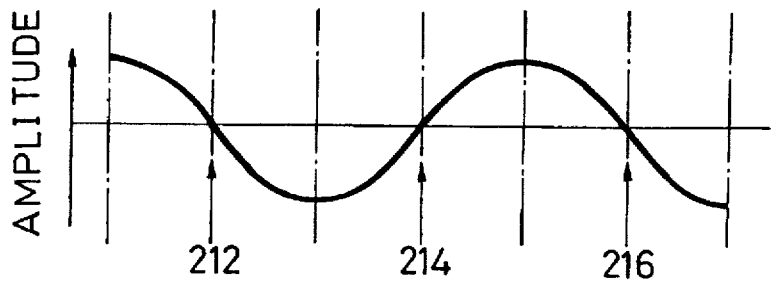

As shown in FIG. 16B, a sixteenth embodiment is different from the fifteenth embodiment in that ends of the region "d" on the side of the secondary-side electrode 72 are rendered more distant from the secondary-side electrode 72, but other features and the manufacturing method are the same. As a result of assuming the structure, a greater secondary-side output can be generated.

After the polarization, separate electrodes may be connected using conductive paste or connected at node points to lead wires as shown in FIG. 16A.

Figure 17A:
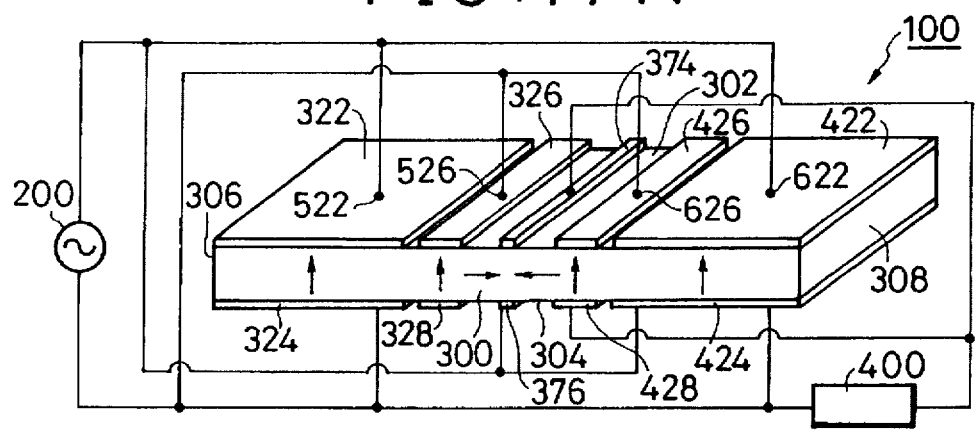
Figure 17B:
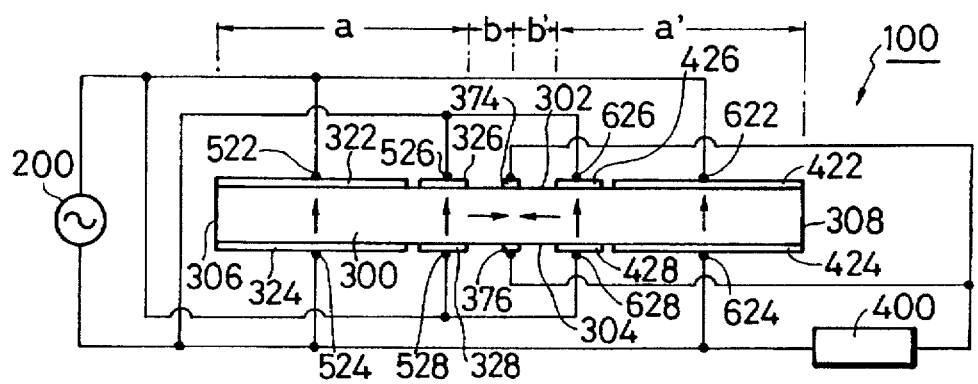

Seventeenth embodiment:

As shown in FIGS. 17A and 17B, a primary-side electrode 322 is disposed on the top face 302 of a rectangular parallelepipedic piezoelectric ceramics substrate 300 to cover a left ⅓ region, a primary-side electrode 324 is disposed on the bottom face 304 of the piezoelectric ceramics substrate 300 opposite to the primary-side electrode 322, and the portion of the piezoelectric ceramics substrate 300 between the primary-side electrode 322 and the primary-side electrode 324 is polarized in the thicknesswise direction between the top face 302 and the bottom face 304.

In addition, a primary-side electrode 326 is disposed on the top face 302 of the piezoelectric ceramics substrate 300 such that the primary-side electrode 326 extends in the longitudinal direction of the piezoelectric ceramics substrate 300 from a position located ⅓ of the length of the piezoelectric ceramics substrate 300 as measured from a primary-side end surface 306 to a position located 5/12 of the length of the piezoelectric substrate 300 as measured from the primary-side end surface 306, and also a primary-side electrode 328 is disposed on the bottom face 304 of the piezoelectric ceramics substrate 300 opposite to the primary-side electrode 326. The primary-side electrode 326 is disposed in separation from the primary-side electrode 322, and the primary-side electrode 328 is disposed in separation from the primary-side electrode 324. The portion of the piezoelectric ceramics substrate 300 between the primary-side electrode 326 and the primary-side electrode 328 is polarized in the thicknesswise direction thereof.

A primary-side electrode 422 is disposed on the top face 302 of the piezoelectric ceramics substrate 300 to cover a right ⅓ region, a primary-side electrode 424 is disposed on the bottom face 304 of the piezoelectric ceramics substrate 300 opposite to the primary-side electrode 422, and the portion of the piezoelectric ceramics substrate 300 between the primary-side electrode 422 and the primary-side electrode 424 is polarized in the thicknesswise direction thereof.

In addition, a primary-side electrode 426 is disposed on the top face 302 of the piezoelectric ceramics substrate 300 such that the primary-side electrode 426 extends in the longitudinal direction of the piezoelectric ceramics substrate 300 from a position located ⅓ of the length of the piezoelectric ceramics substrate 300 as measured from a primary-side end surface 308 to a position located 5/12 of the length of the piezoelectric substrate 300 as measured from the primary-side end surface 308, and also a primary-side electrode 428 is disposed on the bottom face 304 of the piezoelectric ceramics substrate 300 opposite to the primary-side electrode 426. The primary-side electrode 426 is disposed in separation from the primary-side electrode 422, and the primary-side electrode 428 is disposed in separation from the primary-side electrode 424. The portion of the piezoelectric ceramics substrate 300 between the primary-side electrode 426 and the primary-side electrode 428 is polarized in the thicknesswise direction between the top face 302 and the bottom face 304.

The portion of the piezoelectric ceramics substrate 300 between the primary-side electrode 322 and the primary-side electrode 324, the portion of the piezoelectric ceramics substrate 300 between the primary-side electrode 326 and the primary-side electrode 328, the portion of the piezoelectric ceramics substrate 300 between the primary-side electrode 422 and the primary-side electrode 424, the portion of the piezoelectric ceramics substrate 300 between the primary-side electrode 426 and the primary-side electrode 428 are all polarized in the same direction.

Further, a secondary-side electrode 374 is disposed on the top face 302 of the piezoelectric ceramics substrate 300 at the central portion of the piezoelectric ceramics substrate 300 in the longitudinal direction thereof, and a secondary-side electrode 376 is disposed on the bottom face 304 of the piezoelectric ceramics substrate 300 opposite to the secondary-side electrode 374. The portion of the piezoelectric ceramics substrate 300 between the primary-side electrodes 326 and 328 and the secondary-side electrodes 374 and 376 is polarized in the longitudinal direction, i.e. in the extending direction of the top face 302 and the bottom face 304. The portion of the piezoelectric ceramics substrate 300 between the primary-side electrodes 426 and 428 and the secondary-side electrodes 374 and 376 is polarized in the longitudinal direction. The portion of the piezoelectric ceramics substrate 300 between the primary-side electrodes 326 and 328 and the secondary-side electrodes 374 and 376 is polarized in the opposite direction to the portion of the piezoelectric ceramics substrate 300 between the primary-side electrodes 426 and 428 and the secondary-side electrodes 374 and 376.

One end of a power source 200 is connected to the primary-side electrode 322 via a connecting portion 522, to the primary-side electrode 328 via a connecting portion 528, to the primary-side electrode 428 via a connecting portion 628, and to the primary-side electrode 422 via a connecting portion 622. The other end of the power source 200 is connected to the primary-side electrode 324 via a connecting portion 524, to the primary-side electrode 326 via a connecting portion 526, to the primary-side electrode 426 via a connecting portion 626, and to the primary-side electrode 424 via a connecting portion 624.

The secondary-side electrode 374 and the secondary-side electrode 376 are electrically connected, and connected to one end of a load 400. The other end of the load 400 is connected to the other end of the power source 200.

Figure 17C:
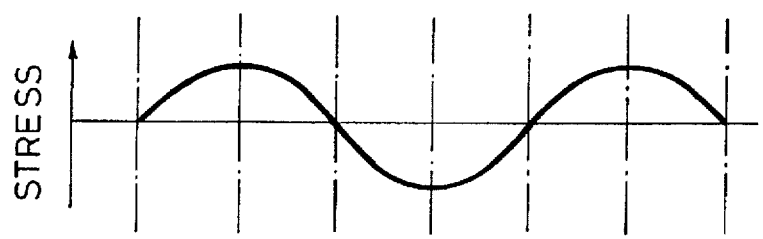
Figure 17D:
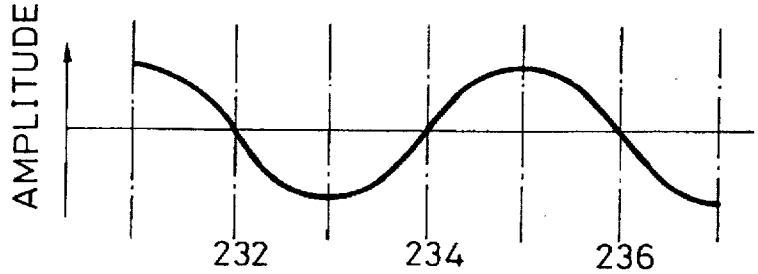

In the present embodiment, the piezoelectric ceramics substrate 300 can be driven in such a resonance mode that 1.5 wavelength of stress distribution exists between the primary-side end surface 306 and the primary-side end surface 308. A voltage having a frequency equal to a resonant frequency of the 1.5 wavelength type resonance mode is applied from the power source 200. Since both ends 306 and 308 of the piezoelectric ceramics substrate 300 are open, at both longitudinal ends of the piezoelectric ceramics substrate 300, stress is zero and amplitude is maximized. Also, since the piezoelectric ceramics substrate 300 is resonated in the 1.5 wavelength mode in the present embodiment, stress and amplitude distributions are as shown in FIGS. 17C and 17D, respectively.

The region covered with the primary-side electrodes 322 and 324 is identical in stress, the direction of polarization, and the direction of electric field to the region covered with the primary-side electrodes 422 and 424, so that vibration which is excited by applying a voltage from the power source 200 between the primary-side electrodes 322 and 324 and vibration which is excited by applying a voltage from the power source 200 between the primary-side electrodes 422 and 424 enhance mutually.

Stress within the region covered with the primary-side electrodes 326 and 328 is directed oppositely to stress within the region covered with the primary-side electrodes 322 and 324 and within the region covered with the primary-side electrodes 422 and 424. The region covered with the primary-side electrodes 326 and 328 is polarized in the same direction as in the region covered with the primary-side electrodes 322 and 324 and in the region covered with the primary-side electrodes 422 and 424; however, the region covered with the primary-side electrodes 326 and 328 is opposite in the direction of applying an electric field, to the region covered with the primary-side electrodes 322 and 324 and to the region covered with the primary-side electrodes 422 and 424. Accordingly, when a voltage from the power source 200 is applied between the primary-side electrodes 326 and 328, the portion of the piezoelectric ceramics substrate 300 between the primary-side electrodes 326 and 328 vibrates so as to enhance vibration which is excited by applying a voltage from the power source 200 between the primary-side electrodes 322 and 324 and vibration which is excited by applying a voltage from the power source 200 between the primary-side electrodes 422 and 424.

Stress within the region covered with the primary-side electrodes 426 and 428 is directed oppositely to stress within the region covered with the primary-side electrodes 322 and 324 and within the region covered with the primary-side electrodes 422 and 424. The region covered with the primary-side electrodes 426 and 428 is polarized in the same direction as in the region covered with the primary-side electrodes 322 and 324 and in the region covered with the primary-side electrodes 422 and 424; however, the region covered with the primary-side electrodes 426 and 428 is opposite in the direction of applying an electric field, to the region covered with the primary-side electrodes 322 and 324 and to the region covered with the primary-side electrodes 422 and 424. Accordingly, when a voltage from the power source 200 is applied between the primary-side electrodes 426 and 428, the portion of the piezoelectric ceramics substrate 300 between the primary-side electrodes 426 and 428 vibrates so as to enhance vibration which is excited by applying a voltage from the power source 200 between the primary-side electrodes 322 and 324 and vibration which is excited by applying a voltage from the power source 200 between the primary-side electrodes 422 and 424.

Accordingly, electrical energy fed from the power source 200 to the primary sides "a" and "a'" can be more efficiently converted to mechanical elastic energy.

In the present embodiment, because of disposing the primary-side electrodes 326, 328, 426, and 428 in addition to the primary-side electrodes 322, 324, 422, and 424, the area of electrodes at the primary sides "a" and "a'" becomes greater, and the input impedance of the piezoelectric transformer element 100 becomes smaller accordingly. As a result, electrical energy from the power source 200 is more readily fed to the piezoelectric transformer element 100.

Further, as a result of disposing the primary-side electrodes 326 and 328, a region of secondary side "b" is shortened in the longitudinal direction, and as a result of disposing the primary-side electrodes 426 and 428, a region of secondary side "b'" is shortened in the longitudinal direction. As a result, the output impedance of the piezoelectric transformer element 100 becomes smaller. As the output impedance of the piezoelectric transformer element 100 becomes smaller, voltage to be applied to the load 400 connected to the secondary-side electrodes 374 and 376 of the piezoelectric transformer element 100 becomes greater accordingly.

Also, as a result of disposing the primary-side electrodes 326, 328, 426, and 428 as in the present embodiment, the distance between primary-side and secondary-side electrodes becomes shorter, and consequently when the portion of the piezoelectric ceramics substrate 300 between the primary-side electrodes 326 and 328 and the secondary-side electrodes 374 and 376 is polarized in the longitudinal direction and when the portion of the piezoelectric ceramics substrate 300 between the primary-side electrodes 426 and 428 and the secondary-side electrodes 374 and 376 is polarized in the longitudinal direction, an absolute voltage applied for the polarization becomes smaller as compared to that case not provided with the primary-side electrodes 326, 328, 426, and 428. As a result, a countermeasure to high voltages is easy to implement, and a power source outputting a lower voltage can be employed for polarization.

In the present embodiment, support points are located at vibrational nodes 232, 234, and 236 of the piezoelectric transformer element 100, thereby minimizing hindrance to vibration of the piezoelectric transformer element 100 which occurs by the support of the piezoelectric transformer element 100.

The manufacturing method for the piezoelectric transformer element 100 according to the present invention is the same as that for the first embodiment.

The direction of polarization may be inverted with the portions of the piezoelectric ceramics substrate 300 between the primary-side electrodes 326 and 328 and between the primary-side electrodes 426 and 428, and the connecting portions 526 and 626 may be connecting to the line for the connecting portions 522 and 622 and the connecting portions 528 and 628 may be connected to the line for the connecting portions 524 and 624.

Figure 18:
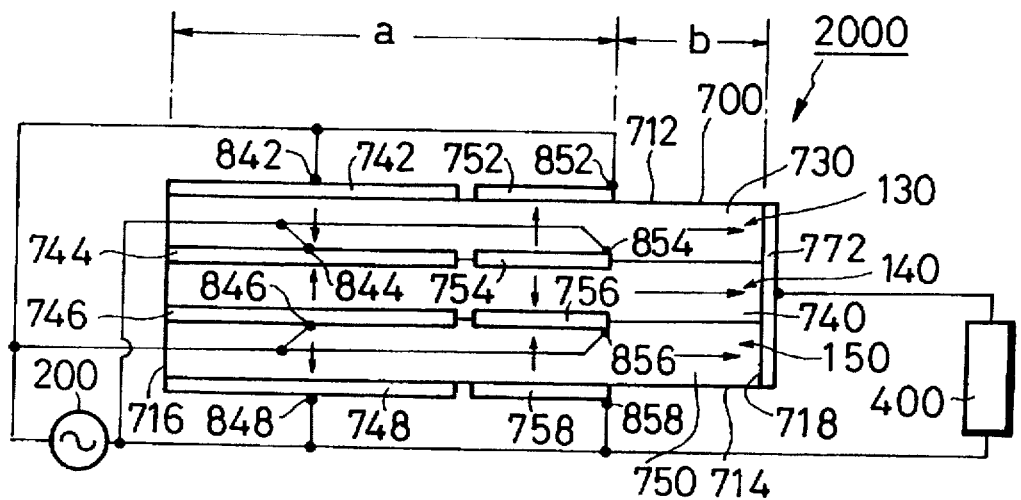
Figure 18:
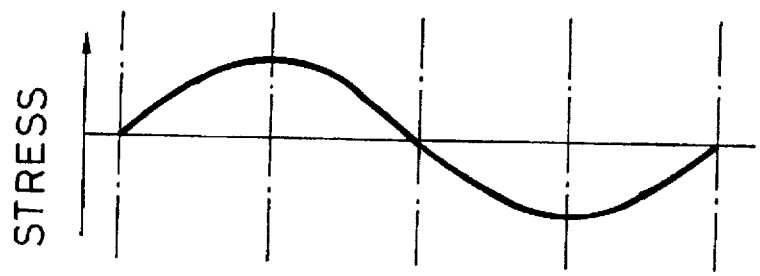
Figure 18:
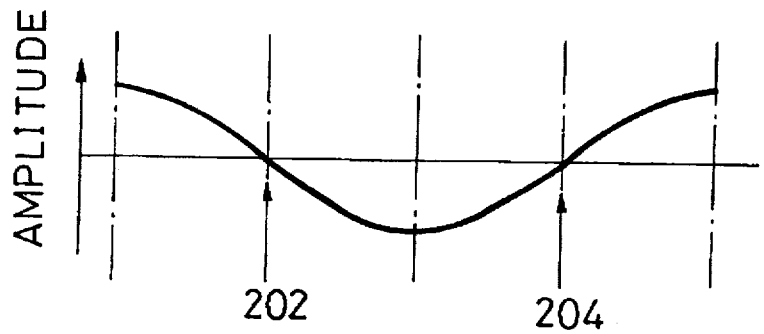

Eighteenth embodiment:

As shown in FIG. 18A, rectangular parallelepipedic piezoelectric ceramics substrates 730, 740, and 750 having the same size are integrally layered to make a laminated piezoelectric ceramics substrate 700.

A primary-side electrode 742 is disposed on the top face 712 of the laminated piezoelectric ceramics substrate 700 to cover the left (primary) half thereof, a primary-side electrode 744 is disposed in parallel with and opposite to the primary-side electrode 742 at a distance of ⅓ of the thickness of the laminated piezoelectric ceramics substrate 700 from the top face 712, i.e. at the boundary between the piezoelectric ceramics substrate 730 and the piezoelectric ceramics substrate 740, a primary-side electrode 746 is disposed in parallel with and opposite to the primary-side electrode 742 at a distance of ⅔ of the thickness of the laminated piezoelectric ceramics substrate 700 from the top face 712, i.e. at the boundary between the piezoelectric ceramics substrate 740 and the piezoelectric ceramics substrate 750, and a primary-side electrode 748 is disposed on the bottom face 714 of the laminated piezoelectric ceramics substrate 700 in parallel with and opposite to the primary-side electrode 742.

A primary-side electrode 752 is disposed on the top face 712 of the laminated piezoelectric ceramics substrate 700 such that the primary-side electrode 752 extends in the longitudinal direction of the laminated piezoelectric ceramics substrate 700 from a position located half the length of the laminated piezoelectric ceramics substrate 700 as measured from a primary-side end surface 716 to a position located ¾ of the length of the laminated piezoelectric ceramics substrate 700 as measured from the primary-side end surface 716, a primary-side electrode 754 is disposed in parallel with and opposite to the primary-side electrode 752 at a distance of ⅓ of the thickness of the laminated piezoelectric ceramics substrate 700 from the top face 712, i.e. at the boundary between the piezoelectric ceramics substrate 730 and the piezoelectric ceramics substrate 740, a primary-side electrode 756 is disposed in parallel with and opposite to the primary-side electrode 752 at a distance of ⅔ of the thickness of the laminated piezoelectric ceramics substrate 700 from the top face 712, i.e. at the boundary between the piezoelectric ceramics substrate 740 and the piezoelectric ceramics substrate 750, and a primary-side electrode 758 is disposed on the bottom face 714 of the laminated piezoelectric ceramics substrate 700 in parallel with and opposite to the primary-side electrode 752. The primary-side electrode 752 is disposed in separation from the primary-side electrode 742, the primary-side electrode 754 is disposed in separation from the primary-side electrode 744, the primary-side electrode 756 is disposed in separation from the primary-side electrode 746, the primary-side electrode 758 is disposed in separation from the primary-side electrode 748.

The primary-side electrodes 742, 744, 746, 748, 752, 754, 756, and 758 are disposed such that they extend in the direction of width of the laminated piezoelectric ceramics substrate 700 from one end surface of the laminated piezoelectric ceramics substrate 700 to the other end surface.

The portions of the laminated piezoelectric ceramics substrate 700 between the primary-side electrode 742 and the primary-side electrode 744, between the primary-side electrode 744 and the primary-side electrode 746, between the primary-side electrode 746 and the primary-side electrode 748, between the primary-side electrode 752 and the primary-side electrode 754, between the primary-side electrode 754 and the primary-side electrode 756, and between the primary-side electrode 756 and the primary-side electrode 758 are polarized in the thicknesswise direction thereof. The portion between the primary-side electrode 742 and the primary-side electrode 744 is polarized in the opposite direction to that portion between the primary-side electrode 744 and the primary-side electrode 746, in the same direction as in that portion between the primary-side electrode 746 and the primary-side electrode 748, in the opposite direction to that portion between the primary-side electrode 752 and the primary-side electrode 754, in the same direction as in that portion between the primary-side electrode 754 and the primary-side electrode 756, and in the opposite direction to that portion between the primary-side electrode 756 and the primary-side electrode 758.

A secondary-side electrode 772 is disposed on a secondary-side end surface 718 perpendicular to both the top face 712 and the bottom face 714, and the portion of the laminated piezoelectric ceramics substrate 700 between the secondary-side electrode 772 and the primary-side electrodes 752, 754, 756, and 758 is longitudinally polarized.

One end of a power source 200 is connected to the primary-side electrode 742 via a connecting portion 842, to the primary-side electrode 752 via a connecting portion 852, to the primary-side electrode 746 via a connecting portion 846, and to the primary-side electrode 756 via a connecting portion 856. The other end of the power source 200 is connected to the primary-side electrode 744 via a connecting portion 844, to the primary-side electrode 754 via a connecting portion 854, to the primary-side electrode 748 via a connecting portion 848, and to the primary-side electrode 758 via a connecting portion 858. The secondary-side electrode 772 is connected to a load 400 at one end thereof, and the other end of the load 400 is connected to the other end of the power source 200. The connecting portions 842, 844, 846, and 848 are located at a vibrational node 202, and the connecting portions 852, 854, 856, and 858 are located at a vibrational node 204.

In the laminated piezoelectric transformer element 2000 according to the present invention, single-layer piezoelectric transformer elements 130 and 140 are layered back to back, single-layer piezoelectric transformer elements 140 and 150 are layered back to back, and corresponding primary-side electrodes are connected in parallel to each other.

The laminated piezoelectric transformer element 2000 according to the present embodiment can be driven in such a resonance mode that one wavelength of stress distribution exists between the primary-side end surface 716 and the secondary-side end surface 718. A voltage having a frequency equal to a resonant frequency of the one wavelength type resonance mode is applied from the power source 200.

In the present embodiment, support points are located a quarter wavelength to the right of the primary-side end surface 716 and a quarter wavelength to the left of the secondary-side end surface 718. Since the primary-side and secondary-side end surfaces 716 and 718 of the laminated piezoelectric ceramics substrate 700 are open, at both longitudinal ends of the laminated piezoelectric ceramics substrate 700, stress is zero and amplitude is maximized. Also, since the laminated piezoelectric transformer element 2000 is resonated in the one wavelength mode in the present embodiment, stress and amplitude distributions are as shown in FIGS. 18B and 18C, respectively.

The single-layer transformer elements 130, 140, and 150 show similar functions and effects to those of the piezoelectric transformer element 100 according to the thirteenth embodiment, and consequently the laminated piezoelectric transformer element 2000 have similar functions and effects to those of the piezoelectric transformer element 100 according to the thirteenth embodiment.

In addition, in the laminated piezoelectric transformer element 2000 according to the present embodiment, an input current flows three times than in the single-layer piezoelectric transformer elements 130, 140, and 150, so that at a fixed input power, an input voltage becomes one-third, thereby reducing an input voltage. Also, since an input current can flow three times as much, at a fixed input voltage, an input power can be increased three times as much for high-power drive. On the other hand, when single-layer piezoelectric transformer elements 130, 140, and 150 are used, an in crease in power causes energy density to exceed a threshold determined by material with a resultant increase in loss, causing deterioration in efficiency. By employing the above-mentioned laminated structure to avoid the problem, energy density within piezoelectric ceramics can be reduced, thereby increasing a total input power level.

By uniting a plurality of the piezoelectric transformer elements 130, 140, and 150 as described above, a vibration mode can be unified for a plurality of the piezoelectric transformer elements 130, 140, and 150.

Also, the laminated piezoelectric transformer element 2000 according to the present embodiment may be formed by bonding or sintering single-layer piezoelectric transformer elements 130, 140, and 150 together.

Figure 19:
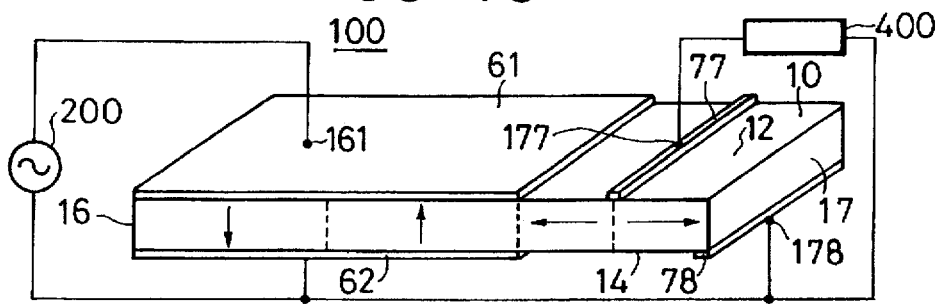
Figure 19:
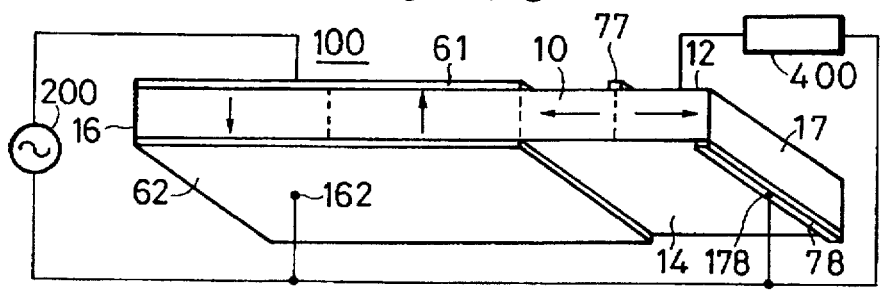
Figure 19:
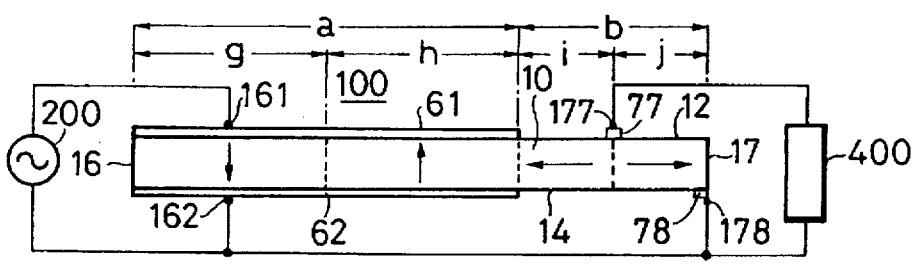
Figure 19:
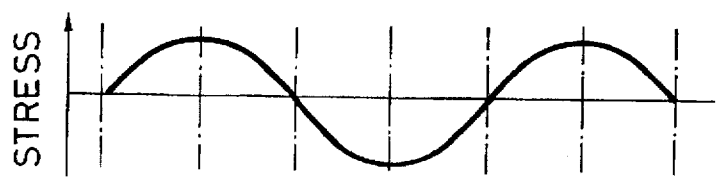
Figure 19:
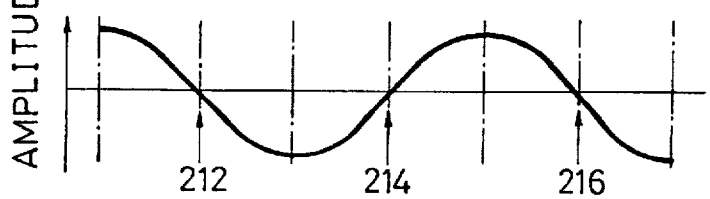

Nineteenth embodiment:

As shown in FIGS. 19A to 19C, a primary-side electrode 61 is disposed on the top face 12 of the rectangular parallelepipedic piezoelectric ceramics substrate 10 so as to cover the left two-thirds thereof, and another primary-side electrode 62 is provided on the bottom face 14 of the piezoelectric ceramics substrate 10 so as to be opposite to the primary-side electrode 61, whereby the portion of the piezoelectric ceramics substrate 10 sandwiched between the primary-side electrodes 61 and 62, i.e., the area designated as a primary-side region "a", is polarized in the thicknesswise direction of the substrate between the top face 12 and the bottom face 14. A portion of the piezoelectric ceramics substrate 10 between the primary-side end surface 16 and a position at ⅓ of the longitudinal length of the substrate 10 from the primary-side end surface 16, that is, a region "g", is polarized in the downward direction. On the other hand, another portion of the piezoelectric ceramics substrate 10 between the position at ⅓ of the longitudinal length of the substrate from the primary-side end surface 16 and a position at ⅔ of the longitudinal length of the substrate from the primary-side end surface 16, that is, a region "h", is polarized in the upward direction. In this way, the regions "g" and "h" of the piezoelectric ceramics substrate 10 have opposite directions of polarization to each other.

A portion of the piezoelectric ceramics substrate 10 between the position at ⅔ of the longitudinal length of the substrate 10 from the primary-side end surface 16 and the secondary-side end surface 17, that is, a secondary-side region "b", is polarized in the longitudinal direction of the substrate in parallel with the top and bottom faces 12 and 14. A portion of the piezoelectric ceramics substrate 10 between the position at ⅔ of the longitudinal length of the substrate from the primary-side end surface 16 and a position ⅚ of the longitudinal length of the substrate from the primary-side end surface 16, that is, a region "i", is polarized in the leftward direction. On the other hand, a portion of the piezoelectric ceramics substrate 10 between the position at ⅚ of the longitudinal length of the substrate from the primary-side end surface 16 and the secondary-side end surface 17, that is, a region "j", is polarized in the rightward direction. In this way, the regions "i" and "j" of the piezoelectric ceramics substrate 10 have opposite directions of polarization to each other.

A secondary-side electrode 77 is disposed on the top face 12 at the position at ⅚ of the longitudinal length of the piezoelectric ceramics substrate 10 from the primary-side end surface 16 in such a way as to transversely cross the piezoelectric ceramics substrate 10 from one end thereof to the other. Similarly, another secondary-side electrode 78 is disposed on the bottom face 14 along the edge of the secondary-side end surface 17 so as to traverse the piezoelectric ceramics substrate 10 from one end thereof to the other.

One end of the power source 200 is connected to the primary-side electrode 61 via a connecting portion 161. The other end of the power source 200 is connected to the primary-side electrode 62 via a connecting portion 162. The secondary-side electrode 78 is connected to the other end of the power source 200 and the primary-side electrode 62 via a connecting portion 178. The secondary-side electrode 77 is connected to one end of a load 400 via a connecting portion 177, and the other end of the load 400 is connected to the secondary-side electrode 78, the primary-side electrode 62, and the other end of the power source 200.

When a voltage from the power source 200 is applied between the primary-side electrodes 61 and 62, an electric field is applied to the left two-thirds of the piezoelectric ceramics substrate 10, that is, the primary-side area "a", in its thicknesswise direction, which brings about longitudinal vibration in the longitudinal direction as a result of a piezoelectric transverse effect involving a displacement perpendicular to the direction of polarization, as a result of which the overall piezoelectric transformer element 100 vibrates. The piezoelectric transformer element of this embodiment can be actuated in such a resonance mode that one and a half wavelengths of stress distribution exists between the primary-side end surface 16 and the secondary-side end surface 17. A voltage having a frequency equal to a resonance frequency in the one and a half wavelength mode is applied from the power source 200. In this embodiment, the primary-side and secondary-side end surfaces 16 and 17 of the piezoelectric ceramics substrate 10 are open, and therefore zero stress and the maximum amplitude appear at both longitudinal ends of the piezoelectric ceramics substrate 10. Further, in the present embodiment, the piezoelectric ceramics substrate 10 resonates in the one and a half wavelength mode, and hence stress and amplitude distributions respectively shown in FIGS. 19D and 19E are obtained.

If the piezoelectric ceramics substrate 10 is actuated in such a one and a half wavelength mode, nodes of the vibration appear at three points, namely, a position (node 212) at 1/6 of the longitudinal length of the piezoelectric ceramics substrate 10 from the primary-side end surface 16, a position (node 214) at 1/2 of the longitudinal length of the piezoelectric ceramics substrate 10 from the primary-side end surface 16, and a position (node 216) at 5/6 of the longitudinal length of the piezoelectric ceramics substrate 10 from the primary-side end surface 16. In this embodiment, the connecting portions 161 and 162 are provided at the node 212, and the connecting portion 177 is provided at the node 216.

Thus, in the present embodiment, the secondary-side electrode 78 is provided on the secondary-side region along the edge of the secondary-side end surface 17. This secondary-side electrode 78 is connected to the primary-side ground electrode 62. The secondary-side electrode 77 is also provided at the center of the secondary-side region "b" and is used as a high voltage side. When compared with a piezoelectric transformer element in which a high-voltage secondary-side electrode (not shown) for outputting a high voltage is disposed along the rightward edge of the secondary region and the overall secondary-side region "b" is polarized in either the rightward or leftward longitudinal direction of the substrate, the distance between the secondary-side electrodes becomes about half, the area of the electrodes becomes double, the capacitance at the secondary region is increased to about four times, and the output impedance is reduced to a quarter. In this way, when the output impedance of the piezoelectric transformer element 100 is reduced, the voltage applied to the load 400 connected to the secondary-side electrode 77 of the piezoelectric transformer element 100 becomes larger accordingly.

The stress is zero at both ends of the secondary-side region "b", and a half wavelength of stress distribution exists in the secondary-side region "b". Further, the stress is oriented in the same direction within the secondary-side region "b", and the primary-side ground electrode 62 and the secondary-side ground electrode 78 are provided on both sides of the secondary-side region "b". The secondary-side high-voltage electrode 77 is provided at the peak of the stress distribution appearing at the center of the secondary-side region "b". The areas on both sides of this secondary-side electrode 77 are polarized in opposite directions, and hence all electrical charges developed in the secondary-side region "b" can be effectively taken out. Further, as mentioned above, the secondary-side region "b" is symmetrical about the secondary-side electrode 77, and hence a frequency is output in a single mode. In consequence, the operation of the piezoelectric transformer element 100 becomes stable.

Because the secondary-side electrode 77 is disposed in the secondary-side region "b", the distance between secondary-side electrodes used for polarization becomes half, and an absolute voltage applied to polarize the secondary-side portion "b" becomes smaller, compared to the case where only a secondary-side high-voltage electrode (not shown) is disposed in the secondary region along the longitudinal free end of the substrate and the overall secondary-side region "b" is polarized in one direction, that is, a longitudinally rightward or leftward direction. As a result, a countermeasure to high voltages is easy to implement, and a power source outputting a lower voltage can be used for polarization.

Further, in this embodiment, the primary-side ground electrode 62 and the secondary-side ground electrode 78 are provided on the same bottom face 14 of the piezoelectric ceramics substrate 10, whereas the secondary-side high-voltage electrode 77 is disposed on the top face 12 of the piezoelectric ceramics substrate 10. For this reason, it is possible to prevent a short circuit between the secondary-side high-voltage electrode 77, the secondary-side ground electrode 78, and the primary-side electrode 62.

The primary-side electrodes 61 and 62 extend from the primary-side end face 16 to the position at 2/3 of the longitudinal length of the piezoelectric ceramics substrate 10 from the primary-side end face 16. For this reason, the area of the primary-side electrodes becomes larger, and the input impedance of the piezoelectric transformer element 100 becomes correspondingly smaller. In consequence, electrical energy from the power source 200 is more readily fed to the piezoelectric transformer element 100.

Since the regions "g" and "h" are polarized in opposite directions, receive the electric field in the same direction, and are subjected to stresses in opposite directions, they vibrate so as to enhance resonance to a much greater extent. As a result, the electrical energy fed from the power source 200 can be more efficiently converted to mechanical elastic energy at the primary side "a".

On the other hand, as a result of providing the region "h", the secondary-side region "b" is accordingly shortened in the longitudinal direction, and consequently the output impedance becomes smaller. As the output impedance of the piezoelectric transformer element 100 becomes smaller, voltage to be applied to the load 400 connected to the secondary side of the piezoelectric transformer element 100 becomes correspondingly greater.

The present invention becomes more effective when the load 400 connected to the piezoelectric transformer element 100 on the secondary side "b" is a CFL. The CFL 400 requires a high voltage of not less than 1 kV to initiate its discharge. On the other hand, the voltage step-up ratio of the piezoelectric transformer element 100 is proportional to a quality coefficient Qm of a resonator. Since the impedance of the CFL 400 is nearly infinite before discharge is initiated, the voltage step-up ratio is proportional to the Qm of the piezoelectric transformer element 100 itself, and hence a large voltage step-up ratio is made possible. Accordingly, even though a voltage step-up ratio dependent on the shape of the secondary becomes smaller due to the shortened distance between the primary-side and secondary-side electrodes as a result of disposing the secondary-side electrodes 77 and 78 as in the present embodiment, a discharge voltage can be readily built up because Qm of the resonator itself makes a significant contribution to the voltage step-up ratio at the time of initiating discharge. Once discharge is initiated, the impedance of the CFL 400 drops, however, since the output impedance of the piezoelectric transformer element 100 becomes smaller as a result of disposing the secondary-side electrodes 77 and 78 as in the present embodiment, the voltage applied to the CFL 400 can be increased accordingly.

In the present embodiment, support points are located at vibrational nodes 212 and 216 of the piezoelectric transformer element 100, thereby minimizing obstruction to vibration of the piezoelectric transformer element 100 occurred when it is supported. Further, in the present embodiment, the connecting portions 161 and 162 of the primary-side electrodes 61 and 62 and electrode terminals provided at these connecting portions 161 and 162 are located at the vibrational node 212. The connecting portion 177 of the secondary-side electrode 77 and an electrode terminal provided at this connecting portion 177 are located at the vibrational node 216. Moreover, the connecting portion 178 of the secondary-side electrode 78 is provided at the open end of the piezoelectric actuator element 100. A flexible lead is connected to this connecting portion 178, and therefore the electrical connecting portions can be prevented from impeding vibration.

Referring to FIGS. 20A to 20D, the manufacture of the piezoelectric transformer element 100 of the present embodiment will now be described. FIGS. 20A to 20D are cross sections showing a part of a manufacturing process of the piezoelectric transformer element 100 of the present embodiment, wherein FIGS. 20A to 20D are arranged in the order of manufacturing steps.

Figure 20:
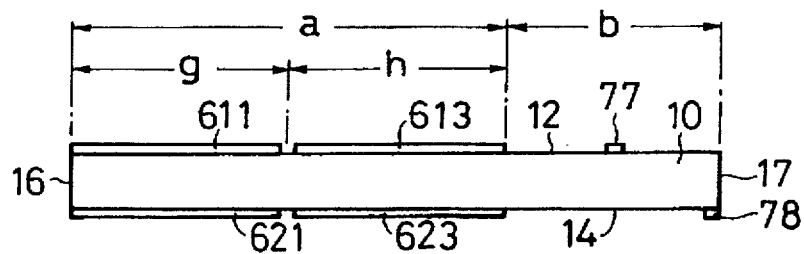
FIGS. 20A to 20D are cross-sectional views for explaining a manufacturing method for the piezoelectric transformer element according to the nineteenth embodiment.
Figure 20:
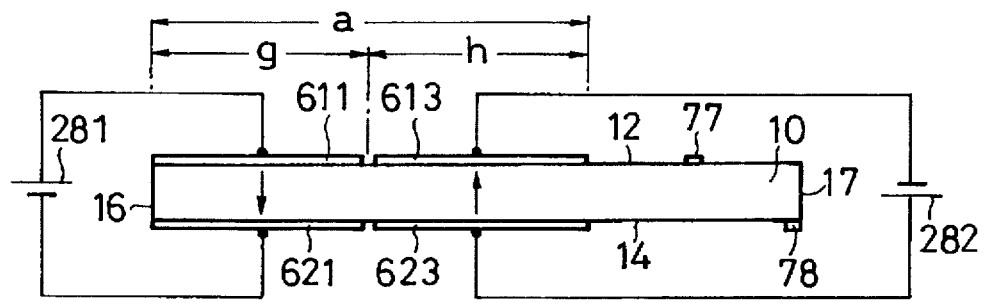
Figure 20:
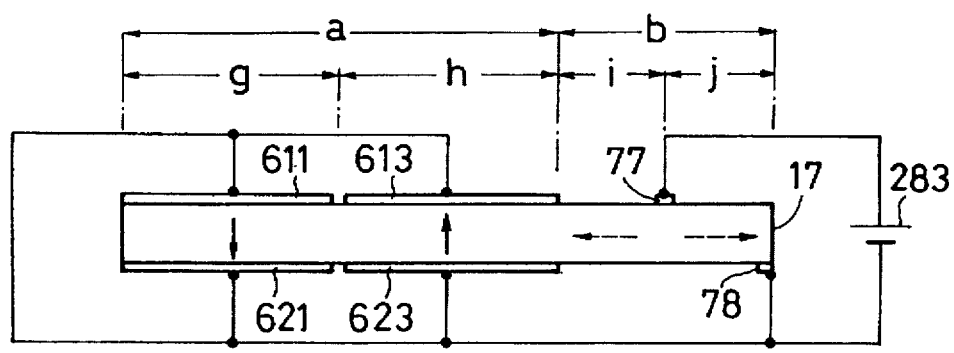
Figure 20:
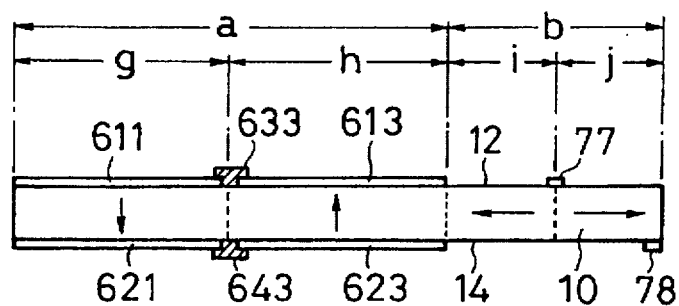
Figure 21A:
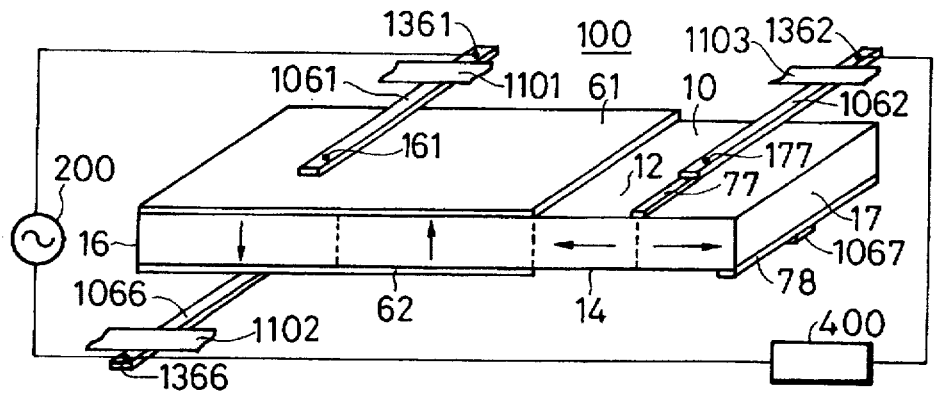
Figure 21B:
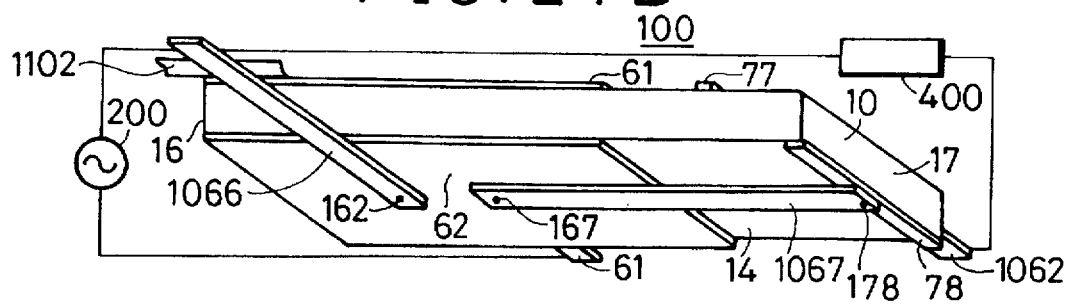
Figure 21C:
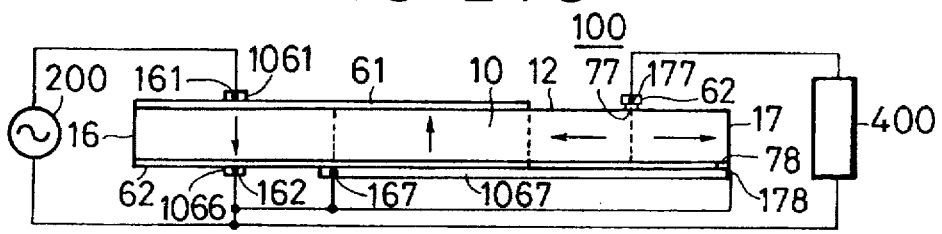
Figure 21D:
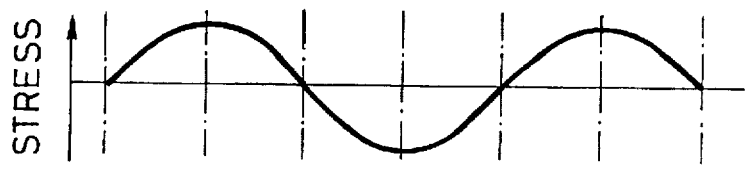
Figure 21E:
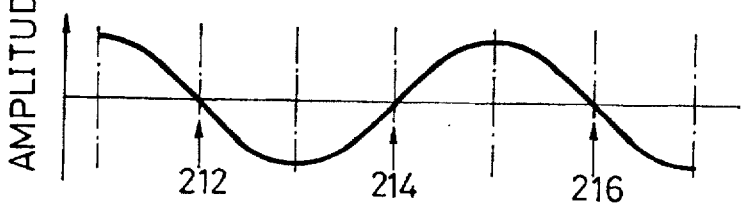

In the present embodiment, piezoelectric ceramics of $Pb(Ni_{1/3}Nb_{2/3})O_3$—$Pb(Zn_{1/3}Nb_{2/3})O_3$—$PbTiO_3$—$PbZrO_3$ fabricated by firing was cut into a rectangular parallelepiped 36 mm long, 7.6 mm wide and 1 mm in thickness to form the piezoelectric ceramics substrate 10, as shown in FIG. 20A. Subsequently, silver was applied on to the top face 12 and the bottom face 14 of the piezoelectric ceramics substrate 10 by screen printing. Then, the thus prepared piezoelectric ceramics substrate 10 was baked at 600° C. in the air to form a primary-side electrode 611 on the top face 12 in the region "g" of the piezoelectric ceramics substrate 10, a primary-side electrode 621 on the bottom face 14 in the region "g" of the same, a primary-side electrode 613 on the top face 12 in the region "h" of the same, a primary-side electrode 623 on the bottom face 14 in the region "h" of the same, the secondary-side electrode 77 on the top face 12 at the center of the secondary-side region "b", and the secondary-side electrode 78 on the bottom face 14 along the right-side edge of the secondary-side region "b".

As shown in FIG. 20B, the primary-side electrode 611 was connected to the positive terminal of a high-voltage DC power source 281 for polarization purposes, and the primary-side electrode 621 was connected to the negative terminal of the same. The primary-side electrode 613 was connected to the negative terminal of a high-voltage DC power source 282 for polarization purposes, and the primary-side electrode 623 was connected to the positive terminal of the same. With this connection, a voltage of 2 kV DC was applied from the respective high-voltage DC power sources 281 and 282 to polarize the regions "g" and "h" in a thicknesswise direction of the substrate in silicon oil at temperature of 100° C.

Then, as shown in FIG. 20C, the primary-side electrodes 611, 613, 621, 623, and the secondary-side electrode 78 were connected to the negative terminal of the high-voltage DC power source 283, whereas the secondary-side electrode 77 was connected to the positive terminal of the high-voltage DC power source 283. With this connection, a voltage of 12 kV was applied to longitudinally polarize the secondary-side region "b" in silicon oil at temperature of 100° C.

As shown in FIG. 20D, the primary-side electrodes 611 and 613 are connected together via conductive paste 633 to make the primary-side electrode 61 shown in FIGS. 19A to 19C. The primary-side electrodes 621 and 623 are connected together via conductive paste 643 to make the primary-side electrode 62 as shown in FIGS. 19A to 19C. Here, the electrodes may be connected together using lead wires instead of the conductive paste.

Then, as shown in FIGS. 19A to 19C, one end of the power source 200 was connected to the primary-side electrode 61 via the connecting portion 161, and the other end of the power source 200 was connected to the primary-side electrode 62 via the connecting portion 162. The secondary-side electrode 78 was connected, via the connecting portion 178, to the other end of the power source and the primary-side electrode 62. The secondary-side electrode 77 was connected to one end of the CFL 400, which is a load, via the connecting portion 177. The other end of the CFL 400 was connected to the secondary-side electrode 78, the primary-side electrode 62, and the other end of the power source 200. The CFL 400 used in this embodiment is a CFL of 225 mm long and 2.6 mm in diameter for use in A4-size notebook personal computers. The piezoelectric transformer element 100 and the CFL 400 were assembled into a liquid crystal display module, and a shield plate was attached to the rear side of the module. The module was assembled while the piezoelectric transformer element 100 was supported at the vibrational nodes 212 and 216.

A voltage having a frequency of 135 kHz was applied from the power source 200 to the piezoelectric transformer element 100. In this embodiment, as a result of incorporating the CFL 400 into the liquid crystal panel and attaching the shield plate, a luminance of 33,000 cd/m$^2$ was obtained in the CFL 400 at an input voltage of 29 $V_{rms}$. It was possible to initiate lighting of the CFL 400 at an input voltage of approximately 12 $V_{rms}$.

Contrary to this, in the case of a conventional piezoelectric transformer element in which a secondary-side high-voltage electrode is provided only along the right-side edge of a secondary region "b" and the overall secondary region "b" was polarized only in either a rightward or leftward direction, a stray capacitance developed between the shield plate and high-voltage wiring prevented the application of sufficient voltage to the CFL 400, which in turn made it impossible for the CFL 400 to illuminate.

Twentieth embodiment:

FIGS. 21A to 21E illustrate a piezoelectric transformer according to a twentieth embodiment of the present invention.

In this embodiment, the piezoelectric transformer element 100 is supported by lead frames 1061, 1062, and 1066. The lead frames 1061, 1062, and 1066 are supported by supporting members 1101, 1103, and 1102, respectively. One end of the lead frame 1061 is fixedly connected to the primary-side electrode 61 via the connecting portion 161 by welding. One end of the lead frame 1062 is fixedly connected to the secondary-side electrode 77 via the connecting portion 177 by welding. One end of the lead frame 1066 is fixedly connected to the primary-side electrode 62 via the connecting portion 162 by welding. The secondary-side electrode 78 is fixedly connected to a lead frame 1067 in the vicinity of one end thereof via the connecting portion 178. The other end of the lead frame 1067 is fixedly connected to the primary-side electrode 62 via the connecting portion 167 by welding.

One end of the power source 200 is connected to the other end of the lead frame 1061 via a connecting portion 1361, whereas the other end of the power source 200 is connected to the other end of the lead frame 1066 via a connecting portion 1366.

The piezoelectric ceramics substrate 10 has three vibrational nodes: namely, a node 212 at ⅙ of the longitudinal length of the piezoelectric ceramics substrate 10 from the primary-side end surface 16, a node 214 at half the longitudinal length of the same from the primary-side end surface 16; and a node 216 at ⅚ of the longitudinal length of the same from the primary-side end surface 16. The connecting portions 161 and 162 are positioned at the vibrational node 212, and the connecting portion 177 is positioned at the vibrational node 216. Therefore, it is possible to minimize obstruction to vibration of the piezoelectric transformer element 100 which occurs due to electrical connection to the piezoelectric transformer element 100 or the support of the piezoelectric transformer element 100.

The secondary-side electrode 78 is connected to the lead frame 1067 via the connecting portion 178, and this lead frame 1067 is also connected to the primary-side electrode 62 via the connecting portion 167. These connecting portions 178 and 167

119 are located at areas where the phase of the vibration is the same. Therefore, even when the secondary-side electrode 78 and the primary-side electrode 62 are connected to each other through the lead frame 1067 and the connecting portions 178 and 167, the rigidity of the lead frame 1067 will not prevent vibration of the piezoelectric ceramics substrate 10.

In the above mentioned twentieth embodiment, the lead frames 1061, 1062, 1066, and 1067 are 0.15 mm in thickness and 0.5 to 0.8 mm wide. They are made of phosphor bronze, an alloy of iron and nickel, or the like.

Figure 22:
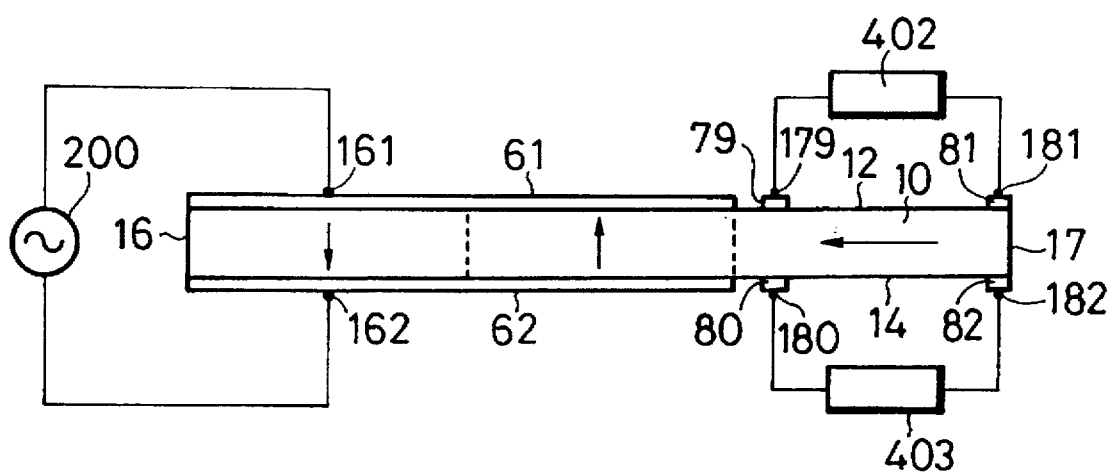
FIG. 22 is a cross-sectional view for explaining a piezoelectric transformer element according to a twenty-first embodiment of the present invention.
Figure 23:
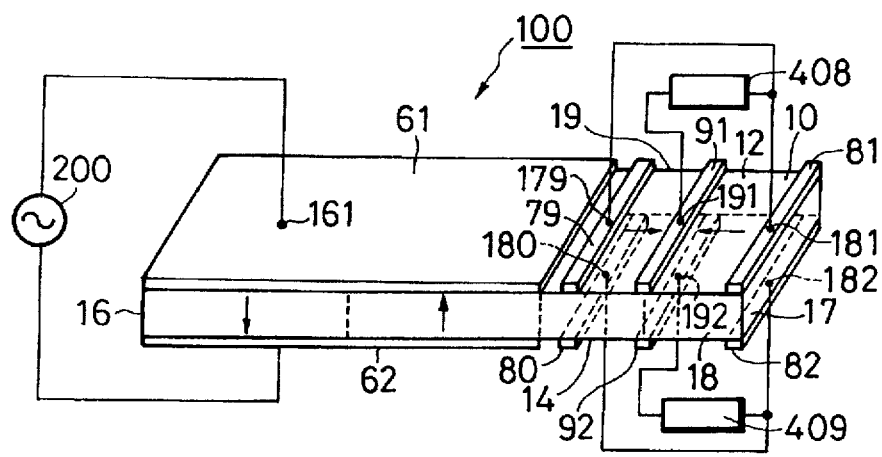
Figure 23:
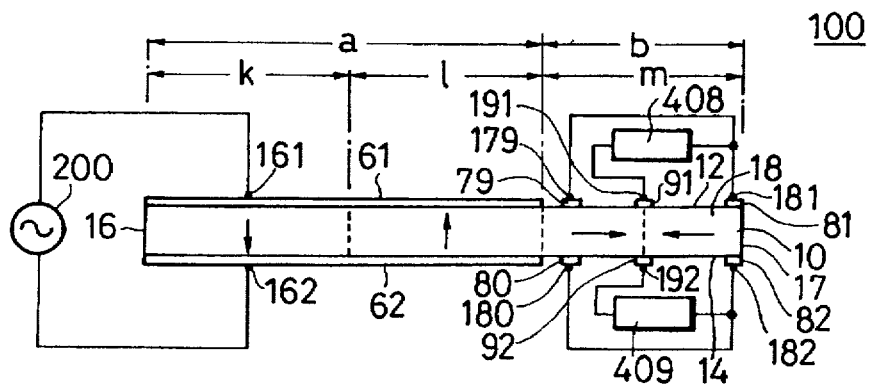
Figure 23:
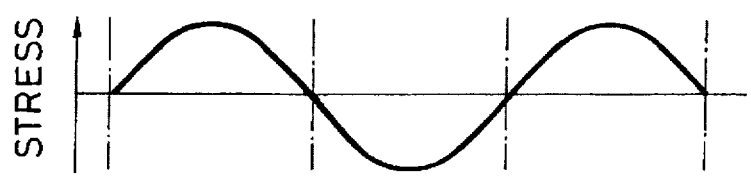
Figure 23:
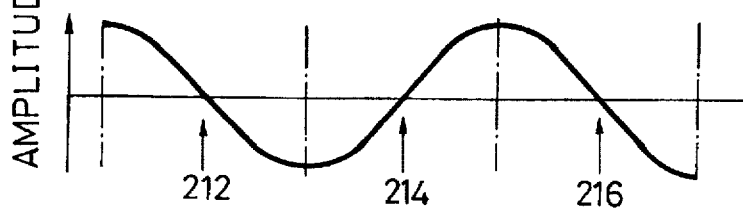

Twenty-first embodiment:

FIG. 22 is a cross section for explaining a piezoelectric transformer element according to a twenty-first embodiment of the present invention.

In the present embodiment, the piezoelectric transformer element is provided with two loads. Namely, a secondary-side electrode 79 is connected to one end of a load 402, and the other end of the load 402 is connected to a secondary-side electrode 81. A secondary-side electrode 80 is connected to one end of a load 403, and the other end of the load 403 is connected to a secondary-side electrode 82. The top face 12 and the bottom face 14 of the piezoelectric ceramics substrate 10 are independent of each other, and the loads 402 and 403 are driven independently. The secondary-side electrodes 79 to 82 are disposed across the piezoelectric ceramics substrate 10 in a widthwise direction thereof.

As a result of the above mentioned configuration, it is not necessary to make the ground potential of the secondary side to be common to that of the primary side of the substrate. This makes it possible to separate a primary-side circuit from a secondary-side circuit in terms of direct current. Ground electrodes can be formed in the secondary-side independently of the primary-side circuits, whereby the primary-side ground and the secondary-side ground can be insulated from each other. Further, it also becomes possible for secondary-side region to float, without grounding the secondary-side region, thereby resulting in improved noise resistance.

Twenty-second embodiment:

FIGS. 23A–23D illustrate a piezoelectric transformer element according to a twenty-second embodiment of the present invention.

In the previously mentioned twenty-first embodiment, the overall secondary-side region "b" is polarized only in one direction, that is, a longitudinal direction of the piezoelectric ceramics substrate 10, the load 402 having both ends connected to the secondary-side electrodes 79 and 81, as well as the load 403 having both ends being connected to the secondary-side electrodes 80 and 82, are actuated. The twenty-second embodiment is the same as the twenty-first embodiment except for the following points. Namely, secondary-side electrodes 91 and 92 are provided at ⅙ of the longitudinal length of the piezoelectric ceramics substrate 10 from the secondary-side end surface 17 on the respective top and bottom faces 12 and 14 so as to traverse the piezoelectric ceramics substrate 10 in this embodiment. A region between the secondary-side end surface 17 and the position at ⅙ of the longitudinal length of the piezoelectric ceramics substrate 10 from the secondary-side end surface 17 is polarized in the leftward. Further, a region between the position at ⅙ of the longitudinal direction of the piezoelectric ceramics substrate 10 from the secondary-side end surface 17 and a position at ⅓ of the longitudinal direction of the same from the secondary-side end surface 17 is polarized in the rightward. The secondary-side electrode 91 is connected to one end of a load 408 via a connecting portion 191, and the secondary-side electrode 79 is connected to the other end of the load 408 via a connecting portion 179. The secondary-side electrode 81 is also connected to the other end of the load 408 via a connecting portion 181. The secondary-side electrode 92 is connected to one end of a load 409 via a connecting portion 192, and the secondary-side electrode 80 is connected to the other end of the load 409 via a connecting portion 180. The secondary-side electrode 82 is also connected to the other end of the load 409 via a connecting portion 182. As a result of the above mentioned configuration, it is unnecessary for the ground potential of the secondary region to be common to that of the primary region of the substrate, which makes it possible to separate a primary-side circuit from a secondary-side circuit in terms of direct current. Ground electrodes can be formed in the secondary-side independently of the primary-side, whereby the primary-side ground and the secondary-side ground can be insulated from each other. Further, it becomes possible for the secondary-side region to float, without grounding the secondary-side region, thereby resulting in improved noise resistance.

In this embodiment, the secondary-side electrodes 79 and 81 are connected together as one output of the transformer, and the secondary-side electrode 91 is taken as the other output of the transformer. On the other hand, the second-side electrodes 80 and 82 are connected together as one output of the transformer, and the secondary-side electrode 92 is taken as the other output of the transformer. As compared with the piezoelectric transformer element in the twenty-first embodiment, in which one output is taken out between the secondary-side electrodes 79 and 81 and another output is taken out between the secondary-side electrodes 80 and 82, the distance between the secondary-side electrodes becomes about half, the area of the electrodes becomes double, the capacitance of the secondary-side region is increased to four times, and the output impedance is reduced to about a quarter. In this way, as the output impedance of the piezoelectric transformer element 100 becomes smaller, voltage applied to the load 400 connected to the secondary-side electrode of the piezoelectric transformer element 100 becomes correspondingly larger. In this way, it becomes possible to drive much heavier load.

Furthermore, because the secondary-side electrode 91 is disposed between the secondary-side electrodes 79 and 81, and the secondary-side electrode 92 is disposed between the secondary-side electrodes 80 and 82, the distance between secondary-side electrodes for polarization becomes shorter, and an absolute voltage for polarization becomes smaller, compared to a piezoelectric transformer element in which the portion between the secondary-side electrodes 79 and 81 disposed on the top face 12 of the secondary-side region and the portion between the secondary-side electrodes 80 and 82 disposed on the bottom face 14 of the secondary-side region are polarized only in either a longitudinally rightward or leftward direction. As a result, a countermeasure to high voltages is easy to implement, and a power source outputting a lower voltage can be employed for polarization.

In the present embodiment, the connecting portions 191 and 192 are located at the vibrational node 216 in the longitudinal direction of the piezoelectric ceramics substrate 10. Hence, if the secondary region of the piezoelectric transformer element 100 is supported at these connecting portions 191 and 192, obstruction to longitudinal vibration of the piezoelectric transformer element 100 can be minimized.

Figure 24:
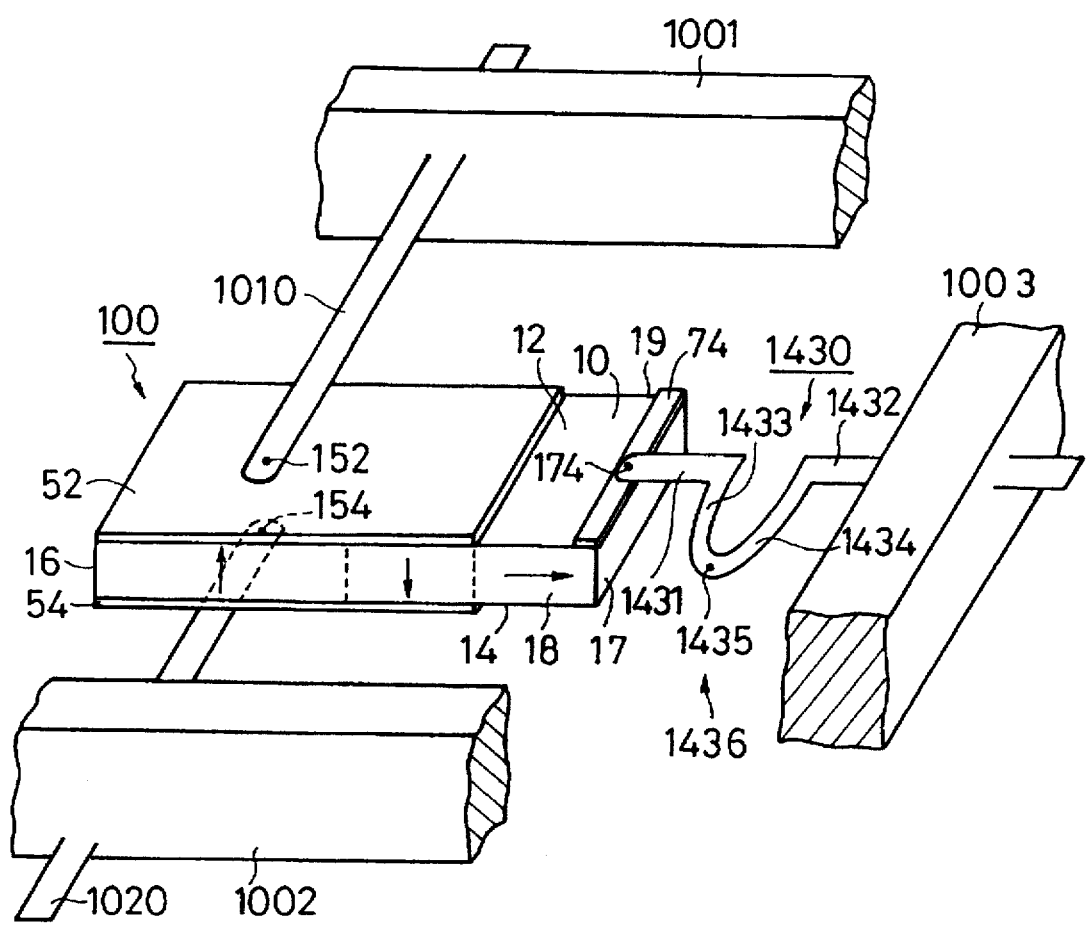
FIG. 24 is a perspective view for explaining a piezoelectric transformer according to a twenty-third embodiment of the present invention.

Twenty-third embodiment:

FIG. 24 is a perspective view for explaining a piezoelectric transformer according to a twenty-third embodiment of the present invention. This embodiment is applied to a piezoelectric transformer element in which a secondary region is longitudinally polarized.

In FIG. 24, the piezoelectric transformer element 100 is supported by lead frames 1010, 1020, and 1430. The lead frame 1010 is supported by a supporting member 1001, and the lead frame 1020 is supported by a supporting member 1002, the lead frame 1430 being supported by a supporting member 1003. The lead frames 1010 and 1020 are disposed at right angles to the longitudinal direction of the piezoelectric ceramics substrate 10, whilst the lead frame 1430 is disposed in a direction parallel to the longitudinal direction of the piezoelectric ceramics substrate 10.

One end of the lead frame 1010 is fixedly connected to the primary-side electrode 52 via the connecting portion 152 by welding. The other end of the lead frame 1010 is connected to a support member 1001 for fixation thereto. One end of the lead frame 1020 is fixedly connected to the primary-side electrode 54 via the connecting portion 154 by welding. The other end of the lead frame 1020 is connected to a support member 1002 for fixation thereto. The connecting portions 152 and 154 are at ¼ of the longitudinal length of the piezoelectric ceramics substrate 10 from the primary-side end surface 16 such that they are centrally located in the lateral direction perpendicular to the longitudinal direction of the piezoelectric ceramics substrate 10.

Since the connecting portion 152 between the primary-side electrode 52 and the lead frame 1010 and the connecting portion 154 between the primary-side electrode 54 and the lead frame 1020 are provided in the vibrational node 202 in the longitudinal direction of the piezoelectric ceramics substrate 10, it is possible to minimize obstruction to vibration in the longitudinal direction of the piezoelectric transformer element 100 occurred when lead terminals are connected thereto.

The lead frame 1430 is comprised of sub-lead frames 1431 to 1434. The sub-lead frame 1431 extends linearly in the longitudinal direction of the piezoelectric ceramics substrate 10, and one end of the sub-lead frame 1431 is fixedly connected to the secondary-side electrode 74 via a connecting portion 174 by welding. The connecting portion 174 is provided at the center in the widthwise direction of the piezoelectric ceramics substrate 10. A sub-lead frame 1432 linearly extends in the longitudinal direction of the piezoelectric ceramics substrate 10, and one end of the sub-lead frame 1432 is fixedly connected to the supporting member 1003.

A sub-lead frame 1433 curvedly extends from the other end of the sub-lead frame 1431 in the lateral direction of the piezoelectric ceramics substrate 10 toward a lateral end surface 18 such that the tip end of the sub-lead frame 1433 is curved toward the supporting member 1003. Similarly, a sub-lead frame 1434 curvedly extends from the other end of the sub-lead frame 1432 in the same direction such that the sub-lead frame 1433 is curved toward the piezoelectric ceramics substrate 10. The tip ends of the sub-lead frames 1433 and 1434 are connected together in an integrated fashion, thereby forming a U-shaped resilient structure portion 1436.

The connecting portion 174 between the secondary-side electrode 74 and the lead frame 1430 is provided in the vicinity of the secondary-side end surface 17 of the piezoelectric substrate 10 and is not disposed at the vibrational node in the longitudinal direction of the piezoelectric ceramics substrate 10.

However, the lead frame 1430 is provided with the resilient structure portion 1436 in this embodiment, and consequently the sub-lead frames 1433 and 1434 bend to vibrate about the point 1435, respectively, in response to vibration in the longitudinal direction of the piezoelectric transformer element 100, thereby minimizing obstruction to vibration in the longitudinal direction of the piezoelectric transformer element 100.

Figure 25:
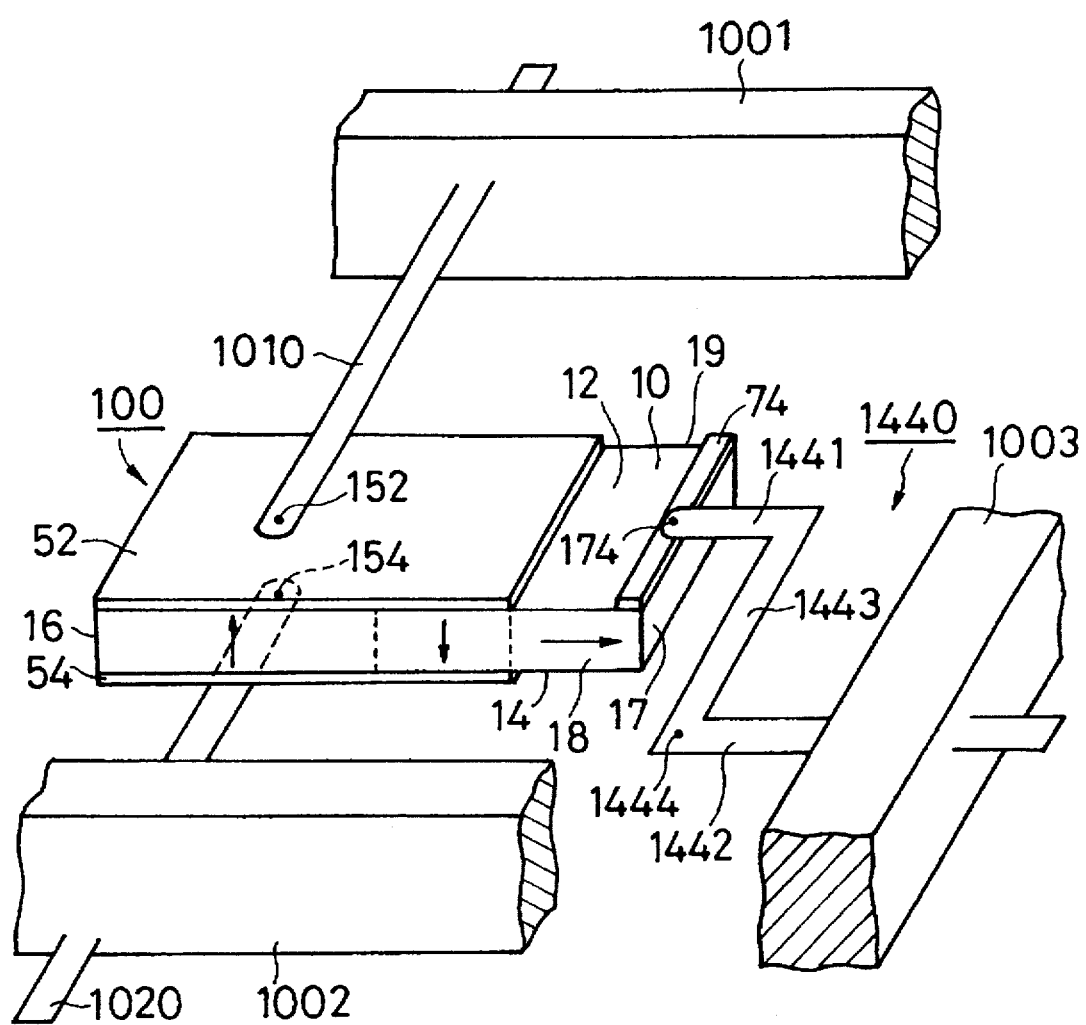
FIG. 25 is a perspective view for explaining a piezoelectric transformer according to a twenty-fourth embodiment of the present invention.

Twenty-fourth embodiment:

FIG. 25 is a perspective view for explaining a piezoelectric transformer according to a twenty-fourth embodiment of the present invention.

In this embodiment, the connecting portion 174 between the secondary-side electrode 74 and a lead frame 1430 is disposed in the vicinity of the secondary-side end surface 17 of the piezoelectric ceramics substrate 10 and is not located at the vibrational node in the longitudinal direction of the piezoelectric ceramics substrate 10. However, the lead frame 1440 includes a sub-lead frame 1443 extending in the transverse direction of the piezoelectric ceramics substrate 100. Therefore, bending action occurs about a point 1444 of the lead frame 1440 to vibrate, when the piezoelectric transformer element 100 vibrates in the longitudinal direction. Accordingly, it is possible to reduce obstruction to vibration in the longitudinal direction of the piezoelectric transformer element 100.

Figure 26:
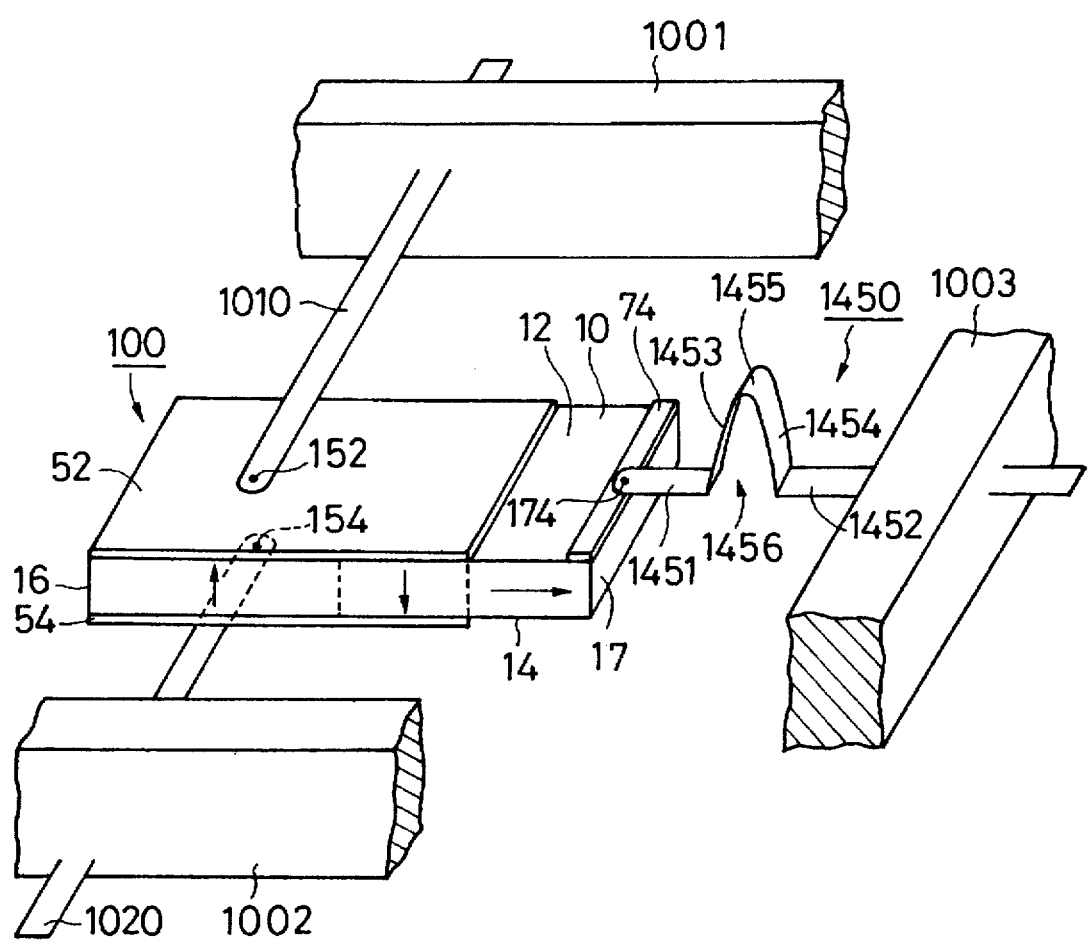
FIG. 26 is a perspective view for explaining a piezoelectric transformer according to a twenty-fifth embodiment of the present invention.

Twenty-fifth embodiment:

FIG. 26 is a perspective view for explaining a piezoelectric transformer according to a twenty-fifth embodiment of the present invention.

The connecting portion 174 between the secondary-side electrode 74 and a lead frame 1450 is disposed in the vicinity of the secondary-side end surface 17 of the piezoelectric ceramics substrate 10 and is not located at the vibrational node in the longitudinal direction of the piezoelectric ceramics substrate 10. In this embodiment, however, the lead frame 1450 is provided with a resilient structure portion 1456. Therefore, sub-lead frames 1453 and 1454 of the resilient structure portion 1456 bend about a point 1455 to vibrate, when the piezoelectric transformer element 100 vibrates in the longitudinal direction. Accordingly, it is possible to reduce obstruction to vibration in the longitudinal direction of the piezoelectric transformer element 100.

In the twenty-third through twenty-fifth embodiments, the lead frames 1430, 1440, and 1450 is preferably made of phosphor bronze into a thickness of 0.15 to 0.2 mm.

Figure 27A:
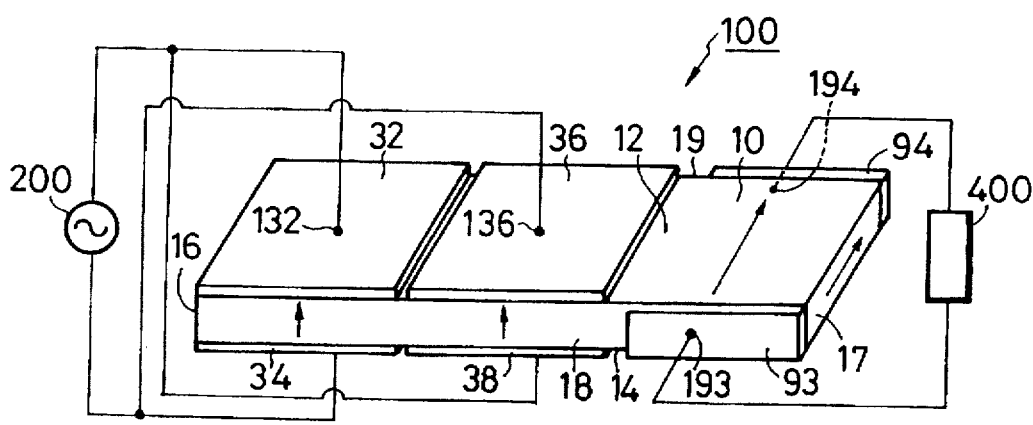
Figure 27B:
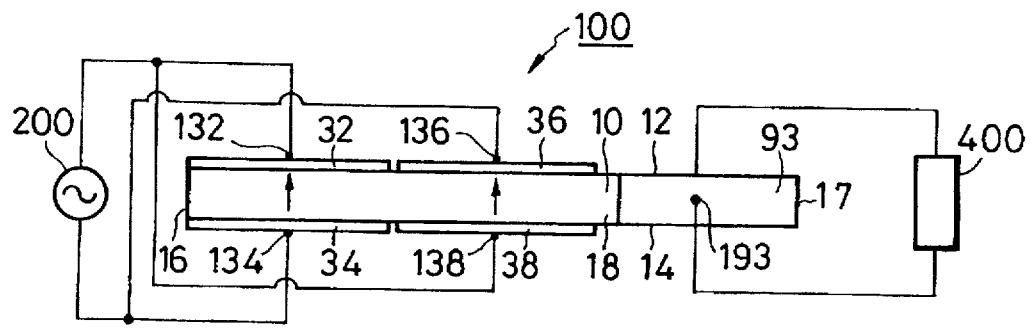

Twenty-sixth embodiment:

As shown in FIGS. 27A and 27B, a primary-side electrode 32 is disposed on the top face 12 of the rectangular parallelepipedic piezoelectric ceramics substrate 10 so as to cover a left third thereof, and another primary-side electrode 34 is provided on the bottom face 14 of the piezoelectric ceramics substrate 10 so as to be opposite to the primary-side electrode 32, and the portion of the piezoelectric ceramics substrate 10 sandwiched between the primary-side electrodes 32 and 34 is polarized in the thicknesswise direction of the piezoelectric ceramics substrate 10 between the top face 12 and the bottom face 14.

A primary-side electrode 36 is provided on the top face 12 of the piezoelectric ceramics substrate 10 between the position at ⅓ of the longitudinal length of the substrate from the primary-side end surface 16 and a position at ⅔ of the longitudinal length of the substrate from the primary-side end surface 16, and another primary-side electrode 38 is provided on the bottom face 14 of the piezoelectric ceramics substrate 10 so as to be opposite to the primary-side electrode 36. The primary-side electrodes 32 and 36 are spaced apart from each other, and the primary-side electrodes 34 and 38 are similarly spaced apart from each other. A portion of the piezoelectric ceramics substrate 10 between the primary-side electrodes 36 and 38 is polarized in the thicknesswise direction of the piezoelectric ceramics substrate 10. A portion of the piezoelectric ceramics substrate 10 between the primary-side electrodes 32 and 34 and the portion of the piezoelectric ceramics substrate 10 between the primary-side electrodes 36 and 38 are polarized in the same direction.

A secondary-side electrode 93 is disposed on the lateral end surface 18 of the piezoelectric ceramics substrate 10. This secondary-side electrode 93 extends from the secondary-side end surface 17 so as to cover a little less than one third of the lateral end surface 18 in the longitudinal direction of the piezoelectric substrate 10. A secondary-side electrode 94 is similarly disposed on a lateral end surface 19 of the piezoelectric ceramics substrate 10 so as to face the secondary-side electrode 93. The secondary-side electrode 93 is separated from the primary-side electrodes 36 and 38 by a predetermined amount, and the secondary-side electrode 94 is separated from the primary-side electrodes 36 and 38 by a predetermined amount. A portion of the piezoelectric ceramics substrate 10 between the secondary-side electrodes 93 and 94 is polarized in the widthwise direction of the substrate between the secondary-side end surfaces 18 and 19.

One end of the power source 200 is connected to the primary-side electrode 32 via a connecting portion 132 and to the primary-side electrode 38 via a connecting portion 138. The other end of the power source 200 is connected to the primary-side electrode 34 via a connecting portion 134 and to the primary-side electrode 36 via a connecting portion 136. The secondary-side electrode 93 is connected to one end of the load 400 via a connecting portion 193, and the secondary-side electrode 94 is connected to the other end of the load 400 via a connecting portion 194.

Figure 27C:
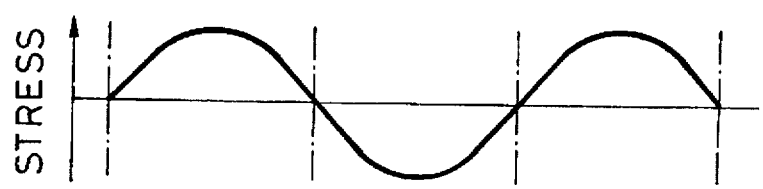
Figure 27D:
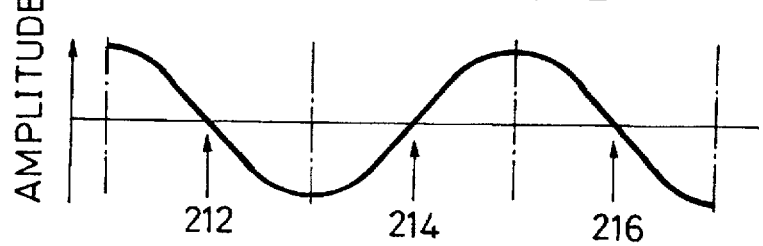

When a voltage from the power source 200 is applied between the primary-side electrodes 32 and 34, an electric field is applied to the left third of the piezoelectric ceramics substrate 10 in its thicknesswise direction, which brings about longitudinal vibration in the longitudinal direction as a result of a piezoelectric transverse effect involving a displacement perpendicular to the direction of polarization, whereby the overall piezoelectric transformer element 100 vibrates. The piezoelectric transformer element of the present embodiment can be actuated in such a resonance mode that one and a half wavelength of stress distribution exists between the primary-side end surface 16 and the secondary-side end surface 17. A voltage having a frequency equal to a resonance frequency in the one and a half wavelength mode is applied from the power source 200. Support points are provided at a position 212 at ⅙ of the longitudinal length of the piezoelectric ceramics substrate 10 from the primary-side end surface 16 and a position 216 at ⅙ of the longitudinal length of the piezoelectric ceramics substrate 10 from the secondary-side end surface 17 in the present embodiment. The primary-side and secondary-side end surfaces 16 and 17 of the piezoelectric ceramics substrate 10 are open, and therefore zero stress and the maximum amplitude appear at both longitudinal ends of the piezoelectric ceramics substrate 10. Further, in the present embodiment, the piezoelectric ceramics substrate 10 resonates in the one and a half wavelength mode, and hence stress and amplitude distributions respectively shown in FIGS. 27C and 27D are obtained.

If the piezoelectric ceramics substrate 10 is actuated in such a one and a half wavelength mode, nodes of the vibration appear at three points, namely, a position (node 212) at ⅙ of the longitudinal length of the piezoelectric ceramics substrate 10 from the primary-side end surface 16, a position (node 214) at ½ of the longitudinal length of the piezoelectric ceramics substrate 10 from the primary-side end surface 16, and a position (node 216) at ⅚ of the longitudinal length of the piezoelectric ceramics substrate 10 from the primary-side end surface 16.

In addition to the primary-side electrodes 32 and 34, the piezoelectric transformer element is further provided with the primary-side electrodes 36 and 38, thereby increasing the area of the primary-side electrodes. The input impedance of the piezoelectric transformer element 100 becomes correspondingly smaller. Consequently, electrical energy from the power source 200 is more readily fed to the piezoelectric transformer element 100.

Further, since the primary-side electrode is made up of two regions, when a voltage is applied to the primary-side electrodes from the power source 200, for the previously mentioned reasons, the portion of the piezoelectric ceramics substrate 10 between the primary-side electrodes 36 and 38 vibrates so as to enhance, to a much greater extent, the resonance excited by the application of a voltage between the primary-side electrodes 32 and 34 from the power source 200. As a result, the electrical energy fed from the power source 200 can be more efficiently converted to mechanical elastic energy at the primary side.

In this way, the primary-side electrodes 36 and 38 are provided in the region where stress arises in the direction opposite to the direction of the stress developing in the region in which the primary-side electrodes 32 and 34 are disposed. The portion of the piezoelectric ceramics substrate 10 between the primary-side electrodes 36 and 38 is polarized in the same direction as in the portion of the piezoelectric ceramics substrate 10 between the primary-side electrodes 32 and 34, but these portions are arranged to receive electrical fields in opposite directions. As a result, the electrical energy from the power source 200 is more readily fed to the piezoelectric transformer element 100, and the electrical energy fed from the power source 200 can be more efficiently converted to mechanical elastic energy at the primary side. For these reasons, the effective voltage step-up ratio of the piezoelectric transformer element 100 can be increased.

Further, in the present embodiment, the secondary-side electrode 93 is disposed on the end surface 18 of the piezoelectric ceramics substrate 10 in the widthwise direction thereof, and the secondary-side electrode 94 is disposed on the lateral end surface 19 of the same in such a way as to be opposite to the secondary-side electrode 93. The portion of the piezoelectric ceramics substrate 10 between the secondary-side electrodes 93 and 94 is polarized in the widthwise direction of the substrate between the secondary-side end surfaces 18 and 19. Therefore, the portion of the piezoelectric ceramics substrate 10 between the secondary-side electrodes 93 and 94 is coupled, by a Poisson's ratio, to the resonance in the longitudinal direction excited by the portions of the piezoelectric ceramics substrate 10 between the primary-side electrodes 32 and 34 and between the primary-side electrodes 36 and 38. As a result, the portion between the secondary-side electrodes 93 and 94 vibrates in the widthwise direction of the piezoelectric ceramics substrate 10, and mechanical strain develops in the widthwise direction of the same, thereby resulting in a potential difference in the direction of polarization in the widthwise direction. This potential difference can be taken out of the secondary-side electrodes 93 and 94.

In this way, the secondary-side electrodes 93 and 94 are separated from the primary-side electrodes 32, 34, 36, and 38 in terms of direct current. Independent ground electrodes are formed for the respective secondary-side and primary-side circuits (for example, the primary-side electrodes 34, 36 and the secondary-side electrode 93 can be used as separate ground electrodes which are independent of each other). Consequently, the grounds of the primary-side circuit and the secondary-side circuit can be insulated from each other, and it becomes possible to maintain the secondary side in a floated state without grounding the secondary-side region (for example, the secondary-side electrode 93 is floated without grounding), thereby resulting in improved noise resistance.

In the present embodiment, it is possible to connect lead wires and lead frames to the secondary-side electrodes 93 and 94 at the vibrational node 216 of the longitudinal direction of the piezoelectric ceramics substrate 10. In consequence, it becomes possible to easily form electrical connections for the secondary-side electrodes and to provide mechanical support for the secondary-side portion without obstructing the longitudinal vibration in the longitudinal direction of the piezoelectric transformer element. Further, the output of the piezoelectric transformer element 100 becomes stable, and the piezoelectric transformer element can be easily encased.

Since the piezoelectric transformer element 100 of the present embodiment is supported at the vibrational nodes 212 and 214, it is possible to minimize obstruction to vibration of the piezoelectric transformer element 100 occurred when it is supported.

Figure 28:
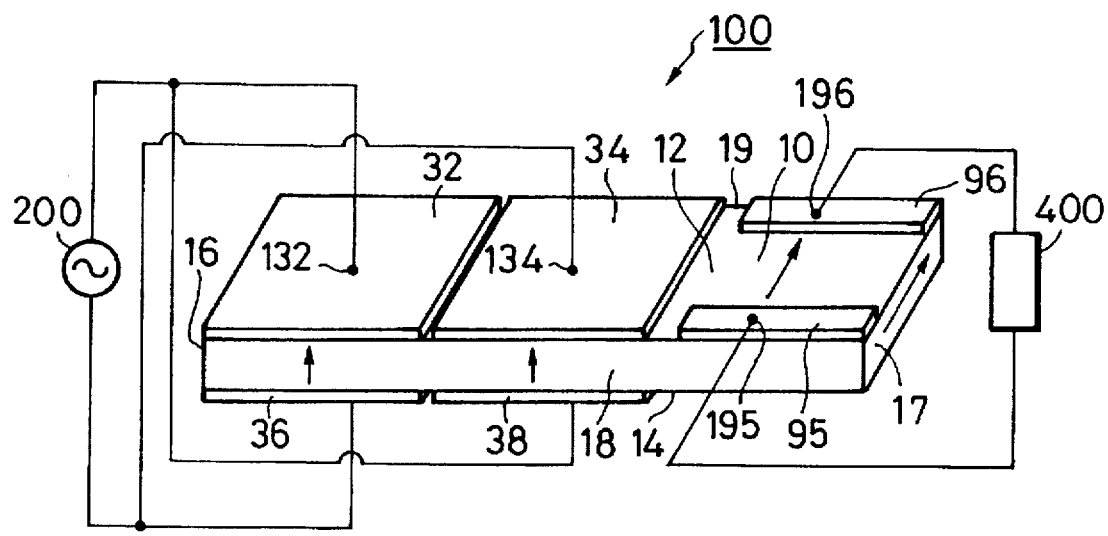
FIG. 28 is a perspective view for explaining a piezoelectric transformer element according to a twenty-seventh embodiment of the present invention.

Twenty-seventh embodiment:

FIG. 28 is a perspective view of a piezoelectric transformer element according to a twenty-seventh embodiment of the present invention. Differing from the twenty-sixth embodiment in which the secondary-side electrodes 93 and 94 are respectively provided on the end surfaces 18 and 19 in the widthwise direction of the piezoelectric ceramics substrate 10, the twenty-seventh embodiment comprises secondary-side electrodes 95 and 96 which are disposed on the top face 12 along the lateral end surfaces 18 and 19 in such a way as to be opposite to each other in the widthwise direction of the piezoelectric ceramics substrate 10. These secondary-side electrodes 95 and 96 extend from the secondary-side end surface 17 to a position at a little less than third of the longitudinal length of the piezoelectric ceramics substrate 10 from the secondary-side end surface 17. In other respects, the twenty-seventh embodiment is the same as the twenty-sixth embodiment.

In the present embodiment, the secondary-side electrodes 95 and 96 are disposed on the top face 12 of the piezoelectric ceramics substrate 10, and hence they can be formed through the same film-forming process as the primary-side electrodes 32 and 36. Further, the lead wires or lead frames are connected to only the top and bottom faces 12 and 14 of the piezoelectric ceramics substrate, which makes it possible to simplify the shapes of the lead wires or lead frames.

Figure 29:
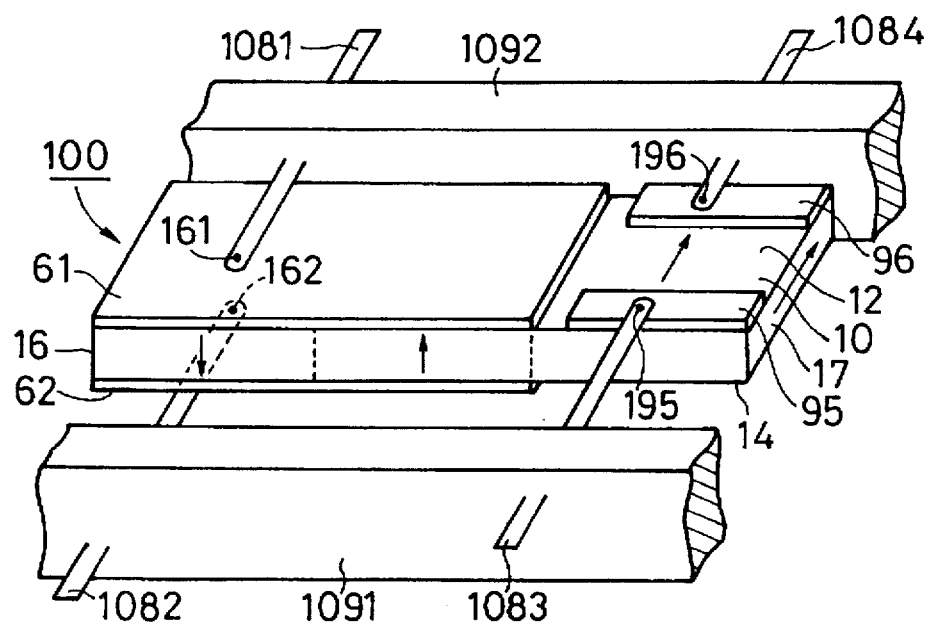
FIG. 29 is a perspective view for explaining a piezoelectric transformer element and its mounting method according to a twenty-eighth embodiment of the present invention.

Twenty-eighth embodiment:

FIG. 29 is a perspective view for explaining the piezoelectric transformer element 100 and its mounting method according to a twenty-eighth embodiment.

The piezoelectric transformer element 100 of the twenty-eighth embodiment is the same as that of the twenty-seventh embodiment except that two regions on the primary side are polarized in opposite directions, and the corresponding electrodes 61 and 62 are electrically integrated together.

The piezoelectric transformer element 100 is supported by lead frames 1081, 1082, 1083, and 1084. The lead frames 1082 and 1083 are supported by a supporting member 1091. The lead frames 1081 and 1084 are supported by a supporting member 1092. One end of the lead frame 1081 is fixedly connected to the primary-side electrode 61 via the connecting portion 161 by welding. One end of the lead frame 1082 is fixedly connected to the secondary-side electrode 62 via the connecting portion 162 by welding. One end of the lead frame 1083 is fixedly connected to a primary-side electrode 95 via a connecting portion 195 by welding. One end of the lead frame 1084 is fixedly connected to a primary-side electrode 96 via a connecting portion 196 by welding. The connecting portions 161 and 162 are at ⅙ of the longitudinal length of the piezoelectric ceramics substrate 10 from the primary-side end surface 16 such that they are centrally located in the lateral direction of the substrate. The connecting portions 195 and 196 are provided at ⅙ of the longitudinal length of the piezoelectric ceramics substrate 10 from the secondary-side end surface 17.

In the present embodiment, the connecting portion 161 between the primary-side electrode 61 and the lead frame 1081 and the connecting portion 162 between the primary-side electrode 62 and the lead frame 1082 are provided in the vibrational node 212, whereas the connecting portion 195 between the secondary-side electrode 95 and the lead frame 1083 and the connecting portion 196 between the secondary-side electrode 96 and the lead frame 1084 are provided in the vibrational node 216. Moreover, the lead frames 1081 through 1084 are thin and have a plenty of spring properties. Consequently, it is possible to minimize obstruction to vibration of the piezoelectric transformer element 100 occurred when it is supported or electrically connected.

Piezoelectric ceramics of $Pb(Ni_{1/3}Nb_{2/3})O_3$—$Pb(Zn_{1/3}Nb_{2/3})O_3$—$PbTiO_3$—$PbZrO_3$ fabricated by firing was cut into a rectangular parallelepiped of 36 mm long, 7 mm wide and 1 mm in thickness to form the piezoelectric ceramics substrate 10. Subsequently, the primary side of the piezoelectric ceramics substrate 10 was fabricated in a manner similar to that used in the nineteenth embodiment. The secondary-side electrode 95 which was 10 mm long and 1 mm wide extended from the secondary-side end surface 17 along the lateral end surface 18. The secondary-side electrode 96 which was 10 mm long and 1 mm wide extended from the secondary-side end surface 17 along the lateral end surface 19. The space between the secondary-side electrodes 95 and 96 was 5 mm, and the secondary-side electrodes 95 and 96 faced each other over a length of 10 mm.

The secondary-side electrode 95 was connected to the negative terminal of a high-voltage DC power source for polarization (not shown), whereas the secondary-side electrode 96 was connected to the positive terminal of this high-voltage DC power source. With this connection, a voltage of 10 kV was applied to polarize the secondary-side region "b" in the widthwise direction of the substrate in silicon oil at temperature of 100° C.

Figure 30:
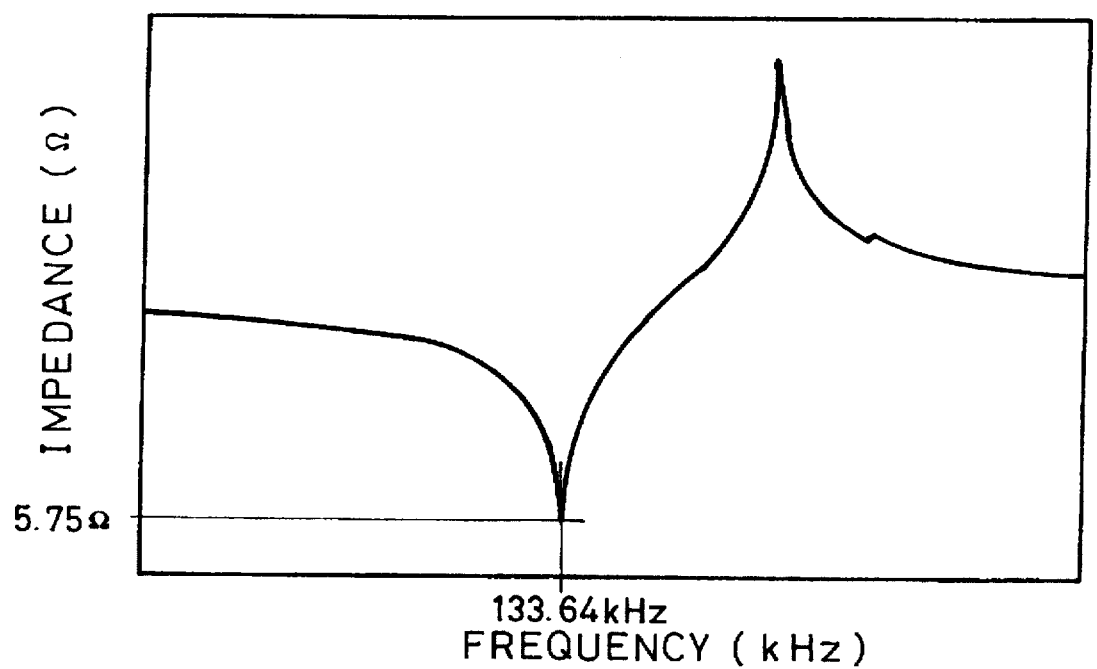
FIG. 30 is a graph showing the primary-side impedance characteristic of a piezoelectric transformer element according to the twenty-eighth embodiment suspended with lead wires.
Figure 32:
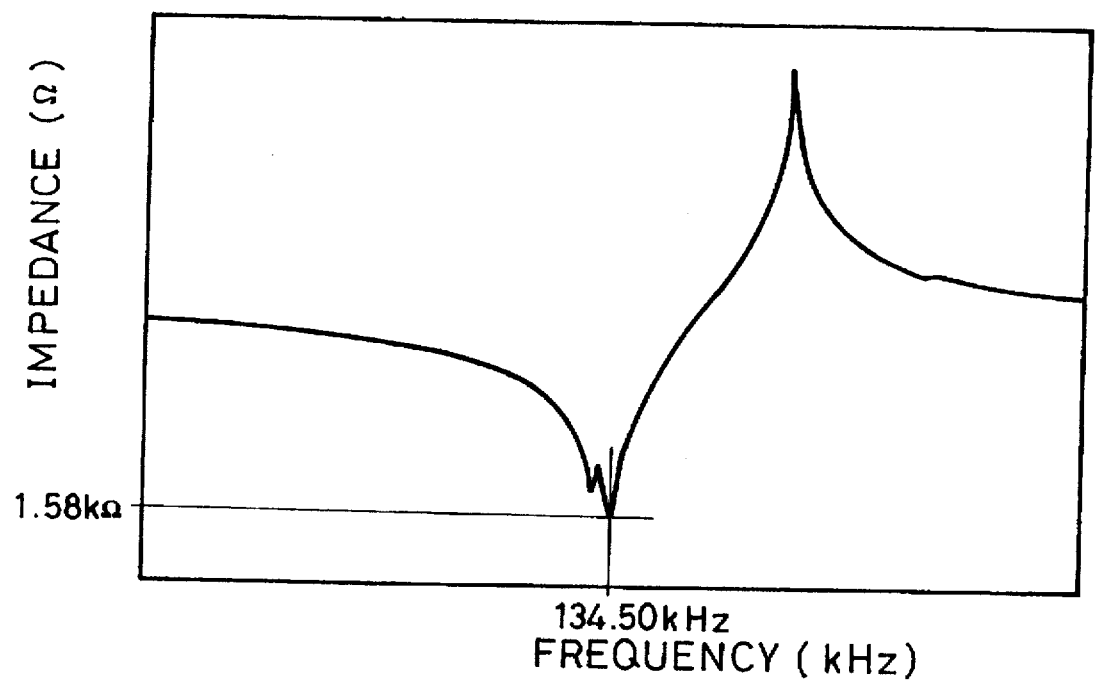
FIG. 32 is a graph showing the secondary-side impedance characteristic of a piezoelectric transformer element according to the twenty-eighth embodiment suspended with lead wires.

The impedance characteristics of the primary and secondary side regions of the piezoelectric transformer element 100 were measured while it was suspended with lead wires. FIG. 30 shows the impedance characteristics of the primary side, and FIG. 32 shows the impedance characteristics of the secondary side.

As shown in FIG. 29, one end of the lead frame 1081 is fixedly connected to the primary-side electrode 61 via the connecting portion 161 by welding. One end of the lead frame 1082 is fixedly connected to the secondary-side electrode 62 via the connecting portion 162 by welding. One end of the lead frame 1083 is fixedly connected to a primary-side electrode 95 via a connecting portion 195 by welding. One end of the lead frame 1084 is fixedly connected to a primary-side electrode 96 via a connecting portion 196 by welding.

Figure 31:
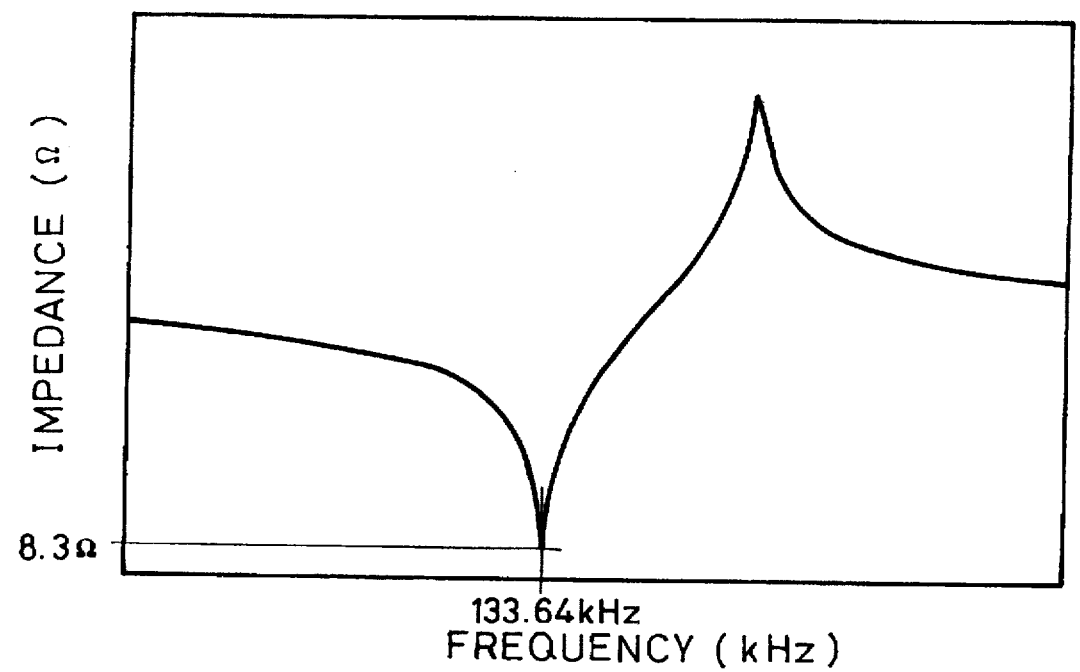
FIG. 31 is a graph showing the primary-side impedance characteristic of the piezoelectric transformer element according to the twenty-eighth embodiment mounted as shown in FIG. 29.
Figure 33:
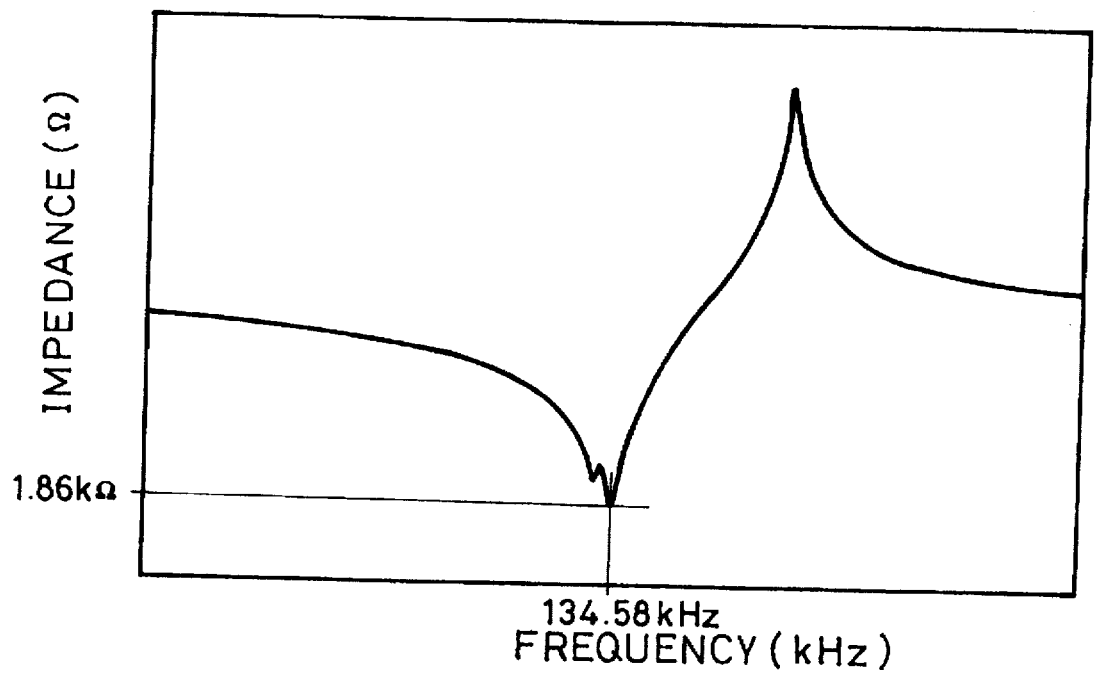
FIG. 33 is a graph showing the secondary-side impedance characteristic of the piezoelectric transformer element according to the twenty-eighth embodiment mounted as shown in FIG. 29.

In this state, the impedance characteristics of the primary and secondary side regions of the piezoelectric transformer element 100 were measured. FIG. 31 shows the impedance characteristics of the primary side. FIG. 33 shows the impedance characteristics of the secondary side. When compared with the impedance characteristics, shown in FIG. 30 and FIG. 32 which was obtained while the piezoelectric transformer element 100 was suspended with the lead wires, there was a slight increase in resonance impedance which was, however, practically negligible. Further, no spurious was observed, and superior characteristics were exhibited.

Then, one end of a power source (not shown) was connected to the primary-side electrode 61 via the lead frame 1081, and the other end of the power source (not shown) was connected to the primary-side electrode 62 via the lead frame 1082. The secondary-side electrode 95 was connected to one end of a load (not shown) via the lead frame 1083. The other end of the load (not shown) was connected to the primary-side electrode 96 via the lead frame 1084. The load used in this embodiment was a CFL of 225 mm long and 2.6 mm in diameter for use in A4-size notebook personal computers.

A voltage having a frequency of 130 kHz was applied from the power source (not shown) to the piezoelectric transformer element 100. In this embodiment, a luminance of 30,000 cd/m$^2$ was obtained in the CFL at an input voltage of 30 V$_{rms}$. It was possible to initiate lighting of the CFL at an input voltage of approximately 18 V$_{rms}$.

Figure 34:
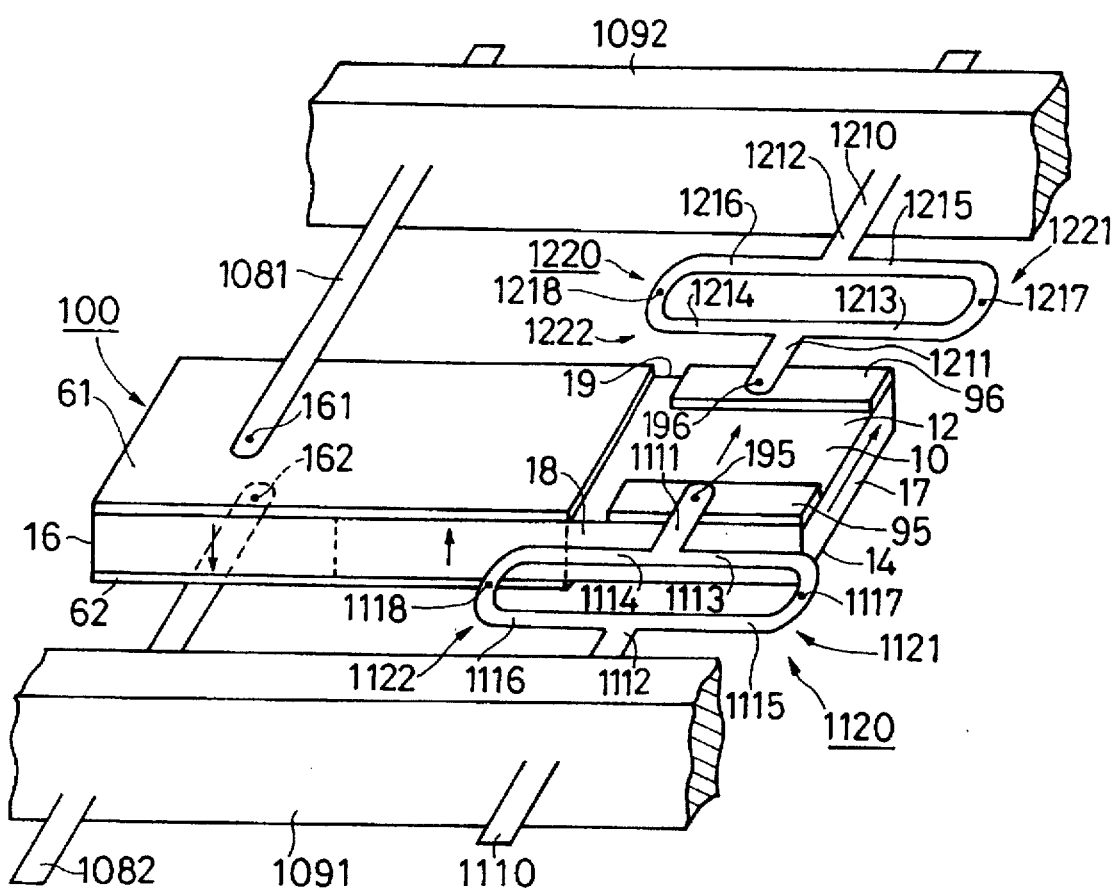
FIG. 34 is a perspective view for explaining a piezoelectric transformer according to a twenty-ninth embodiment of the present invention.

Twenty-ninth embodiment:

FIG. 34 is a perspective view for explaining a piezoelectric transformer according to a twenty-ninth embodiment of the present invention.

The piezoelectric transformer element 100 is supported by lead frames 1081, 1082, 1110, and 1210. The lead frames 1082 and 1110 are supported by the supporting member 1091. The lead frames 1081 and 1210 are supported by the supporting member 1092. The lead frames 1081, 1082, 1110, and 1210 are disposed in the direction perpendicular to the longitudinal direction of the piezoelectric ceramics substrate 10.

One end of the lead frame 1081 is fixedly connected to the primary-side electrode 61 via the connecting portion 161 located at a point which is the vibrational node in the longitudinal and is also the vibrational node in the lateral directions of the substrate by welding. The other end of the lead frame 1081 is fixedly connected to the supporting member 1092. One end of the lead frame 1082 is fixedly connected to the secondary-side electrode 62 via the connecting portion 162 located so as to be opposite to the connecting portion 161 by welding. The other end of the lead frame 1082 is fixedly connected to the supporting member 1091. In this way, the connecting portions 161 and 162 are provided at a point which is the vibrational node in the longitudinal direction and is also the vibrational node in the lateral direction, and therefore it is possible to minimize obstruction to vibration of the piezoelectric transformer element 100 in the widthwise direction thereof occurred when the lead frames 1081 and 1082 are connected to the piezoelectric transformer element 100.

The connecting portion 195 between the secondary-side electrode 95 and the lead frame 1110 and the connecting portion 196 between the secondary-side electrode 96 and the lead frame 1210 are provided in the vibrational node 216 in the longitudinal direction of the piezoelectric ceramics substrate 10. Therefore, it is possible to minimize obstruction to vibration of the piezoelectric transformer element 100 in the longitudinal direction thereof occurred when the lead frames 1110 and 1210 are connected to the piezoelectric transformer element 100.

The portion of the piezoelectric ceramics substrate 10 between the secondary-side electrodes 95 and 96 is polarized in the widthwise direction of the piezoelectric ceramics substrate. Therefore, the portion of the piezoelectric ceramics substrate 10 between the secondary-side electrodes 95 and 96 is coupled, by a Poisson's ratio, to the resonance in the longitudinal direction excited by the portions of the piezoelectric ceramics substrate 10 between the primary-side electrodes 61 and 62. As a result, the portion between the secondary-side electrodes 95 and 96 vibrates in the widthwise direction of the piezoelectric ceramics substrate 10. Consequently, the vibrational node in the widthwise direction matches the lateral center of the piezoelectric ceramics substrate 10, and the connecting portion 195 between the secondary-side electrode 95 and the lead frame 1110 and the connecting portion 196 between the secondary-side electrode 96 and the lead frame 1210 are not located in the vibrational node in the widthwise direction of the piezoelectric ceramics substrate 10.

In this embodiment, the lead frames 1110 and 1210 are provided with resilient structure portions 1120 and 1220, respectively. Due to vibration of the piezoelectric transformer element 100 in the widthwise direction thereof, sub-lead frames 1113 and 1115 vibrate in the widthwise direction of the piezoelectric ceramics substrate 10 such that they bend about a point 1117, and sub-lead frames 1114 and 1116 vibrate in the widthwise direction of the piezoelectric ceramics substrate 10 such that they bend about a point 1118. Hence, obstruction to vibration in the widthwise direction of the piezoelectric transformer element 100 is reduced.

In the present embodiment, the lead frame of the secondary-side electrode is provided with a ring-shaped resilient structure portion 1220 consisting of the sub-lead frames 1216, 1218, 1213, and 1215 as a resilient structure portion. However, the resilient portion may be replaced with, for example, a U-shaped resilient portion 1222 which is similar to the half of the ring-shaped structure and consists of the sub-lead frames 1216 and 1218.

Figure 35:
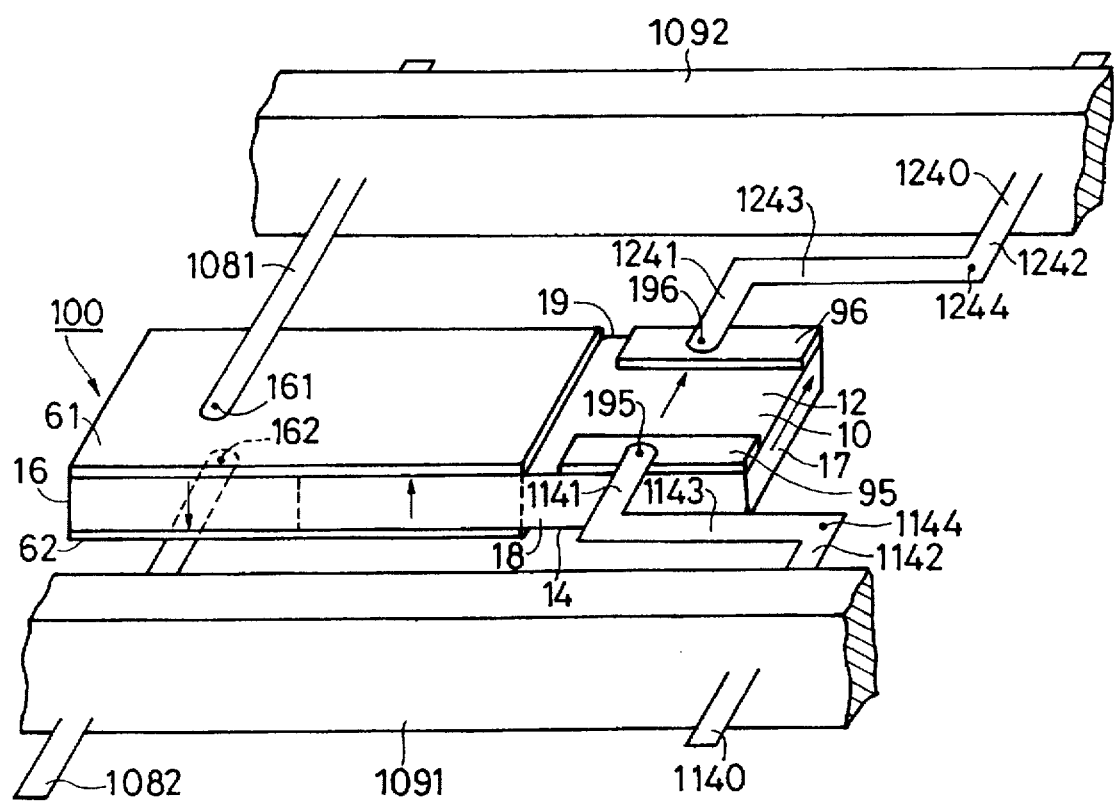
FIG. 35 is a perspective view for explaining a piezoelectric transformer according to a thirtieth embodiment of the present invention.

Thirtieth embodiment:

FIG. 35 is a perspective view for explaining a piezoelectric transformer according to a thirtieth embodiment of the present invention.

In the present embodiment, the connecting portion 195 between the secondary-side electrode 95 and a lead frame 1140 and the connecting portion 196 between the secondary-side electrode 96 and a lead frame 1240 are not located in the vibrational node in the widthwise direction of the piezoelectric ceramics substrate 10. However, the lead frames 1140 and 1240 are respectively provided with sub-lead frames 1143 and 1243 which extend in the longitudinal direction of the piezoelectric ceramics substrate 10. Corresponding to vibration of the piezoelectric transformer element 100 in the widthwise direction thereof, the sub-lead frames 1143 vibrates as a result of bending action arising around a point 1144, and the sub-lead frames 1243 vibrates as a result of bending action arising around a point 1244. Hence, obstruction to vibration in the widthwise direction of the piezoelectric transformer element 100 is reduced.

Figure 36:
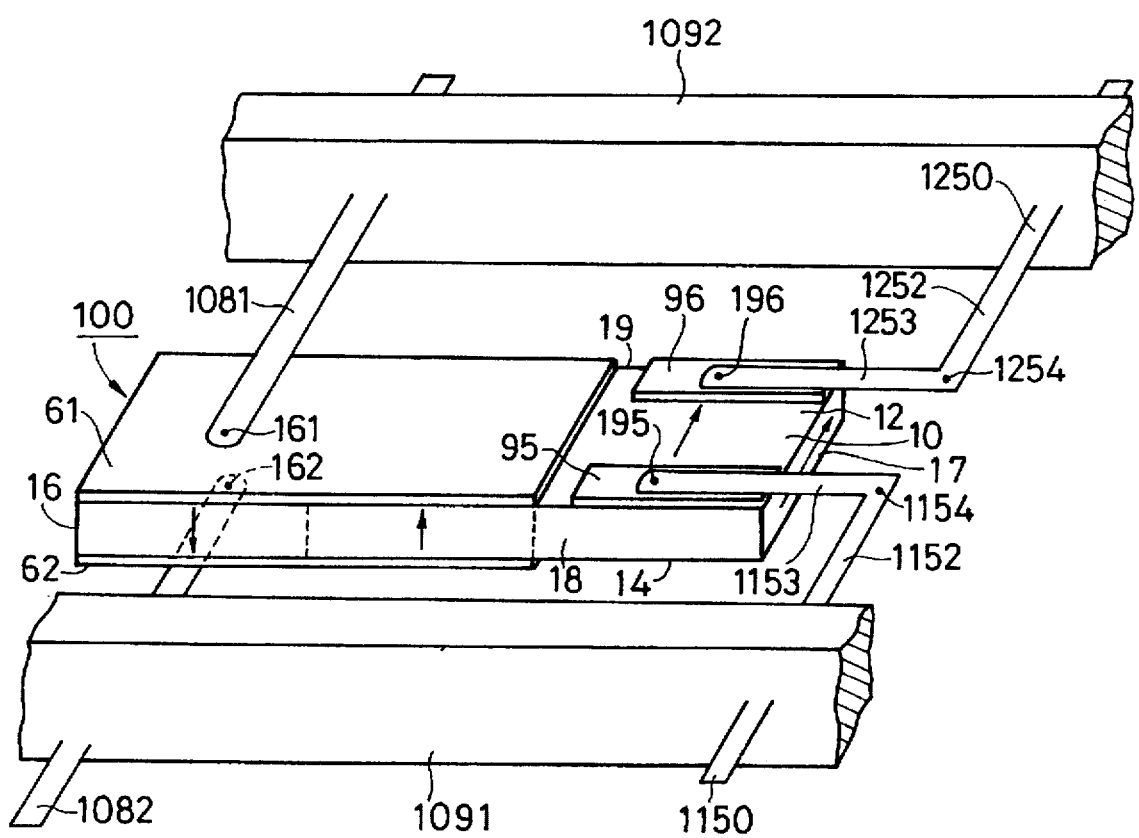
FIG. 36 is a perspective view for explaining a piezoelectric transformer according to a thirty-first embodiment of the present invention.

Thirty-first embodiment:

FIG. 36 is a perspective view for explaining a piezoelectric transformer according to a thirty-first embodiment of the present invention.

In the present embodiment, the connecting portion 195 between the secondary-side electrode 95 and a lead frame 1150 and the connecting portion 196 between the secondary-side electrode 96 and a lead frame 1250 are not located in the vibrational node in the widthwise direction of the piezoelectric ceramics substrate 10. However, the lead frames 1150 and 1250 are respectively provided with sub-lead frames 1153 and 1253 which extend in the longitudinal direction of the piezoelectric ceramics substrate 10. Due to vibration of the piezoelectric transformer element 100 in the widthwise direction thereof, the sub-lead frames 1153 vibrates such that it bends about a point 1154, and the sub-lead frames 1253 vibrates such that it bends about a point 1254. Hence, obstruction to vibration in the widthwise direction of the piezoelectric transformer element 100 is reduced.

In the twenty-ninth to thirty-first embodiments, lead frames 1081, 1082, 1110, 1140, 1150, 1210, 1240 and 1250 can be easily machined by etching or press. These lead frames 1081, 1082, 1110, 1140, 1150, 1210, 1240 and 1250 are preferably made of phosphor bronze into a thickness of 0.15 to 0.2 mm.

Figure 37:
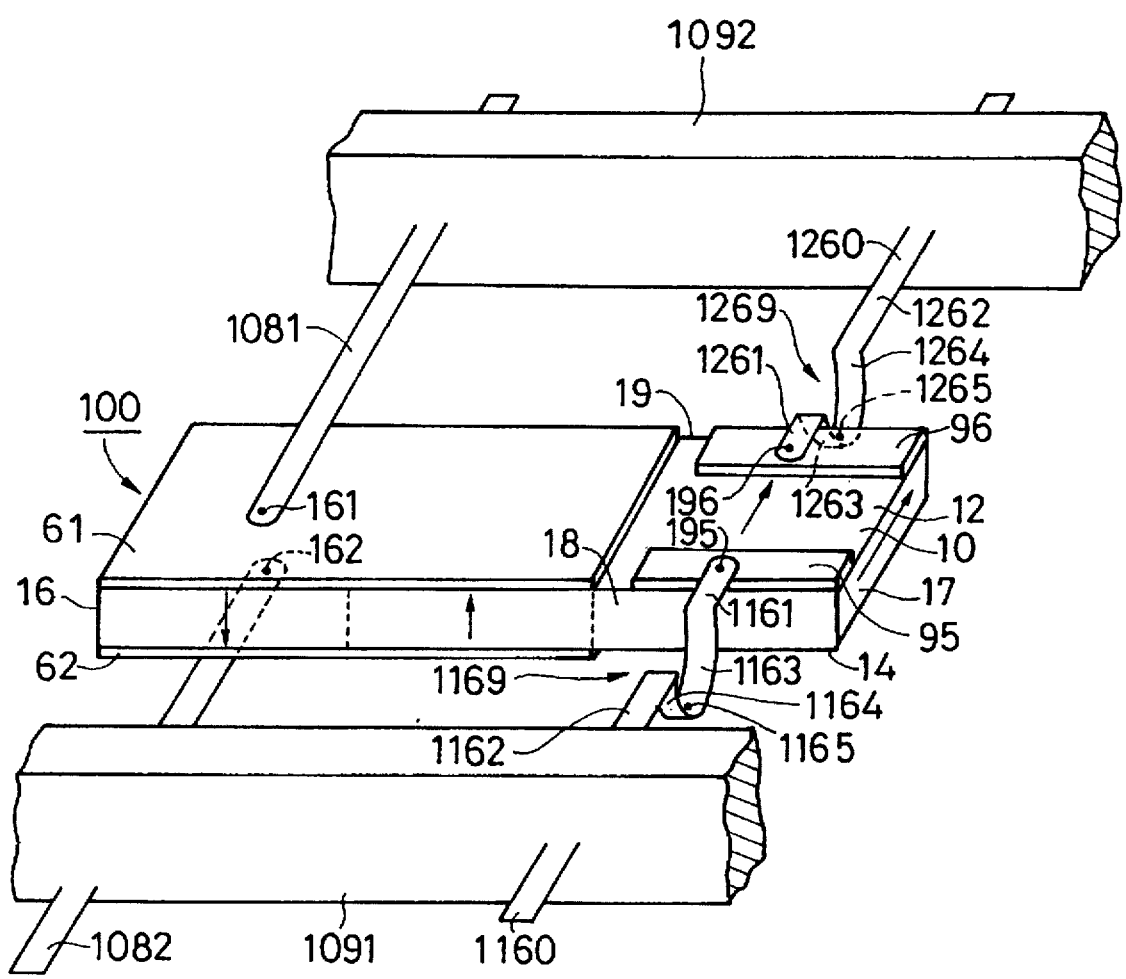
FIG. 37 is a perspective view for explaining a piezoelectric transformer according to a thirty-second embodiment of the present invention.

Thirty-second embodiment:

FIG. 37 is a perspective view for explaining a piezoelectric transformer according to a thirty-second embodiment of the present invention.

In the present embodiment, the connecting portion 195 between the secondary-side electrode 95 and a lead frame 1160 and the connecting portion 196 between the secondary-side electrode 96 and a lead frame 1260 are not located in the vibrational node in the widthwise direction of the piezoelectric ceramics substrate 10. However, the lead frames 1160 and 1260 are respectively provided with resilient structure portions 1169 and 1269. Due to vibration of the piezoelectric transformer element 100 in the widthwise direction thereof, the sub-lead frames 1163 and 1164 vibrate such that they bend about a point 1165, and the sub-lead frames 1263 and 1264 vibrate such that they bend about a point 1265. Hence, obstruction to vibration in the widthwise direction of the piezoelectric transformer element 100 is reduced.

Here, the lead frames 1160 and 1260 are preferably made of iron alloy or phosphor bronze, and have a thickness of 0.15–0.2 mm.

Although the piezoelectric transformer element 100 used in the twenty-eight embodiment was also used in the twenty-ninth through thirty-second embodiments, these embodiments may be applicable to piezoelectric transformer elements in which the secondary-side region is polarized in the widthwise direction.

Figure 38:
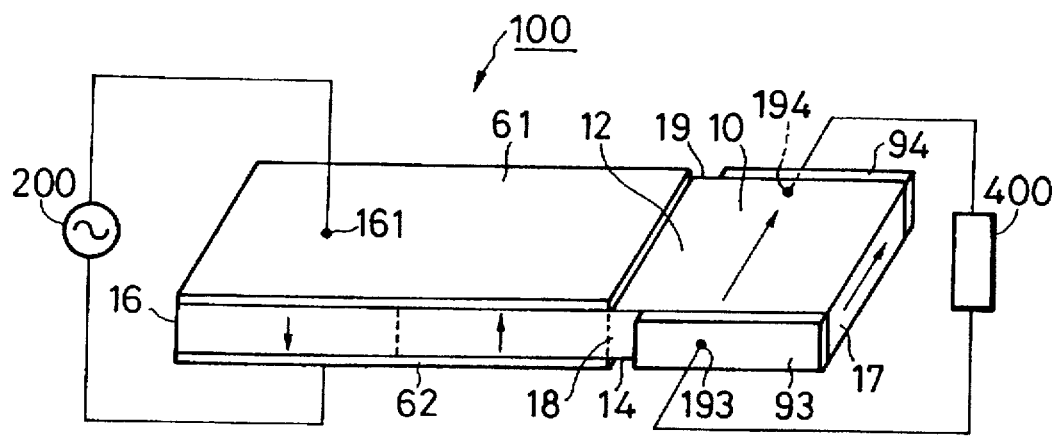
FIG. 38 is a perspective view for explaining a piezoelectric transformer element according to a thirty-third embodiment of the present invention.

Thirty-third embodiment:

FIG. 38 is a perspective view showing a piezoelectric transformer element according to a thirty-third embodiment of the present invention. This embodiment is the same as the twenty-eighth embodiment shown in FIG. 29 except that the secondary-side electrodes 93 and 94 are respectively provided on the end surfaces 18 and 19 of the piezoelectric ceramics substrate 10 such that they extend to a point at a little less than third of the longitudinal length of the piezoelectric ceramics substrate 10 from the secondary end surface 17.

Figure 39:
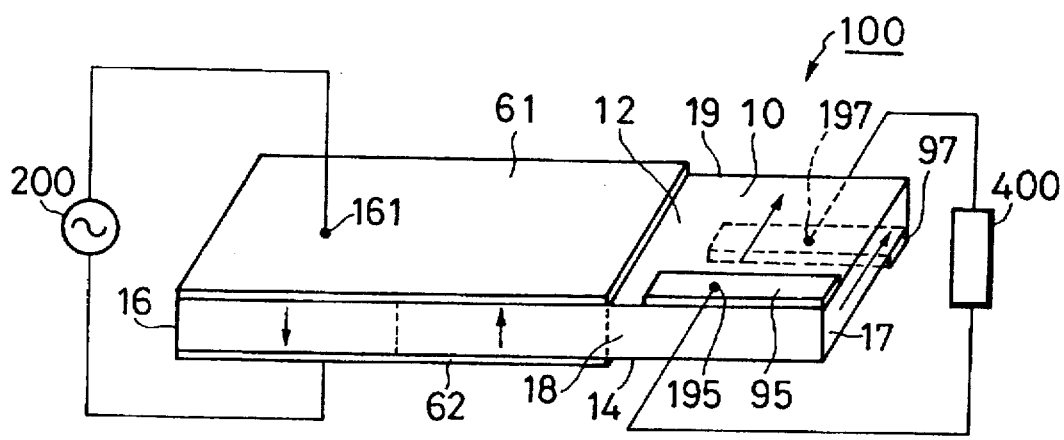
Figure 39:
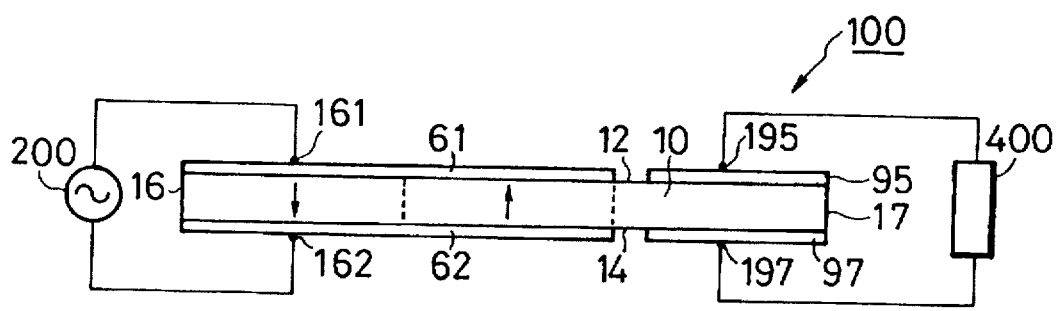

Thirty-fourth embodiment:

FIGS. 39A and 39B are perspective and cross sectional views of a piezoelectric transformer element according to a thirty-fourth embodiment of the present invention.

The present embodiment is the same as the twenty-eighth embodiment shown in FIG. 29 except for the following points. The secondary-side electrode 95 is provided on the top face 12 of the piezoelectric ceramics substrate 10 along the lateral end surface 18 such that it extends to a point at a little less than third of the longitudinal length of the piezoelectric ceramics substrate 10 from the secondary end surface 17. The secondary-side electrode 97 is provided on the bottom face 14 of the piezoelectric ceramics substrate 10 along the lateral end surface 19 such that it extends to a point at a little less than third of the longitudinal length of the piezoelectric ceramics substrate 10 from the secondary end surface 17. Thus, the secondary-side electrode 95 and the secondary-side electrode 97 are arranged to be opposite in the widthwise direction of the piezoelectric ceramics substrate 10, and they are separated from the primary-side electrodes 61 and 62 in the longitudinal direction of the piezoelectric ceramics substrate 10, respectively.

In the present embodiment, the secondary-side electrode 95 is disposed on the top face 12 of the piezoelectric ceramics substrate 10, and hence it can be formed through the same film-forming process as the primary-side electrode 61. The secondary-side electrode 97 is disposed on the bottom face 14 of the piezoelectric ceramics substrate 10, and hence it can be formed through the same film-forming process as the primary-side electrode 62. Further, the lead wires or lead frames are connected to only the top and bottom faces 12 and 14 of the piezoelectric ceramics substrate, which makes it possible to simplify the shapes of the lead wires or lead frames.

Figure 40A:
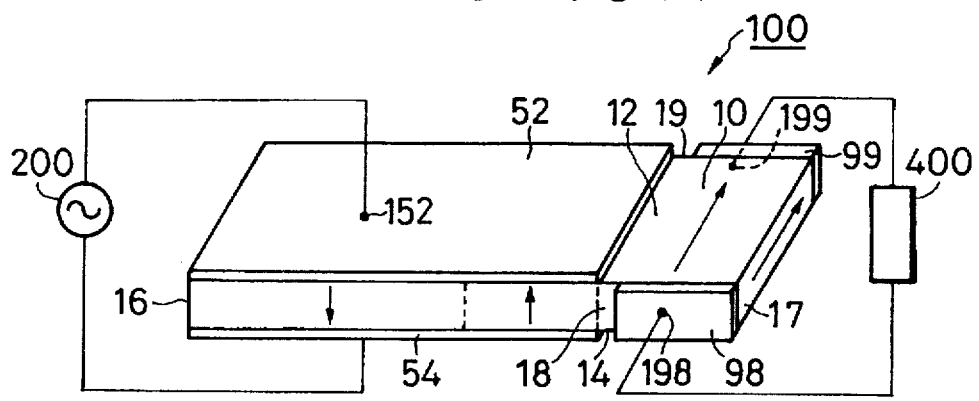
Figure 40B:
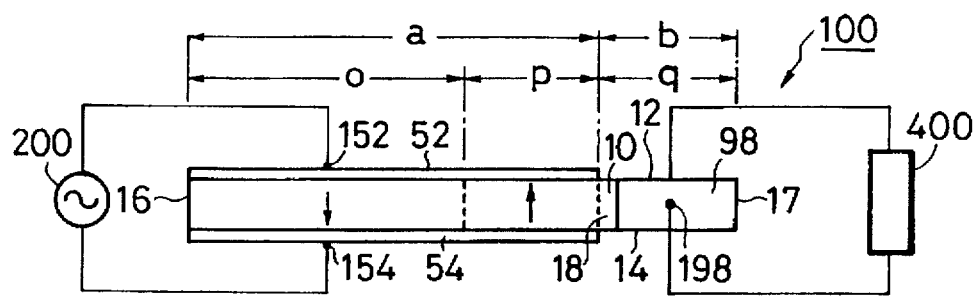

Thirty-fifth embodiment:

As shown in FIGS. 40A and 40B, a primary-side electrode 52 is disposed on the top face 12 of the rectangular parallelepipedic piezoelectric ceramics substrate 10 so as to cover the left three-fourth thereof, and another primary-side electrode 54 is provided on the bottom face 14 of the piezoelectric ceramics substrate 10 so as to be opposite to the primary-side electrode 52, whereby a portion of the piezoelectric ceramics substrate 10 sandwiched between the primary-side electrodes 52 and 54, i.e., the area designated as a primary-side region "a", is polarized in a thicknesswise direction of the piezoelectric ceramics substrate 10 between the top face 12 and the bottom face 14. A portion of the piezoelectric ceramics substrate 10 between the primary-side end surface 16 and a position at half of the longitudinal length of the substrate from the primary-side end surface 16, that is, a region "o", is polarized in downward direction. Another portion of the piezoelectric ceramics substrate 10 between the position at half of the longitudinal length of the substrate from the primary-side end surface 16 and a position at ¾ of the longitudinal length of the substrate from the primary-side end surface 16, that is, a region "p", is polarized in the upward direction of the piezoelectric ceramics substrate 10. In this way, the regions "o" and "p" of the piezoelectric ceramics substrate 10 have opposite directions of polarization to each other.

The secondary-side electrodes 98 and 99 are disposed on the lateral end surfaces 18 and 19 in a portion of the piezoelectric ceramics substrate 10 between the position at ¾ of the longitudinal length of the substrate from the primary-side end surface 16 and the secondary-side end surface 17, that is, a secondary-side region "b". These secondary-side electrodes 98 and 99 extend to a little less than quarter of the longitudinal length of the piezoelectric ceramics substrate 10 from the secondary-side end surface 17. These secondary-side elements 98 and 99 are separated from the primary-side electrodes 52 and 54 by a predetermined distance. A portion of the piezoelectric ceramics substrate 10 between the secondary-side electrodes 98 and 99 is polarized in the widthwise direction of the piezoelectric ceramics substrate 10.

One end of the power source 200 is connected to the primary-side electrode 52 via the connecting portion 152. The other end of the power source 200 is connected to the primary-side electrode 54 via the connecting portion 154.

A secondary-side electrode 98 is connected to one end of the load 400 via a connecting portion 198, and a secondary-side electrode 99 is connected to the other end of the load 400 via a connecting portion 199.

Figure 40C:
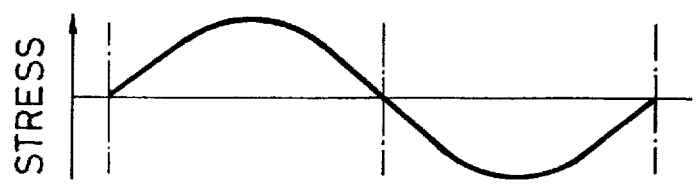
Figure 40D:
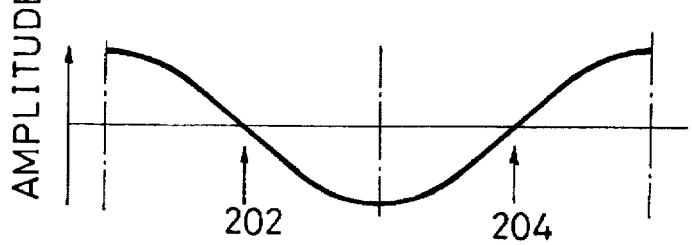

The piezoelectric transformer element 100 can be actuated at such a frequency that the piezoelectric transformer element 100 operates in one wavelength mode as shown in FIGS. 40C and 40D. Nodes of vibration appear at two positions: namely, a position (node 202) at ¼ of the longitudinal length of the piezoelectric ceramics substrate 10 from the primary-side end surface 16 and a position (node 204) at ¾ of the longitudinal length of the piezoelectric ceramics substrate 10 from the end surface 16. In the present embodiment, the connecting portions 152 and 154 are provided in the vibrational node 202.

In the present embodiment, the primary-side electrodes 52 and 54 extend from the primary-side end surface 16 to the position at ¾ of the longitudinal length of the piezoelectric ceramics substrate 10 from the primary-side end surface 16. Consequently, the area of the primary-side electrodes increases, and the input impedance of the piezoelectric transformer element 100 becomes correspondingly smaller. As a result, electrical energy from the power source 200 is more readily fed to the piezoelectric transformer element 100.

The stress developed in the region "o" is oriented in the direction from the bottom face 14 toward the top face 12 of the piezoelectric ceramics substrate 10, whereas the stress developed in the region "p" is oriented in the direction from the top face 12 toward the bottom face 14 of the same. Thus, these regions "o" and "p" of the piezoelectric ceramics substrate 10 have opposite directions of polarization to each other but receive electrical fields in the same direction. For these reasons, when a voltage is applied from the power source 200 between the primary-side electrodes 52 and 54, the region "p" of the piezoelectric ceramics substrate 10 vibrates so as to enhance resonance resulting from application of a voltage to the region "o" from the power source 200 to a much greater extent. As a result, the electrical energy fed from the power source 200 can be more efficiently converted into mechanical elastic energy at the primary-side region.

In this way, the secondary-side electrodes 98 and 99 are separated from the primary-side electrodes 52 and 54 in terms of direct current. Independent ground electrodes are formed for the secondary-side and primary-side circuits (for example, the primary-side electrode 54 and the secondary-side electrode 98 are used as ground electrodes which are independent of each other). Consequently, the grounds of the primary-side circuit and the secondary-side circuit can be insulated from each other, and it becomes possible to maintain the secondary side in a floated state without grounding (for example, the secondary-side electrode 98 is floated without grounding), thereby resulting in improved noise resistance.

Even in this embodiment, the piezoelectric transformer element 100 is supported at the vibrational node 202, thereby minimizing obstruction to vibration of the piezoelectric transformer element 100 occurred when it is supported.

Figure 41A:
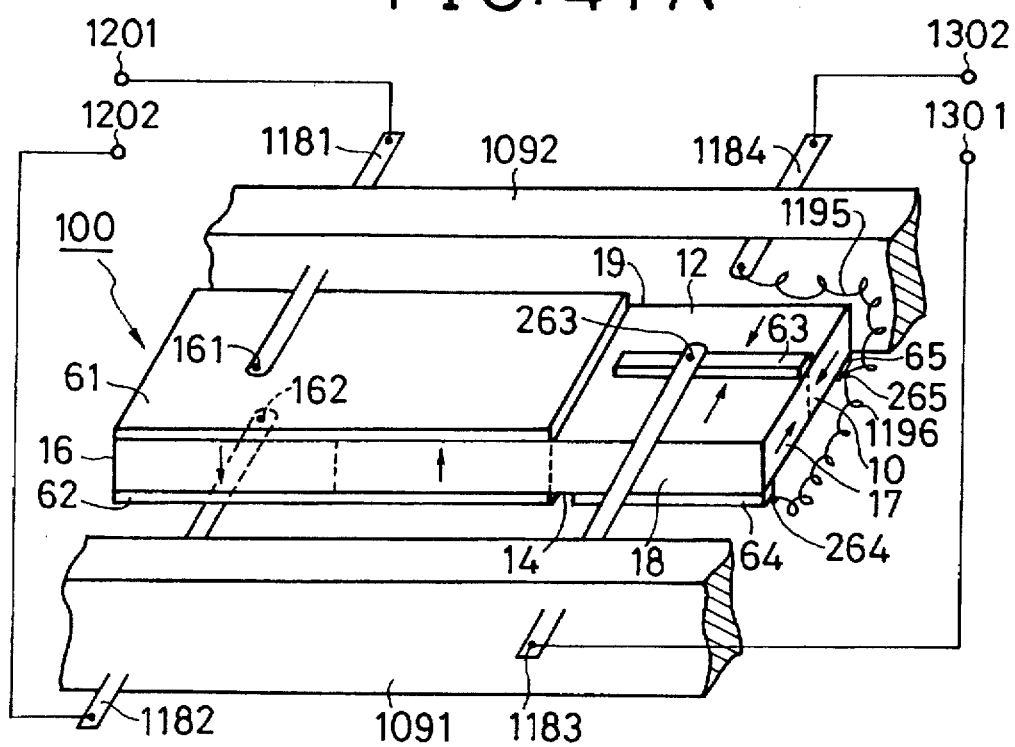

Thirty-sixth embodiment:

As shown in FIG. 41A, the primary-side electrode 61 is disposed on the top face 12 of the rectangular parallelepipedic piezoelectric ceramics substrate 10 so as to cover the left two-thirds thereof, and the primary-side electrode 62 is provided on the bottom face 14 of the piezoelectric ceramics substrate 10 so as to be opposite to the primary-side electrode 61, whereby a portion of the piezoelectric ceramics substrate 10 sandwiched between the primary-side electrodes 61 and 62, i.e., the area designated as a primary-side region "a", is polarized in a thicknesswise direction of the piezoelectric ceramics substrate 10 between the top face 12 and the bottom face 14. A portion of the piezoelectric ceramics substrate 10 between the primary-side end surface 16 and a position at a third of the longitudinal length of the substrate from the primary-side end surface 16, that is, a region "k", is polarized in the downward direction. Another portion of the piezoelectric ceramics substrate 10 between the position at a third of the longitudinal length of the substrate from the primary-side end surface 16 and a position at ⅔ of the longitudinal length of the substrate from the primary-side end surface 16, that is, a region "l", is polarized in the upward direction. In this way, the regions "k" and "l" of the piezoelectric ceramics substrate 10 have opposite directions of polarization to each other.

The secondary-side electrodes 64 and 65 are disposed on the bottom surface 14 along the lateral end surfaces 18 and 19 within the portion of the piezoelectric ceramics substrate 10 between the position at ⅔ of the longitudinal length of the substrate from the primary-side end surface 16 and the secondary-side end surface 17, that is, a secondary-side region "b". These secondary-side electrodes 64 and 65 are arranged such that they face each other in the widthwise direction of the piezoelectric ceramics substrate 10, and extend to a little less than third of the longitudinal length of the piezoelectric ceramics substrate 10 from the secondary-side end surface 17. These secondary-side electrodes 64 and 65 are respectively separated from the primary-side electrode 62 by a predetermined distance.

In the portion (secondary-side region "b") between the position at ⅔ of the longitudinal length of the piezoelectric ceramics substrate 10 from the primary-side end surface 16 and the secondary-side end surface 17, the secondary-side electrode 63 is disposed on the top face 12 of the piezoelectric ceramics substrate 10 at the center portion in the widthwise direction such that the secondary-side electrode 63 faces the secondary-side electrodes 64 and 65 in the widthwise direction of the piezoelectric ceramics substrate 10. The secondary-side electrode 63 extends in the longitudinal direction from the secondary-side end surface 17 to a position at a little less than a third of the longitudinal length of the piezoelectric ceramics substrate 10 from the secondary-side end surface 17. In other words, the secondary-side electrode 63 is separated from the primary-side electrode 61 by a predetermined distance.

The secondary-side electrode 63 extending from the secondary-side end surface 17 has the same length as the secondary-side electrodes 64 and 65 extending from the secondary-side end surface 17.

A portion of the secondary-side region "b" between the secondary-side electrodes 64 and 63 and another portion of the secondary-side region "b" between the secondary-side electrodes 65 and 63 are polarized in opposite widthwise directions of the piezoelectric ceramics substrate 10.

Figure 41B:
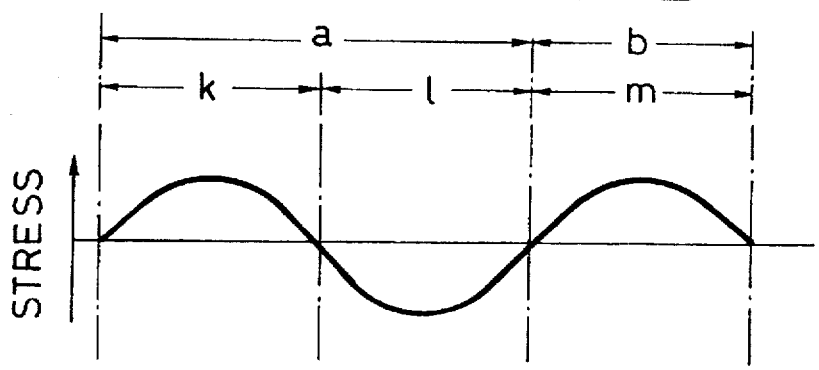
Figure 41C:
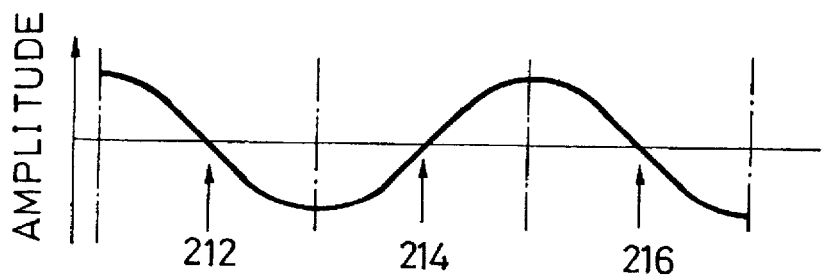

When a voltage is applied between the primary-side electrodes 61 and 62, an electrical field is applied to the left two-thirds of the piezoelectric ceramics substrate 10 in its thicknesswise direction (that is, the primary-side region "a") which brings about longitudinal vibration in the longitudinal direction as a result of a piezoelectric transverse effect involving a displacement perpendicular to the direction of polarization, whereby the overall piezoelectric transformer element 100 vibrates. The piezoelectric transformer element of the present embodiment can be actuated in such a resonance mode that one and a half wavelength of stress distribution exists between the primary-side end surface 16 and the secondary-side end surface 17. A voltage having a frequency equal to a resonance frequency in the one and a half wavelength mode is applied between the primary-side electrodes 61 and 62. The primary-side and secondary-side end surfaces 16 and 17 of the piezoelectric ceramics substrate 10 are open, and therefore zero stress and the maximum amplitude appear at both longitudinal ends of the piezoelectric ceramics substrate 10. Further, in the present embodiment, the piezoelectric ceramics substrate 10 can resonate in the one and a half wavelength mode, and hence stress and amplitude distributions are obtained as respectively shown in FIGS. 41B and 41C.

If the piezoelectric ceramics substrate 10 is actuated in such a one and a half wavelength mode, nodes of the vibration appear at three positions, namely, a position (node 212) at ⅙ of the longitudinal length of the piezoelectric ceramics substrate 10 from the primary-side end surface 16, a position (node 214) at ½ of the longitudinal length of the piezoelectric ceramics substrate 10 from the primary-side end surface 16, and a position (node 216) at ⅚ of the longitudinal length of the piezoelectric ceramics substrate 10 from the primary-side end surface 16. In the present embodiment, the connecting portions 161 and 162 are provided in the vibrational node 212, and the connecting portion 263 is provided in the vibrational node 216.

The primary-side electrodes 61 and 62 are extended in the primary-side region "a" so as to cover the regions "k" and "l" where stress arises in opposite directions. These regions "k" and "l" have different directions of polarization but have the same direction of application of an electrical field. As a result, the input impedance of the piezoelectric transformer element 100 becomes smaller, and the electrical energy from a power source (not shown) connected between the primary-side terminals 1201 and 1202 is more readily fed to the piezoelectric transformer element 100. Further, the electrical energy can be more efficiently converted to mechanical elastic energy at the primary-side region "a". For these reasons, the effective voltage step-up ratio of the piezoelectric transformer element 100 can be increased.

Compared with a piezoelectric transformer element in which the portion of the secondary-side region "b" between the secondary-side electrodes 64 and 65 is polarized in only any one direction, the distance between the secondary-side electrodes becomes half, the area of the electrodes becomes double, the capacitance of the secondary-side region is increased to four times, and the output impedance of the piezoelectric transformer element 100 is reduced to a quarter. As the output impedance of the piezoelectric transformer element 100 becomes smaller, voltage applied to a load connected between secondary-side terminals 1301 and 1302 is correspondingly increased, which makes it possible for the piezoelectric transformer element to actuate a load having a low impedance.

The distance between the secondary-side electrodes is short, thereby reducing an absolute voltage to be applied for polarization. Consequently, a countermeasure against high voltages becomes easy to implement, and a power source outputting a lower voltage can be employed for polarization.

Figure 42:
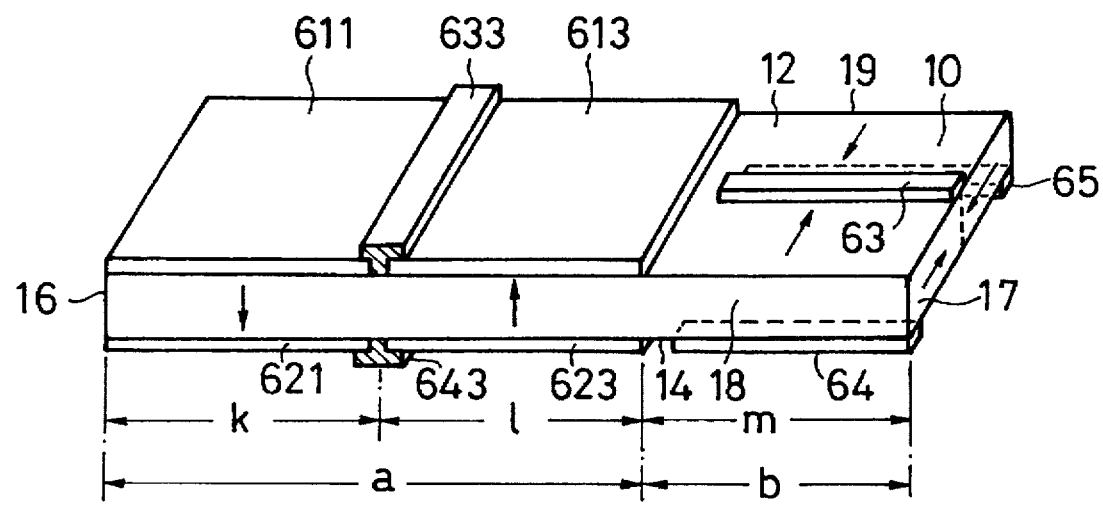
FIG. 42 is a perspective view for explaining a manufacturing method for the piezoelectric transformer element according to the thirty-sixth embodiment.

Manufacture of the piezoelectric transformer element 100 of the present embodiment will now be described with reference to FIG. 42.

In the present embodiment, the primary-side electrode 611 is formed on the top face 12 in the region "k" of the piezoelectric ceramics substrate 10 by screen printing. Similarly, the primary-side electrode 621 is formed on the bottom face 14 in the region "k" of the same, the primary-side electrode 613 is formed on the top face 12 in the region "l" of the same, the primary-side electrode 623 is formed on the bottom face 14 in the region "l" of the same, the secondary-side electrode 63 is formed on the top face 12 at the center of the secondary-side region "b", and the secondary-side electrodes 64 and 65 are formed on the bottom face 14 in the secondary-side region "b".

Subsequently, the primary-side electrodes 611 and 621 are connected to the positive terminal of a high-voltage DC power source (not shown) for polarization purposes, and the primary-side electrodes 613 and 623 are connected to the negative terminal of another high-voltage DC power source (not shown). With this connection, a high voltage is applied from the respective high-voltage DC power sources to polarize the regions "k" and "l" in the thicknesswise direction of the substrate.

On the other hand, the secondary-side electrodes 64 and 65 are connected to one end of a high-voltage DC power source (not shown) for polarization purposes, whereas the secondary-side electrode 63 is connected to the other end of the same high-voltage DC power source (not shown). With this connection, a high voltage is applied to laterally polarize the secondary-side region "b".

The primary-side electrodes 611 and 613 were connected together via conductive paste 633 to make the primary-side electrode 61 shown in FIG. 41A. The primary-side electrodes 621 and 623 are connected together via conductive paste 643 to make the primary-side electrode 62 as shown in FIG. 41A.

Although the primary-side electrodes 611, 613, 621, and 623 are connected together using the conductive paste, they may be electrically connected together using lead wires instead of the conductive paste.

Figure 43A:
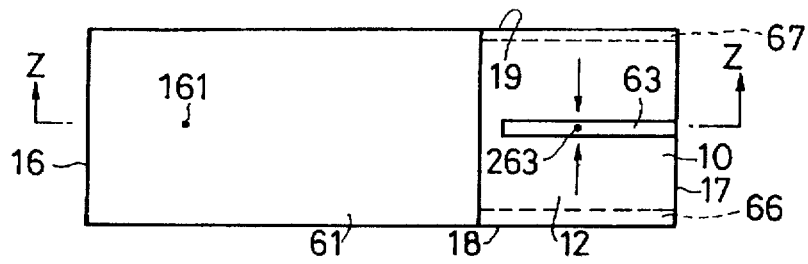
Figure 43B:
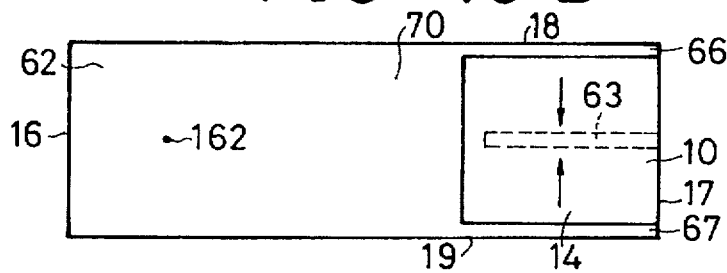
Figure 43C:
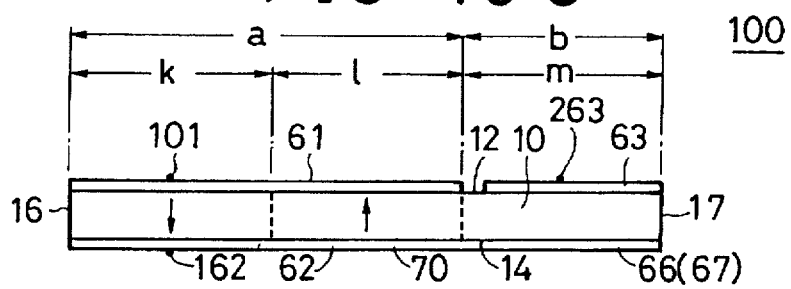
Figure 43D:
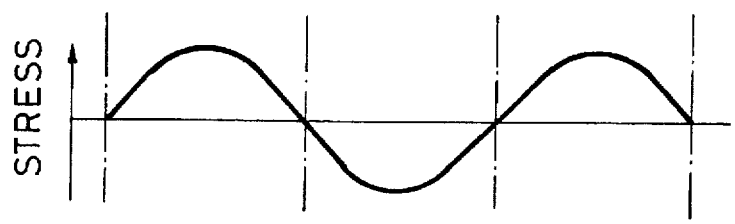
Figure 43E:
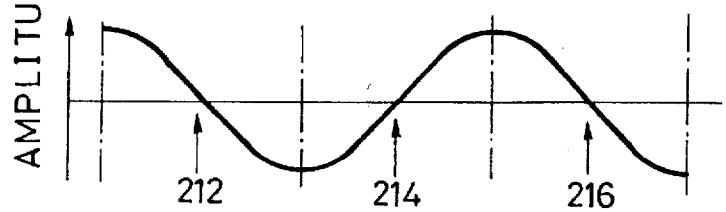

Thirty-seventh embodiment:

FIGS. 43A to 43E are schematic representations and waveforms for explaining a piezoelectric transformer element according to a thirty-seventh embodiment of the present invention. FIG. 43A is a top view, FIG. 43B is a bottom view, FIG. 43C is a cross section taken along line X—X shown in FIG. 43A, FIG. 43D is a waveform showing a stress distribution obtained when the transformer is actuated in a 1.5 wavelength mode, and FIG. 43E is a waveform showing an amplitude distribution.

In this way, a ground electrode 70 serving as the secondary-side electrodes 66 and 67 and the primary-side electrode 62 is disposed on the bottom face 14 of the piezoelectric ceramics substrate 10. As a result of this configuration, it does not need to provide the secondary-side electrodes 66 and 67 with external connections using lead wires. The secondary-side electrode 63 is connected to a lead frame (not shown) via a connecting portion 263.

Although two regions on the primary side are polarized in opposite directions in the present embodiment, these two regions may be polarized in the same direction, and electrodes provided in one of the regions may be connected to electrodes provided on the opposite side of the other region, respectively.

What is claimed is:

1. A piezoelectric transformer comprising:

a substantially parallelepipedic piezoelectric substrate having a first main face, a second main face opposed to said first main face, a first end face and a second end face opposed to said first end face, a direction in which one side of said first main face and one side of said second main face extend being taken as a longitudinal direction of said piezoelectric substrate said first and second end faces intersecting to said longitudinal direction, a direction which intersects substantially perpendicularly to said first and second main faces being taken as a thicknesswise direction, said piezoelectric substrate being divided in the longitudinal direction into at least a first primary-side region, a second primary-side region, and a secondary-side region, said first primary-side region including said first end face, said second primary-side region being located between said first primary-side region and said secondary-side region and being adjacent to said first primary-side region, said transformer being able to be driven at a predetermined resonance mode in the longitudinal direction, the length of said first primary-side region in the longitudinal direction being substantially one half of the resonance wavelength of said resonance mode in the longitudinal direction, and the length of said second primary-side region in the longitudinal direction being equal to or less than one half of said resonance wavelength;

a first primary-side electrode and a second primary-side electrode being disposed on said first and second main faces, respectively, of said first primary-side region and opposite to each other, said first primary-side region between said first and second primary-side electrodes being polarized in a predetermined direction along the thicknesswise direction;

a third primary-side electrode and a fourth primary-side electrode being disposed on said first and second main faces, respectively, of said second primary-side region and opposite to each other, said second primary-side region between said third and fourth primary-side electrodes being polarized in the predetermined direction along the thicknesswise direction; and a secondary-side electrode being disposed in said secondary-side region, said secondary-side region being polarized in the longitudinal direction;

wherein the polarization direction of said first primary-side region between said first and second primary-side electrodes is the same as the polarization direction of the second primary-side region between said third and fourth primary-side electrodes when said third primary-side electrode and said second primary-side electrode are electrically connected and said fourth primary-side electrode and said first primary-side electrode are electrically connected, or the polarization direction of said first primary-side region between said first and second primary-side electrodes is opposite to the polarization direction of the second primary-side region between said third and fourth primary-side electrodes when said third primary-side electrode and said first primary-side electrode are electrically connected and said fourth primary-side electrode and said second primary-side electrode are electrically connected.

2. A piezoelectric transformer as recited in claim 1, wherein said second primary-side region between said third primary-side electrode and said fourth primary-side electrode is polarized in the same direction as said first primary-side region between said first primary-side electrode and said second primary-side electrode, said third primary-side electrode and said second primary-side electrode are electrically connected, and said fourth primary-side electrode and said first primary-side electrode are electrically connected.

3. A piezoelectric transformer as recited in claim 1, where said second primary-side region between said third primary-side electrode and said fourth primary-side electrode is polarized in a direction opposite to a direction of polarization of said first primary-side region between said first primary-side electrode and said second primary-side electrode, said third primary-side electrode and said first primary-side electrode are electrically connected, and said fourth primary-side electrode and said second primary-side electrode are electrically connected.

4. A piezoelectric transformer as recited in claim 1, wherein said piezoelectric substrate further comprises:

a third primary-side region and a fourth-primary side region arranged in the longitudinal direction, wherein said third primary-side region is disposed opposite said first primary-side region with respect to said secondary-side region and has a length of substantially one half of the resonance wavelength in the longitudinal direction, wherein a fifth primary-side electrode and a sixth primary-side electrode are disposed on said first and second main faces, respectively, of said third primary-side region and opposite to each other, wherein said third primary-side region between said fifth primary-side electrode and said sixth primary-side electrode is polarized along the thicknesswise direction in the same direction as said first primary-side region is polarized when said sixth primary-side electrode and said first primary-side electrode are electrically connected and said fifth primary-side electrode and said second primary-side electrode are electrically connected, and said third primary-side region between said fifth primary-side electrode and said sixth primary-side electrode is polarized along the thicknesswise direction in the opposite direction to the polarization direction of the first primary-side region when said fifth primary-side electrode and said first primary-side electrode are electrically connected and said sixth primary-side electrode and said second primary-side electrode are electrically connected, said fourth primary-side is provided between said third primary-side region and said secondary-side region and has a length equal to or less than one half of said resonance wavelength in the longitudinal direction, wherein a seventh primary-side electrode and a eighth primary-side electrode are disposed on said first and second main faces, respectively, of said fourth primary-side region and opposite each other, wherein said fourth primary-side region between said seventh primary-side electrode and said eighth primary-side electrode is polarized along the thicknesswise direction in the same direction as the first primary-side region is polarized when said eighth primary-side electrode and said first primary-side electrode are electrically connected and said seventh primary-side electrode and said second primary-side electrode are electrically connected, and said fourth primary-side region between said seventh primary-side electrode and said eighth primary-side electrode is polarized along the thicknesswise direction in the opposite direction to the polarization direction of the first primary-side region when said seventh primary-side electrode and said first primary-side electrode are electrically connected and said eighth primary-side electrode and said second primary-side electrode are electrically connected, wherein said secondary-side electrode is disposed on at least one of said first and second main faces of said secondary-side region, and wherein portions of said secondary region on both sides of said secondary-side electrode are polarized in the longitudinal direction.

5. A piezoelectric transformer as recited in claim 1, wherein said first and second primary-side electrodes are disposed extending in the longitudinal direction from a position located substantially at said first end face to a position located approximately one half the distance between said first end face and said second end face as measured from said first end face, said second primary-side region is polarized in the same direction as said first primary-side region, and said fourth primary-side electrode and said first primary-side electrode are electrically connected, and said third primary-side electrode and said second primary-side electrode are electrically connected.

6. A piezoelectric transformer as recited in claim 1, wherein said first and second primary-side electrodes are disposed extending in the longitudinal direction from said first end face to a position located approximately ⅓ of the distance between said first end face and said second end face as measured from said first end face, said third and fourth primary-side electrodes are disposed extending in the longitudinal direction from a position located approximately ⅓ of the distance between said first end face and said second end face as measured from said first end face to a position located approximately ⅔ or less of the distance between said first end face and said second end face as measured from said first end face, said second primary-side region is polarized in the same direction as said first primary-side region, said fourth primary-side electrode and said first primary-side electrode are electrically connected, and said third primary-side electrode and said second primary-side electrode are electrically connected.

7. A piezoelectric transformer as recited in claim 1, wherein said first and second primary-side electrodes are disposed extending in the longitudinal direction from a position located substantially at said first end face to a position located approximately one half the distance between said first end face and said second end face as measured from said first end face, said second primary-side region is polarized in a direction opposite to the direction of polarization in said first primary-side region, and said third primary-side electrode and said first primary-side electrode are electrically connected, and said fourth primary-side electrode and said second primary-side electrode are electrically connected.

8. A piezoelectric transformer as recited in claim 1, wherein said first and second primary-side electrodes are disposed extending in the longitudinal direction from a point located substantially at said first end face to a position located approximately ⅓ of the distance between said first end face and said second end face as measured from said first end face, said third and fourth primary-side electrodes are disposed extending in the longitudinal direction from a position located approximately ⅓ of the distance between said first end face and said second end face as measured from said first end face to a position located approximately ⅔ or less of the distance between said first end face and said second end face as measured from said first end face, said second primary-side region is polarized in a direction opposite to the direction of polarization in said first primary-side region, said third primary-side electrode and said first primary-side electrode are electrically connected, and said fourth primary-side electrode and said second primary-side electrode are electrically connected.

9. A piezoelectric transformer as recited in claim 1, wherein said first and second primary-side electrodes are disposed extending in the longitudinal direction from said first end face to a position located approximately ⅓ of the length of said piezoelectric substrate in the longitudinal direction as measured from said first end face, said third and fourth primary-side electrodes are disposed extending in the longitudinal direction from a position located approximately ⅓ of the length of said piezoelectric substrate in the longitudinal direction as measured from said first end face to a position located approximately ⅔ of the length of said piezoelectric substrate in the longitudinal direction as measured from said first end face, said secondary-side region is provided between said second primary-side region and said second end face, said second primary-side region is polarized in a thicknesswise direction opposite to the direction of polarization of aid first primary-side region, said first primary-side electrode and said third primary-side electrode are electrically connected, said second primary-side electrode and said fourth primary-side electrode are electrically connected, said secondary-side region includes a first sub-secondary-side region adjacent to said second end face, and a second sub-secondary-side region, said secondary-side electrode is disposed on either of said first and second main faces at a position located approximately ⅙ of the length of said piezoelectric substrate in the longitudinal direction as measured from said second end face, a second secondary-side electrode is disposed on either of said first and second main faces to be in proximity to said second end face or on said second end face of said piezoelectric substrate, said first sub-secondary-side region is located between said second end face and a position located approximately ⅙ of the length of said piezoelectric substrate in the longitudinal direction as measured from said second end face and is polarized in the longitudinal direction, and said second sub-secondary-side region is located between a position located approximately ⅙ of the length of said piezoelectric substrate in the longitudinal direction as measured from said second end face and a position located approximately ⅓ of the length of said piezoelectric substrate in the longitudinal direction as measured from said second end face and is polarized in the opposite longitudinal direction to said first sub-secondary-side region.

10. A piezoelectric transformer as recited in claim 1, wherein said first and second primary-side electrodes are disposed extending in the longitudinal direction from said first end face to a position located approximately ⅓ of the length of said piezoelectric substrate in the longitudinal direction as measured from said first end face, said third and fourth primary-side electrodes are disposed extending in the longitudinal direction from a position located approximately ⅓ of the length of said piezoelectric substrate in the longitudinal direction as measured from said first end face to a position located approximately ⅔ of the length of said piezoelectric substrate in the longitudinal direction as measured from said first end face, said secondary-side region is provided between said second primary-side region and said second end face, said second primary-side region is polarized in the same direction as said first primary-side region is polarized, said first primary-side electrode and said fourth primary-side electrode are electrically connected, said second primary-side electrode and said third primary-side electrode are electrically connected, said secondary-side region includes a first sub-secondary-side region adjacent to said second end face, and a second sub-secondary-side region, said secondary-side electrode is disposed on either of said first and second main faces at a position located approximately ⅙ of the length of said piezoelectric substrate in the longitudinal direction as measured from said second end face, a second secondary-side electrode is disposed on either of said first and second main faces to be in proximity to said second end face or on said second end face of said piezoelectric substrate, said first sub-secondary-side region is located between said second end face and a position located approximately ⅙ of the length of said piezoelectric substrate in the longitudinal direction as measured from said second end face and is polarized in the longitudinal direction, and said second sub-secondary-side region is located between a position located approximately ⅙ of the length of said piezoelectric substrate in the longitudinal direction as measured from said second end face and a position located approximately ⅓ of the length of said piezoelectric substrate in the longitudinal direction as measured from said second end face and is polarized in the opposite longitudinal direction to said first sub-secondary-side region.

11. A piezoelectric transformer as recited in claim 1, wherein at least a third secondary-side electrode is disposed on said secondary-side region such that said third secondary-side electrode is opposite said secondary-side electrode in the longitudinal direction of said piezoelectric substrate, and an output is produced between said secondary-side electrode and said third secondary-side electrode.

12. A piezoelectric transformer as recited in claim 1, wherein an output is measured between said secondary-side electrode and one of said third and fourth primary-side electrodes as a ground electrode.

13. A piezoelectric transformer comprising:

a substantially parallelepipedic piezoelectric substrate which has a first main face, a second main face opposed to the first main face, a first end face and a second end face opposed to said first end face, said first and second end faces intersecting to a first direction in which one side of said first main face extends, a first primary-side electrode and a second primary-side electrode being respectively disposed on said first and second main faces of said piezoelectric substrate extending in the first direction from a position located substantially at said first end face to a position located approximately ⅓ of the distance between said first end face and said second end face as measured from said first end face, said piezoelectric substrate between said first primary-side electrode and said second primary-side electrode being polarized in the thicknesswise direction which direction intersects substantially perpendicularly to said first main face and said second main face;

a third primary-side electrode and a fourth primary-side electrode being respectively disposed on said first and second main faces of said piezoelectric substrate extending in the first direction from a position located approximately ⅓ of the distance between said first end face and said second end face as measured from said first end face to a position located approximately ⅔ of the distance between said first end face and said second end face as measured from said first end face, said piezoelectric substrate between said third primary-side electrode and said fourth primary-side electrode being polarized in the thicknesswise direction, the polarization direction of said piezoelectric substrate between said first and second primary-side electrodes being the same as the polarization direction of said piezoelectric substrate between said third and fourth primary-side electrodes when said third primary-side electrode and said second primary-side electrode are electrically connected and said fourth primary-side electrode and said first primary-side electrode are electrically connected, or the polarization direction of said piezoelectric substrate between said first and second primary-side electrodes being opposite to the polarization direction of said piezoelectric substrate between said third and fourth primary-side electrodes when said third primary-side electrode and said first primary-side electrode are electrically connected and said fourth primary-side electrode and said second primary-side electrode are electrically connected; and a secondary-side electrode being disposed on said second end face or on said first main face to be in proximity to said second end face a portion of said piezoelectric substrate between said secondary-side electrode and said third primary-side electrode being polarized in the first direction.

14. A piezoelectric transformer comprising:

a substantially parallelpipedic piezoelectric substrate having a first main face, a second main face opposed to said first main face, a first end face and a second end face opposed to said first end face, a direction in which a first side of said first main face extends being defined as a first direction of said piezoelectric substrate, said first and second end faces intersecting to said first direction, a direction in which a second side of said first main face extends being defined as a second direction, said second side being perpendicular to said first side, a direction which intersects substantially perpendicularly to said first and second main faces being defined as a third direction, said piezoelectric substrate being divided in the first direction into at least a first primary-side region, a second primary-side region and a secondary-side region, said first primary-side region including said first end face, said second primary-side region being located between said first primary-side region and said secondary-side region and being adjacent to said first primary-side region, said piezoelectric transformer being able to be driven at a predetermined resonance mode in the first direction, a length of said first primary-side region in the first direction being substantially one half of the resonance wavelength of said resonance mode in the first direction, and a length of said second primary-side region in the first direction being equal to or less than a half of said resonance wavelength;

a first primary-side electrode and a second primary-side electrode being disposed on said first and second main faces, respectively of said first primary-side region and opposite to each other, said first primary-side region between said first primary-side electrode and said second primary-side electrode being polarized in a predetermined direction along the third direction, a third primary-side electrode and a fourth primary-side electrode being disposed on said first and second main faces, respectively, of said second primary-side region and opposite to each other, said second primary-side region between said third primary-side electrode and said fourth primary-side electrode being polarized in the predetermined direction along the third direction, a first secondary-side electrode and a second secondary-side electrode being provided in said secondary-side region such that said first and second secondary-side electrodes are opposite to each other in said second direction at least a portion in said secondary-side region between said first secondary-side electrode and said second secondary-side electrode being polarized in said second direction wherein the polarization direction of said first primary-side region between said first and second primary-side electrodes is the same as the polarization direction of the second primary-side region between said third and fourth primary-side electrodes when said third primary-side electrode and said second primary-side electrode are electrically connected and said fourth primary-side electrode and said first primary-side electrode are electrically connected, or the polarization direction of said first primary-side region between said first and second primary-side electrodes is opposite to the polarization direction of the second primary-side region between said third and fourth primary-side electrodes when said third primary-side electrode and said first primary-side electrode are electrically connected and said fourth primary-side and said second primary-side electrode are electrically connected.

15. A piezoelectric transformer as recited in claim 14, wherein a third secondary-side electrode is provided between said first and second secondary-side electrodes in said secondary-side region so that said third secondary-side electrode is opposite to said first and second secondary-side electrodes in the second direction, a portion of said secondary-side region between said first secondary-side electrode and said third secondary-side electrode is polarized along the second direction, and a portion of said secondary-side region between said second secondary-side electrode and said third secondary-side electrode is polarized along the second direction in a direction opposite to the direction of polarization of the portion between said first secondary-side electrode and said third secondary-side electrode, and secondary-side electrical power is produced between said first and second secondary-side electrode and said third secondary-side electrode.

16. A piezoelectric transformer as recited in claim 1 or 13, further comprising:

a lead terminal which is electrically and mechanically connected to said secondary-side electrode so as to support said piezoelectric substrate, wherein said lead terminal is provided with a resilient structure portion which bends in the longitudinal direction or in the first direction so as to vibrate in accordance with a vibration of said piezoelectric substrate in the longitudinal direction or the first direction.

17. A piezoelectric transformer as recited in claim 14 or 15, further comprising:

a lead terminal which is electrically and mechanically connected to at least one of said first through third secondary-side electrodes so as to support said piezoelectric substrate, wherein said lead terminal is provided with a resilient structure portion which bends in the second direction so as to vibrate in accordance with a vibration of said piezoelectric substrate in the second direction.

18. An inverter which includes the piezoelectric transformer as recited in claim 1, 13 or 14.

19. A liquid crystal display which includes the piezoelectric transformer as recited in claim 1, 13 or 14.

20. A piezoelectric transformer as recited in claim 1, wherein said secondary-side region includes said second end face, and said secondary-side electrode is disposed on one of said second end face and said first main face in proximity to said second end face.

21. A piezoelectric transformer as recited in claim 1, wherein the length of said secondary-side region in the longitudinal direction is equal to or less than a half of said resonance wavelength, and said piezoelectric substrate includes said only secondary-side region as a driven region.

* * * * *